United States Patent
Pahlevaninezhad et al.

(10) Patent No.: US 12,289,056 B2
(45) Date of Patent: Apr. 29, 2025

(54) METACAPACITORS AND POWER-ELECTRONIC CONVERTERS FOR POWER-ELECTRONIC SYSTEMS

(71) Applicant: 10644137 CANADA INC., Heritage Points (CA)

(72) Inventors: Majid Pahlevaninezhad, Calgary (CA); Hamid Pahlevaninezhad, Calgary (CA); Milad Zareie, Calgary (CA); Behzad Poorali, Calgary (CA); Suzan Eren, Calgary (CA)

(73) Assignee: 10644137 CANADA INC., Calgary (CA)

( * ) Notice: Subject to any disclaimer, the term of this patent is extended or adjusted under 35 U.S.C. 154(b) by 259 days.

(21) Appl. No.: 17/768,107

(22) PCT Filed: Oct. 9, 2020

(86) PCT No.: PCT/CA2020/051366
§ 371 (c)(1),
(2) Date: Apr. 11, 2022

(87) PCT Pub. No.: WO2021/068085
PCT Pub. Date: Apr. 15, 2021

(65) Prior Publication Data
US 2023/0268129 A1    Aug. 24, 2023

Related U.S. Application Data

(60) Provisional application No. 62/914,237, filed on Oct. 11, 2019.

(51) Int. Cl.
*H02M 3/335*    (2006.01)
*H01G 4/012*    (2006.01)
(Continued)

(52) U.S. Cl.
CPC ........ *H02M 3/33571* (2021.05); *H01G 4/012* (2013.01); *H01G 4/224* (2013.01);
(Continued)

(58) Field of Classification Search
CPC ...... H01G 4/2325; H01G 4/012; H01G 4/224; H01G 4/248; H02M 3/01; H02M 3/3376;
(Continued)

(56) References Cited

U.S. PATENT DOCUMENTS 9,899,928 B2 * 2/2018 Handa ............... H02M 3/33584
11,616,451 B2 * 3/2023 Liu ..................... H02M 3/3376
                                                          363/17
(Continued)

FOREIGN PATENT DOCUMENTS

CN     104852586 B  *  9/2017  ............ H02M 3/335
JP     2017034982 A  *  2/2017  ............ H02M 3/156

OTHER PUBLICATIONS

Machine translation CN-104852586-B (Year: 2017).*
(Continued)

*Primary Examiner* — Kevin J Comber
*Assistant Examiner* — Yahveh Comas Torres
(74) *Attorney, Agent, or Firm* — Osha Bergman Watanabe & Burton LLP

(57) ABSTRACT

Power-electronic systems and components thereof such as electrical-energy storage apparatuses/subsystems in the form of supercapacitors and power-electronic apparatuses/subsystems are disclosed. A supercapacitor has a conductive or semi-conductive first metasurface layer, a conductive or semi-conductive second metasurface layer, and a dielectric layer sandwiched between the first and the second metasurface layers for electrically insulating the first metasurface layer from the second metasurface layer. An electrical power conversion apparatus has a first power conversion circuitry for converting a first portion of electrical power received from an electrical power source and outputting the converted electrical power via an output. The electrical power conversion apparatus also has one or more direct power transfer (DPT) channels electrically coupling to the first power conversion circuitry in parallel for bypassing the first power conversion circuitry and directing transferring a second portion of the electrical power received from the electrical power source to the output.

9 Claims, 34 Drawing Sheets

(51) Int. Cl.
*H01G 4/224* (2006.01)
*H01G 4/232* (2006.01)
*H01G 4/248* (2006.01)
*H02M 1/00* (2006.01)

(52) U.S. Cl.
CPC ........... *H01G 4/2325* (2013.01); *H01G 4/248* (2013.01); *H02M 1/0058* (2021.05); *H02M 3/33573* (2021.05); *H02M 3/33584* (2013.01); *H02M 1/0064* (2021.05)

(58) Field of Classification Search
CPC ............. H02M 3/3384; H02M 3/3371; H02M 3/3373; H02M 3/0064; H02M 3/0058
See application file for complete search history.

(56) References Cited

U.S. PATENT DOCUMENTS

| | | | |
|---|---|---|---|
| 2004/0056324 A1* | 3/2004 | Ning et al. | |
| 2005/0219790 A1 | 10/2005 | Abdallah et al. | |
| 2009/0316443 A1* | 12/2009 | Coccia | H02M 3/01 363/21.06 |
| 2015/0092450 A1* | 4/2015 | Feno | H02M 3/33571 363/17 |
| 2018/0083364 A1 | 3/2018 | Foo | |
| 2019/0068070 A1* | 2/2019 | Iyasu | H02M 3/33576 |
| 2019/0313531 A1* | 10/2019 | Silva | H02M 3/285 |
| 2020/0287470 A1* | 9/2020 | Saha | H02M 1/34 |
| 2020/0328677 A1* | 10/2020 | Amin | H02M 3/1582 |
| 2021/0296993 A1* | 9/2021 | Liu | H02M 3/33592 |

OTHER PUBLICATIONS

Machine translation JP_2017034982 (Year: 2017).*
International Search Report mailed Dec. 10, 2020, issued in corresponding PCT Application No. PCT/CA2020/051366 (4 pages).
Written Opinion of the International Searching Authority mailed Dec. 10, 2020, issued in corresponding PCT Application No. PCT/CA2020/051366 (4 pages).

* cited by examiner

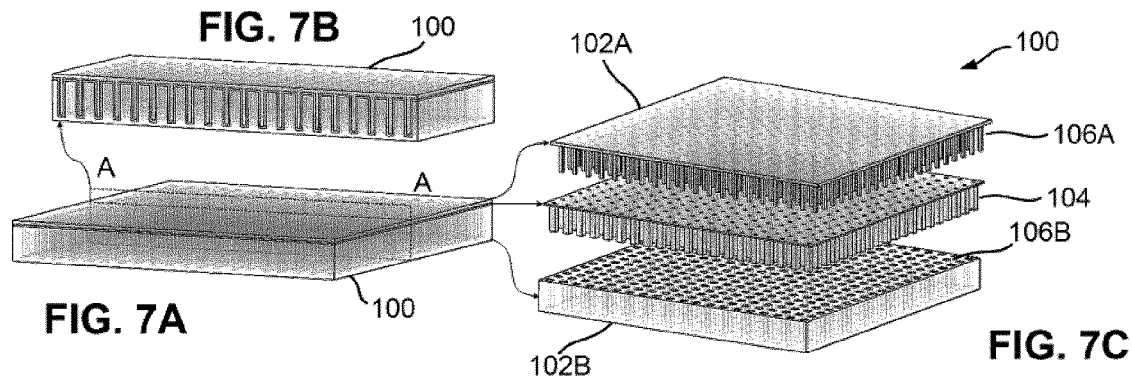
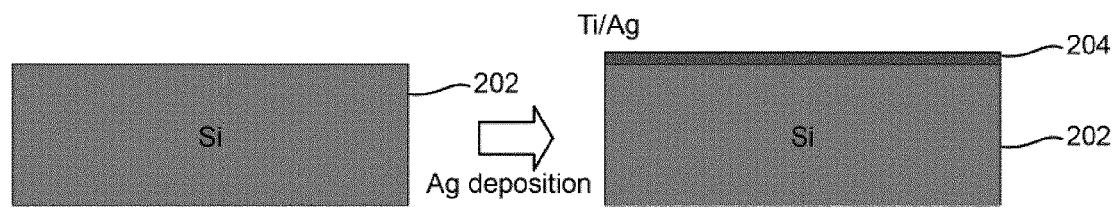
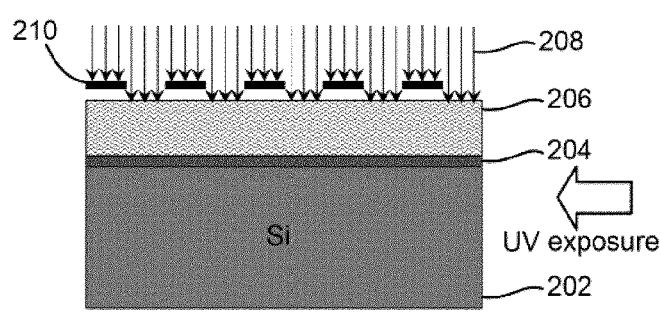
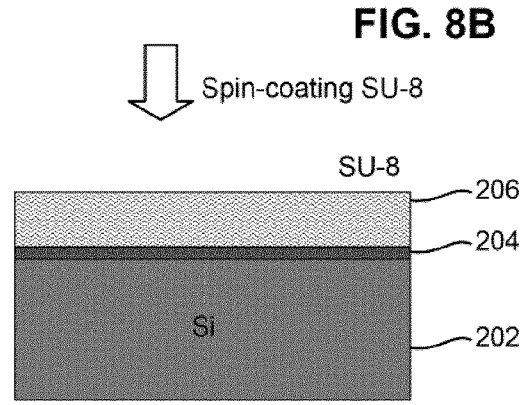
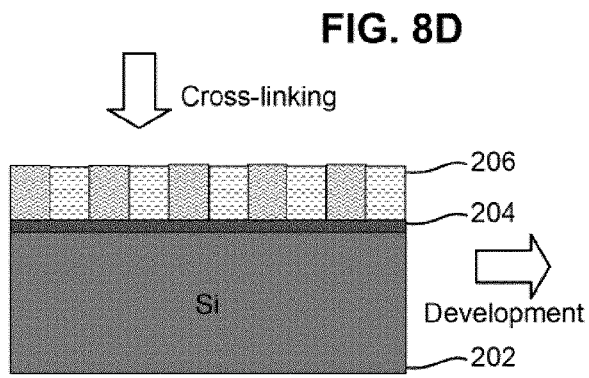
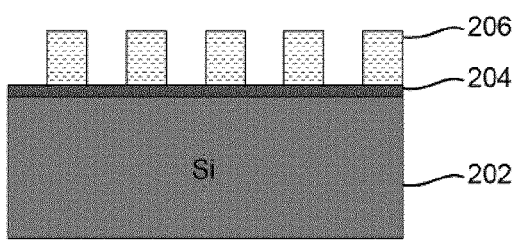

METACAPACITORS AND POWER-ELECTRONIC CONVERTERS FOR POWER-ELECTRONIC SYSTEMS

CROSS-REFERENCE TO RELATED APPLICATIONS

This application claims the benefit of U.S. Provisional Patent Application Ser. No. 62/914,237, filed Oct. 11, 2019, the content of which is incorporated herein by reference in its entirety.

FIELD OF THE DISCLOSURE

The present disclosure relates generally to power-electronic systems and components thereof, and in particular to high-density energy-storage apparatuses using supercapacitors for providing energy storage, and power-electronic apparatuses and methods using direct power transfer for converting power from one form to another.

BACKGROUND

Power-electronic apparatuses and systems provide solutions to power various power-consumption loads such as electronic devices and, if needed, convert power from one form to another for powering the loads. Almost all devices involving the use of electricity utilize some power-electronics technologies. The power-electronic apparatuses and systems usually involve and power-electronic circuitries such as power converters.

The power sources usually comprise power generators, energy-storage apparatuses and systems, and related circuitries. The power generators may be traditional thermal power station using generating electricity using fossil fuel (e.g., coal, natural gas, and/or oil), and/or power generators using renewable energy such as wind power, solar power, and/or the like.

Renewable energy is a clean and practical power-generation method for providing electrical power to end-users. For example, rooftop solar panels have gained a lot of attention to fulfill residential energy demand. Wind energy has been used for harvesting wind power and generate electricity. Solar and wind have been amongst the fastest growing renewable energy systems due to their prominent advantages.

While renewable energy may become one of the mainstream energy-generation technologies in the future, there still exist many challenges that impede the widespread adoption of renewable-energy technologies. Some of these challenges include:

the energy generation may not be reliable due to the intermittency of solar and wind;

there is a wide range of variations in the operating points of solar/wind energy harvesting systems, which may significantly degrade the overall efficiency of the system; and the energy harvesting systems usually need the utility grid in order to provide resiliency.

Due to the aforementioned challenges, the existing solar/wind energy harvesting systems may not provide an optimal solution for many emerging applications. Considering the exponential growth of solar/wind energy systems and their impacts on the landscape of energy harvesting systems, sub-optimal operation significantly affect these systems in an adverse manner.

Energy-storage systems may provide a solution for overcoming the aforementioned challenges of intermittent renewable-energy sources and facilitate a reliable renewable-energy harvesting system.

Energy-storage systems often comprise one or more batteries for storing energy. For example, Lithium-Ion batteries have been used in many applications (e.g., electric vehicles, residential energy storage, laptops, smart phones, tablets, and the like). Other types of battery technologies such as redox-flow batteries have also been used in some applications (e.g., grid-scale energy storage).

Batteries are mostly based on some kinds of redox reactions. Thus, they usually suffer from volumetric modulation and swelling of active materials (usually due to the excessive redox reactions) during charge and discharge cycles. In general, when there are electro-chemical reactions, there will be degradation and reduced number of life cycles. Although there has been substantial research on mitigating the degradation to provide extended lifetime, the lifetime of existing batteries is still limited. In addition, high-performance batteries usually require expensive and unsafe materials which may be flammable and have several safety risks.

Other drawbacks of batteries include that batteries are usually bulky and that batteries usually have low power density.

Supercapacitors have been presented as another contender for energy-storage markets. As those skilled in the art will appreciate, supercapacitors may provide substantial energy-storage capacity and offer improved performance particularly in terms of life-time and dynamics, compared to the battery technologies. For example, electric double-layer capacitors (EDLCs) are merely based on creation of an electric field with virtually no chemical reactions. Thus, EDLCs may provide very long lifetime (e.g., up to millions of charge/discharge cycles) and very high power density.

While the power density of supercapacitors is usually hundreds of times (e.g., 100-1000 times) higher than that of batteries, the energy density (volumetric energy density measured in Wh/Litre) or gravimetric energy density measured in Wh/Kg) of supercapacitors is relatively limited. For example, the energy density of batteries is usually tens of times (e.g., 3-30 times) higher than that of supercapacitors. In fact, the low energy density of supercapacitors may be the main reason that batteries are much more prevalent in mainstream energy storage despite tremendous advantages offered by supercapacitors.

Thus, existing energy-storage systems are usually bulky (e.g., due to their low energy-density), and usually have short life-span, low capacity, and costly. Therefore, there is a need for high-density energy-storage systems with low cost. Such high-density energy-storage system may not only revolutionize the future of energy systems, but may also be used in many other applications such as biomedical (e.g., wearable devices, implants, and/or the like), robotics, Internet-of-Things (IoT) devices, and the like.

With respect to power-electronic circuitries of the power-electronic apparatuses and systems, power-electronics technologies and power-electronic converters have been used for many applications such as renewable energy systems, energy storage systems, electric vehicles, electronic devices (e.g. smart phones, tablets, and the like), and LED lighting. Thus, power-electronic converters play a critical role in energy systems and electronic devices. Power-electronic converters and their applications have exhibited an exponential growth.

The efficiency, power density, and reliability of power-electronic converters are of great importance for various applications. However, there exit various challenges and difficulties related to prior-art power conversion technologies, such as:

high amount of switching losses due to hard switching of power semiconductors;

high amount of conduction losses in various components used in the power circuitry; and difficulties in thermal management for removing heat generated during operation of power-electronic converters while ensuring reliable operation thereof.

Due to these challenges, the prior-art power-electronic converters may not provide sufficiently high or even optimal efficiency. Because of the wide use and exponential growth of power-electronic converters and their applications, any sub-optimal performance or inefficiency thereof may cause significant energy waste and consequently significant detrimental-impacts to global environment.

Therefore, there is a need for highly efficient power-electronic converters for solving the above-described issues and challenges.

SUMMARY

According to one aspect of this disclosure, there is provided an ultra-high density energy-storage apparatus and system with high lifetime (e.g., in the range of hundreds of thousands cycles) and very high energy/power density.

According to one aspect of this disclosure, there is provided an electrical-energy storage device comprising: a conductive or semi-conductive first metasurface layer; a conductive or semi-conductive second metasurface layer; and a dielectric layer sandwiched between the first and the second metasurface layers for electrically insulating the first metasurface layer from the second metasurface layer.

In some embodiments, the first metasurface layer comprises a plurality of nano-scale or micro-scale first structures; the second metasurface layer comprises a plurality of nano-scale or micro-scale second structures; and the first and the second structures extending into each other without electrical contact therewith.

In some embodiments, the first structures comprise a plurality of recesses at distal ends thereof; and at least a second set of the second structures are received in the recesses of the first structures without electrical contact therewith.

In some embodiments, the first structures comprise a plurality of first rods having recesses at distal ends thereof; and at least a portion of the second structures are received in the recesses of the first rods without electrical contact therewith.

In some embodiments, the first structures comprise a plurality of first rods; and the second structures comprise a plurality of second rods interleaved with the first rods.

In some embodiments, at least a first set of the first and the second structures has a circular, elliptical, or rectangular cross-section.

In some embodiments, one or more dimensions of each of the first and the second structures are in a nanometer range or in a micrometer range.

In some embodiments, the thicknesses of the first and the second structures are in the nanometer range or in the micrometer range.

In some embodiments, the electrical-energy storage device further comprising at least one of a first electrode coupled to the first metasurface layer; and a second electrode coupled to the second metasurface layer.

In some embodiments, at least one of the first and the second metasurface layers comprises an electrically conductive base forming an electrode.

According to one aspect and in some embodiments, there is provided a method of fabricating an electrical-energy storage device; the method comprises: (i) depositing a first conductive layer onto a substrate; (ii) spin-coating a photoresist layer onto the conductive layer; (iii) applying a mask to the photoresist layer and exposing the masked photoresist layer under a light, the mask having a predefined pattern; (iv) removing the un-exposed part of the photoresist layer with development; (v) depositing a first conductive material to the photoresist layer for allowing the conductive material to fill the removed part of the photoresist layer; (vi) dissolving the photoresist layer for forming a first set of conductive structures; (vii) depositing a layer of a dielectric material to the deposited first conductive material for forming a dielectric layer thereon; (viii) depositing a second conductive material to the dielectric layer forming a second set of structures, and (ix) electroplating a third conductive material to the second set of structures.

In some embodiments, the substrate is silicon (Si).

In some embodiments, the first conductive layer comprises silver (Ag).

In some embodiments, the first conductive layer further comprises titanium (Ti).

In some embodiments, the photoresist layer comprises SU-8.

In some embodiments, the light comprises an ultraviolet (UV) light.

In some embodiments, the first conductive material comprises Ag.

In some embodiments, the dielectric material comprises fused silica ($SiO_2$).

In some embodiments, the second conductive material comprises Ag.

In some embodiments, the third conductive material comprises Ag.

According to one aspect and in some embodiments, there is provided a power-electronic conversion system and power-electronic converter using direct power transfer (DPT). The power-electronic converter disclosed herein may provide highly efficient and reliable solutions for various applications.

According to one aspect and in some embodiments, there is provided an electrical power conversion apparatus comprising: a first power conversion circuitry for receiving an input current from an electrical power source, converting a first portion of electrical power of the input current, and outputting the converted electrical power via at least one output, the first power conversion circuitry comprising a first transformer having a primary side for coupling to the electrical power source and a secondary side for coupling to the at least one output; and at least one direct power transfer (DPT) channel electrically coupling to the first power conversion circuitry in parallel for bypassing the first power conversion circuitry and directly transferring a second portion of the electrical power received from the electrical power source to the secondary side of the first transformer for power-outputting via the at least one output.

In some embodiments, the first power conversion circuitry comprises a current-switching structure coupling to the primary side of the first transformer for switching current.

In some embodiments, the at least one DPT channel is coupled to the primary side of the first transformer via a second transformer.

In some embodiments, the first and second transformers share a common core.

In some embodiments, the first power conversion circuitry comprise at least a pair of power semiconductors $S_1$ and $S_2$ adapted for operation under a zero-voltage switching (ZVS) condition.

In some embodiments, the at least first and second power semiconductors comprise at least one pair of metal-oxide-semiconductor field-effect transistors (MOSFETs).

In some embodiments, the apparatus further comprises a plurality of output diodes adapted for operation under a zero-current switching (ZCS) condition.

In some embodiments, the apparatus further comprises an input switch for coupling the electrical power source to the first power conversion circuitry and the at least one DPT channel; the plurality of output diodes comprises four diodes $D_1$, $D_2$, $D_3$, and $D_4$; a first end of $D_1$ is coupled to a first end of $D_2$ forming a first input end, and a first end of $D_3$ is coupled to a first end of $D_4$ forming a second input end, the first and second input ends are coupled to the secondary side of the first transformer and an output side of the at least one DPT channel; a second end of $D_1$ is coupled to a second end of $D_3$ forming a first output end, and a second end of $D_2$ is coupled to a second end of $D_4$ forming a second output end, the first and second output ends are coupled to the at least one output; and the apparatus is adapted for operation in a plurality of modes comprising: (i) a first mode in which $D_1$ and $D_4$ are ON, and $S_1$ is switched from ON to OFF under the ZVS condition, (ii) a second mode in which $D_1$ and $D_4$ are ON, and $S_2$ is switched ON under the ZVS condition, (iii) a third mode in which $D_1$ and $D_4$ turn OFF, $D_2$ and $D_3$ turn ON under the ZCS condition, and $S_2$ is ON, (iv) a fourth mode in which $S_2$ is switched OFF under ZVS condition, (v) a fifth mode in which $S_1$ is switched ON under ZVS condition, and $D_2$ and $D_3$ are ON, (vi) a sixth mode in which $D_2$ and $D_3$ turn OFF under ZCS condition, $D_1$ and D4 turn ON under ZCS condition, and (vii) a seventh mode in which the input switch turns off for turning the input current to zero.

In some embodiments, the input switch is a diode.

In some embodiments, the apparatus is adapted for operating the input current in a pseudo-continuous conduction mode (pseudo-CCM) for reducing the peak and/or root-mean-square (RMS) values thereof.

In some embodiments, the first power conversion circuitry comprises a first resonant tank.

In some embodiments, the at least one DPT channel comprises at least one second resonant tank.

In some embodiments, the input current is an alternate current (AC) or a direct current (DC).

In some embodiments, the at least one output comprises an AC output or a DC output.

In some embodiments, the at least one output comprises a plurality of outputs; the at least one DPT channel comprises a plurality of DPT channels; and at least two of the plurality of DPT channels are coupled to different ones of the plurality of outputs.

BRIEF DESCRIPTION OF THE DRAWINGS

The embodiments of the present disclosure will now be described with reference to the following figures in which identical reference numerals in different figures indicate identical elements, and in which:

FIG. 7A is a perspective view of a supercapacitor, according to yet some embodiments of this disclosure;

FIG. 7B is a perspective cross-sectional view of the supercapacitor shown in FIG. 7A along the cross-sectional plane A-A; and FIG. 7C is an exploded perspective view of the supercapacitor shown in FIG. 7A;

FIGS. 8A to 8K illustrate a process of fabricating the supercapacitor shown in FIG. 7A, according to some embodiments of this disclosure.

FIGS. 10A to 10D are schematic diagrams of a power-electronic conversion system according to some embodiments of this disclosure, wherein FIG. 10A shows the power-electronic conversion system having an alternate-current (AC) power source, a direct-current (DC) load, and an AC-to-DC (AC/DC) power converter therebetween, FIG. 10B shows the power-electronic conversion system having a DC power source, a DC load, and a DC-to-DC (DC/DC) power converter therebetween, FIG. 10C shows the power-electronic conversion system having a DC power source, an AC load, and a DC-to-AC (DC/AC) power converter therebetween, and FIG. 10D shows the power-electronic conversion system having an AC power source, an AC load, and an AC-to-AC (AC/AC) power converter therebetween;

FIG. 21B shows the waveforms of the switch $S_2$, FIG. 21C shows the current waveforms of the coupled inductor, FIG. 21D shows the waveforms of $v_{inv}$, $v_{prim}$, and $i_{Ls}$, FIG. 21E shows the waveforms of $v_{sec}$ and $i_r$, and FIG. 21F shows the current and voltage waveforms of the output diodes $D_1$ and $D_2$;

DETAILED DESCRIPTION

Embodiments herein relate to power-electronic systems and components thereof such as energy-storage apparatuses/subsystems in the form of supercapacitors and power-electronic apparatuses/subsystems.

Supercapacitors

According to one aspect and in some embodiments, there is provided a supercapacitor with substantially increased energy density which may surpass that of batteries. The supercapacitor structure disclosed herein may bring supercapacitor technology to the forefront for energy-storage markets.

Figure 1:
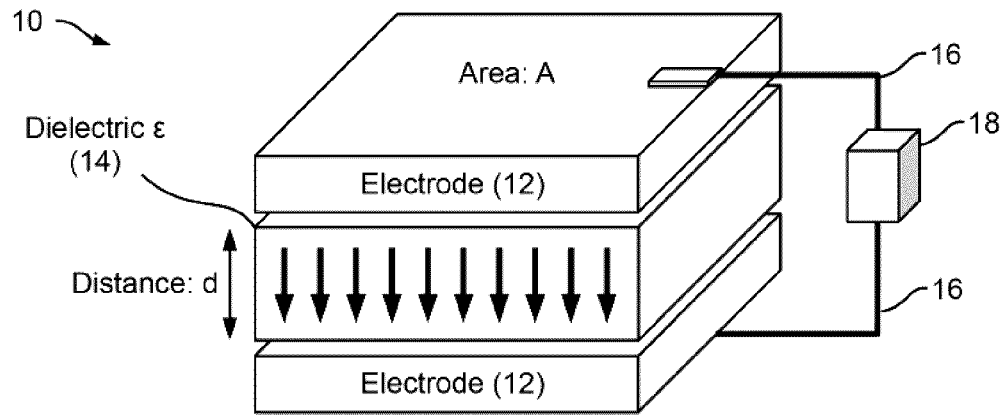
FIG. 1 is a schematic diagram showing the basic operation of a traditional capacitor.

FIG. 1 shows the basic operation of a traditional capacitor 10 which comprises a pair of electrodes 12 with a layer of dielectric material 14 sandwiched therebetween. Electrical power is output from the electrodes 12 via conductors 16 for powering a load 18.

According to FIG. 1, the capacitance of the capacitor 10 is given by:

$$C = \epsilon \frac{A}{d} \tag{1}$$

where C is the capacitance (in Farad), ε is the electric filed permittivity of the dielectric material 14 (which is a constant), A is the area of the overlap between the two electrodes 12 (in m$^2$), and d is the distance between the electrodes 12 (in meter). One may also use centimeters (cm) instead of meters for distance d in some embodiments.

The energy stored in the capacitor 10 is given by:

$$W = \frac{1}{2}CV^2 = \frac{1}{2}\epsilon\frac{A}{d}V^2 \qquad (2)$$

where V is the voltage (in Volt) applied to the electrodes 12 (using the aforementioned units, the energy W is in Joules).

The equation (2) of energy indicates the parameters that affect the energy density of the capacitor 10. These parameters are:
- overlapping area A between the two electrodes 12;
- distance d between the electrodes 12;
- electric field permittivity of the dielectric 14; and
- Operating voltage V of the capacitor 10.

With simple structures similar to that shown in FIG. 1, the capacitance C and stored energy W are often far too small to make the capacitors 10 a viable option for energy storage purposes. In prior art, much effort has been done to optimize the aforementioned parameters and increase the energy density of capacitors (which may then be denoted "supercapacitors").

Figure 2:
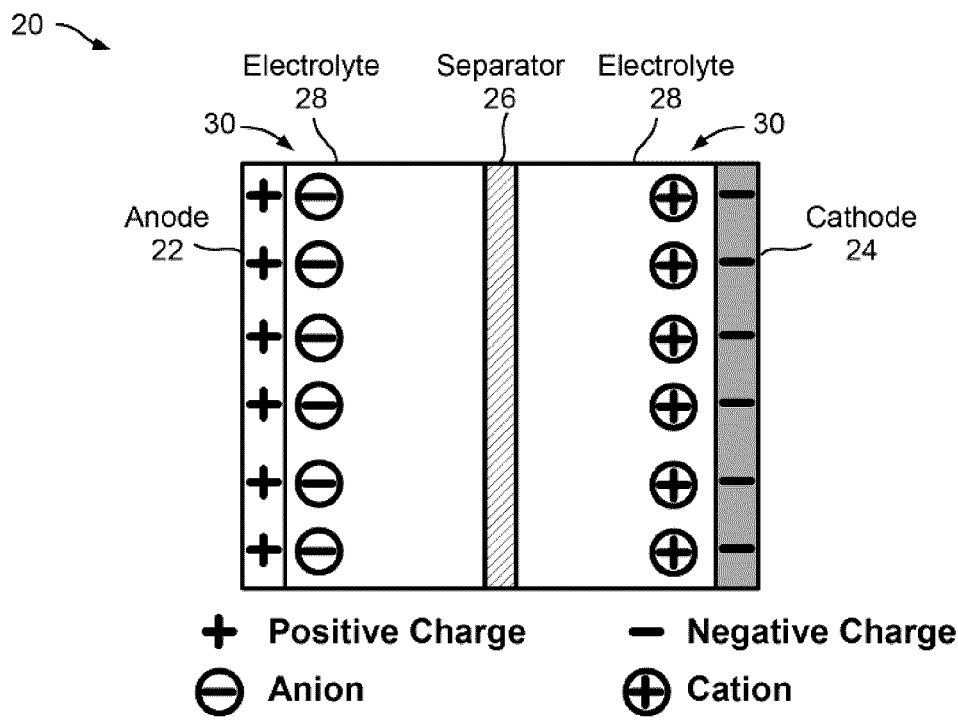
FIG. 2 is a schematic diagram showing the basic structure of an electric double-layer capacitor (EDLC)

FIG. 2 shows the basic structure of an electric double-layer capacitor (EDLC) 20. In this structure, the electrodes (i.e., the anode 22 and cathode 24) are spaced apart by a separator 26 (such as a membrane) with electrolyte 28 sandwiched between the electrode 22, 24 and the separator 26. The EDLC 20 stores energy through charge separation (the same mechanisms as the traditional capacitors 10 shown in FIG. 1). As can be seen, the structure of the EDLC 20 is symmetrical and may provide alternative polarity. The main energy is stored in the electric filed between the two electrodes 22 and 24. The stronger the electric field, the more energy stored in the EDLC 20.

As shown in FIG. 2, the EDLC 20 comprises two separated charge layers 30 at the interface between the electrolyte 28 and the positive/negative electrodes 22 and 24 (hence the name electric double-layer capacitor). This is unlike the traditional structures which only comprises a single layer charge separation. In EDLCs 20, the distance between electrical double layers 30 is much smaller than that of traditional structures 10. Thus, the capacitance and in turn the stored energy may be increased by several orders of magnitude compared those of traditional structures 10.

Figure 3A:
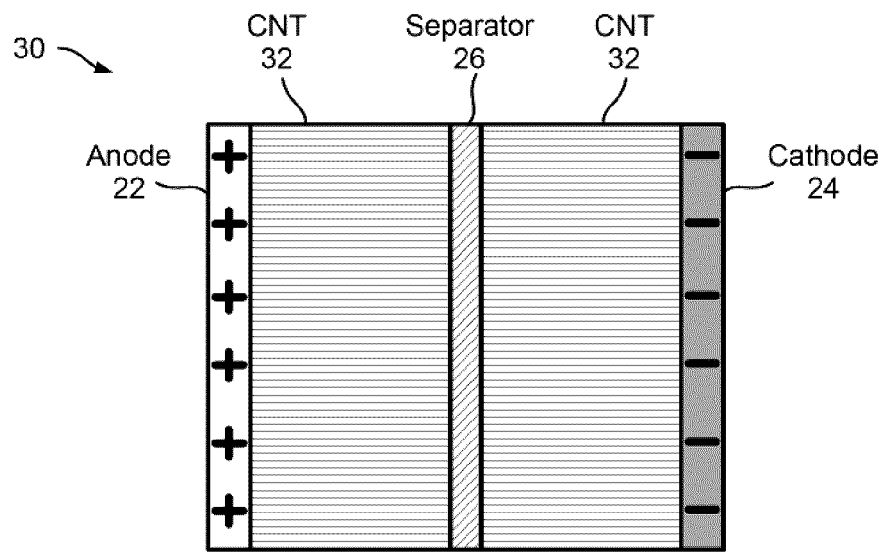
FIG. 3A is a schematic diagram showing a carbon nanotube (CNT) based EDLC.
Figure 3B:
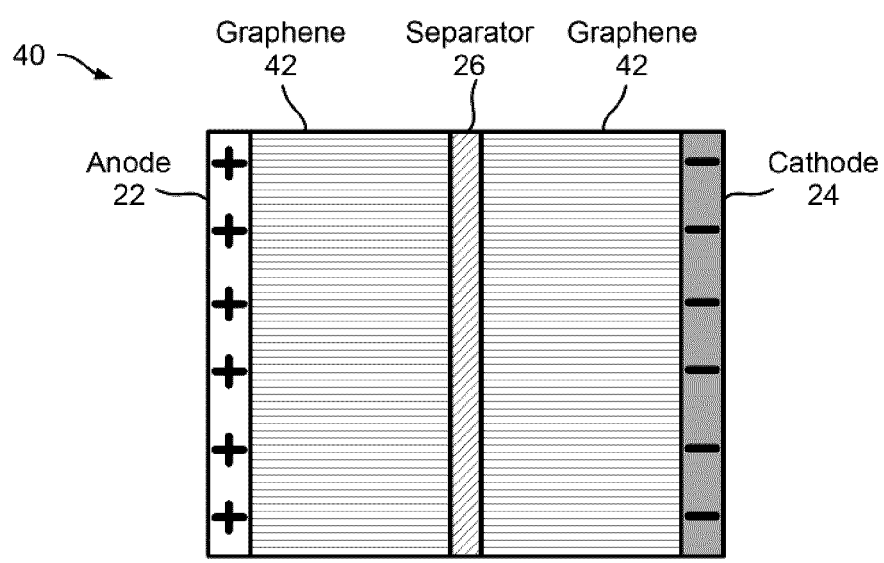
FIG. 3B is a schematic diagram showing a graphene-based EDLC.

Area and distance are the main parameters that may be controlled to achieve high capacity and high energy density for EDLCs 20. As high specific surface area is generally desirable in EDLCs, high capacity and high energy density may be achieved by using materials with high specific surface area and good electrical conductivity such as nano-structures. Examples of such nano-structures include carbon nano-tubes (CNTs) and graphene, wherein CNTs are one-dimensional (1D) structures and graphene are two-dimensional (2D) structures. Graphene has even larger specific surface area compared to CNTs, and therefore has been used in many EDLC structures. FIGS. 3A and 3B show the structures of EDLCs with CNTs 30 and graphene 40, respectively. As shown, the structures of EDLCs with CNTs 30 and graphene 40 are similar to that of the EDLC 20 shown in FIG. 2 except that the EDLCs 30 and 40 comprise CNTs 30 and graphene 40, respectively, sandwiched between the electrode 22, 24 and the separator 26.

Although carbon nano-structures may provide high specific surface area and offer high number of charge/discharge cycles, there are some challenges to use them for EDLCs. These challenges are mainly related to the synthesis and fabrications of carbon nano-structures for EDLCs and consistency of the devices. Moreover, despite the fact that carbon nano-structures have significantly improved the performance of EDLCs, their energy density may still be lower than that of the batteries.

While CNTs and graphene structure effectively increase the specific surface area and in turn the capacity, such an increase is somewhat random and cannot achieve the full theoretical size of specific surface area. For instance, in theory, graphene should achieve a specific surface area of thousands of m$^2$/g (2630 m$^2$/g). However, the practically achieved specific surface area of graphene is in the order of tens or at most hundreds of m$^2$/g. The main problem is stemmed from the atomic and molecular structures of these nano-structures.

Figure 4:
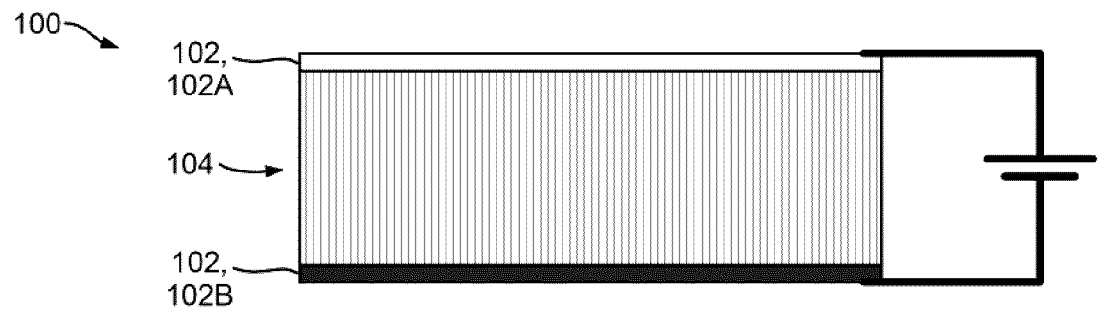
FIG. 4 is a schematic diagram of a supercapacitor, according to some embodiments of this disclosure.

Turning now to FIG. 4, a supercapacitor according to some embodiments of this disclosure is shown and is generally identified using reference numeral 100. As shown, the supercapacitor 100 comprises a pair of electrode layers 102A and 102B (collectively identified using reference numeral 102) and a dielectric layer 104 sandwiched between the electrode layers 102. In these embodiments, each electrode layer 102 comprises a conductive or semi-conductive metasurface coupled to respective electrode layers 102 for increasing the specific surface area, and a suitable dielectric material sandwiched between the metasurfaces for electrically insulating the metasurfaces from each other.

The academic paper entitled "LIGHT PROPAGATION WITH PHASE DISCONTINUITIES: GENERALIZED LAWS OF REFLECTION AND REFRACTION," by Nanfang Yu, Patrice Genevet, Mikhail A. Kats, Francesco Aieta, Jean-Philippe Tetienne, Federico Capasso, and Zeno Gaburro, Science volume 334, issue 6054, pages 333-337 (2011), the content of which is incorporated herein by reference in its entirety, describes metasurfaces in view of their use in optical field.

The conductive or semi-conductive metasurface used in the supercapacitor 100 disclosed herein may be similar to those described in the above-mentioned academic paper but does not necessarily need to exhibit the optical features described therein.

In particular, the conductive or semi-conductive metasurface used in the supercapacitor 100 is a structure having a two-dimensional (2D) surface with superimposed nano-scale structures (also denoted "nano-structures") arranged with a nano-scale spacing, wherein the nano-scale structures are made of one or more suitable electrically conductive or semi-conductive materials.

In some embodiments, the nano-scale structures may be structures with one or more dimensions thereof being in nanometer (nm) range (e.g., less than 1 micrometer (μm)), and "nano-scale spacing" refers to the spacing between the nano-scale structures is in nanometer range. In some embodiments, the nano-scale structures may comprise a plurality of nanorods (also denoted "antennas"). In some embodiments, the nano-scale structures 124 may comprise a plurality of V-shaped nanorods. The nano-scale structures may form a periodic or repetitive pattern and each pattern may comprise a plurality of nano-scale structures of different shapes and dimensions.

In some embodiments, the metasurface of each electrode layer 102 may comprise a plurality of micro-scale structures (i.e., one or more dimensions thereof being in micrometer range (e.g., less than 1 millimeter (mm)), and/or with a micro-scale spacing therebetween.

The supercapacitor 100 disclosed herein may be denoted a "meta-supercapacitor" or "metacapacitor". By using the metasurfaces, the effective area is tremendously enhanced by the nano/micro structures as the size of these columns/cylinders can be in nanometer or micrometer range.

In some embodiments, the nano/micro structures of the metasurfaces of the electrode layers 102 extend into each other without electrical contact therewith and electrically insulated by the dielectric layer 104 sandwiched therebetween. As the nano/micro structures of the metasurfaces have a nano-scale or micro-scale spacing, the distance between the metasurfaces is therefore significantly reduced. As a result, the supercapacitor 100 disclosed herein may provide ultra-high energy density and offer consistent device performance.

Figure 5A:
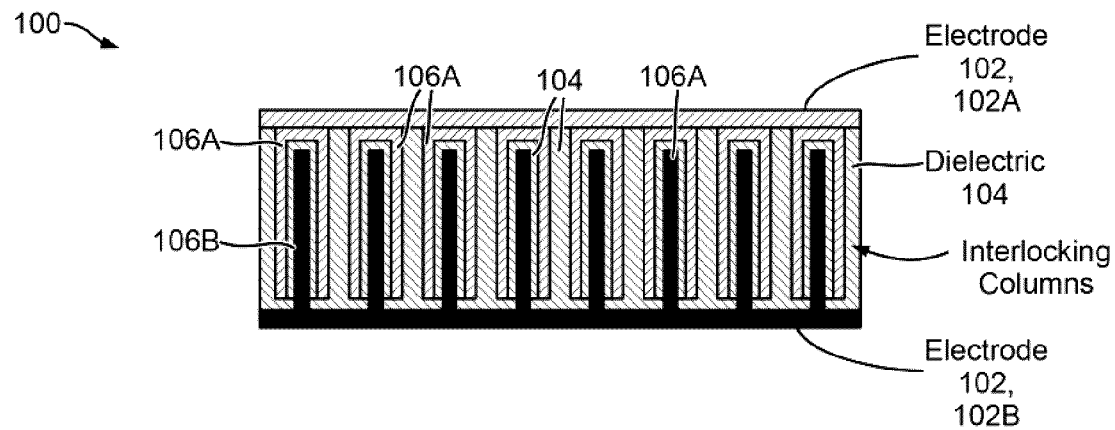
FIG. 5A is a schematic diagram of a supercapacitor, according to yet some embodiments of this disclosure.

For example, FIG. 5A shows the structure of a supercapacitor 100 in one embodiment. As shown, the supercapacitor 100 comprises a pair of electrode layers 102A and 102B and a dielectric layer 104 sandwiched therebetween.

Each electrode layer 102A, 102B comprises a metasurface 106A, 106B (collectively identified using reference numeral 106) with nano-structures arranged in interlocking columns for increasing the specific surface area and reducing the spacing therebetween. In particular, the electrode layer 102A comprises a first metasurface 106A which comprises a plurality of first nano-structures (also identified using reference numeral 106A) in the form of hollow rods extending from the 2D surface of the first electrode layer 102A and having open distal ends (i.e., having recesses at the distal ends thereof).

The electrode layer 102B comprises a second metasurface 106B which comprises a plurality of second nano-structures (also identified using reference numeral 106B) in the form of solid or hollow rods extending from the 2D surface of the second electrode layer 102B. In embodiments where the second nano-structures are hollow rods, such hollow rods may also comprise open distal ends for further increasing the specific surface area.

In these embodiments, at least some of the second nano-structures 106B are received in the recesses of respective first nano-structures 106A without electrical contact therewith, thereby forming the interlocking columns. The first and second nano-structures 106A and 106B are separated by a suitable dielectric material of the dielectric layer 104 which separates the electric charges.

In some embodiments, the interlocking columns 106 may comprise first and second micro-structures 106A and 106B with at least some of the second micro-structures 106B received in respective first micro-structures 106A.

Figure 5B:
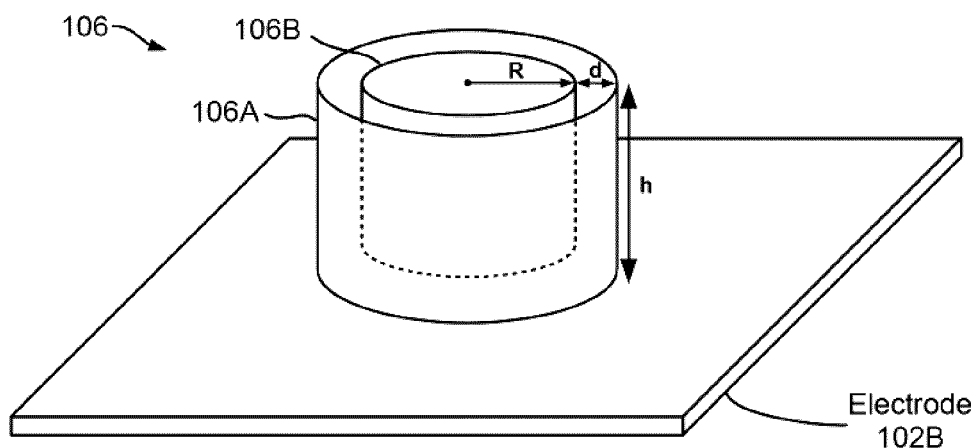
FIG. 5B is a schematic diagram showing the cylindrical nano/micro structures of the supercapacitor shown in FIG. 5A.
Figure 5C:
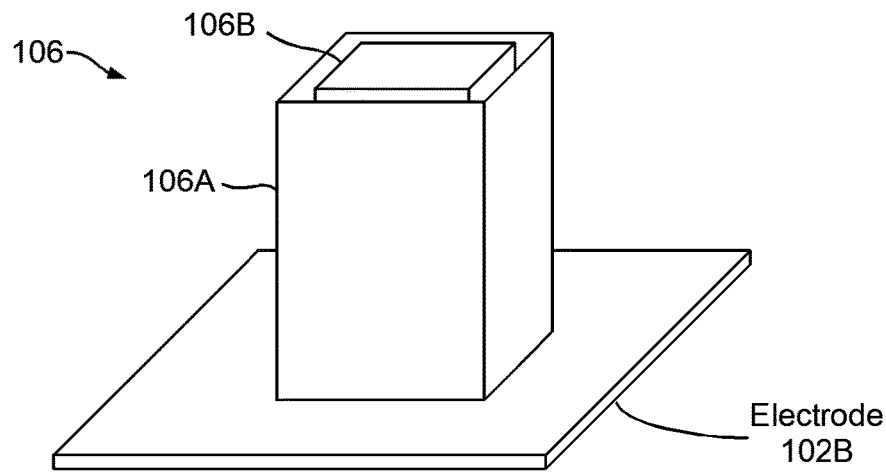
FIG. 5C is a schematic diagram showing the cubical nano/micro structures of the supercapacitor shown in FIG. 5A.

In various embodiments, the first and second nano/micro structures 106A and 106B may be in any suitable shapes. For example, in some embodiments as shown in FIG. 5B, the first and second nano/micro structures 106A and 106B may be in cylindrical shapes with a circular or elliptical cross-section. In some embodiments as shown in FIG. 5C, the first and second nano/micro structures 106A and 106B may be in cubical shapes with a rectangular cross-section.

The supercapacitor 100 disclosed herein may tremendously increase the stored energy by substantially increasing the specific surface area (i.e., the effective overlapping area) and significantly reducing the distance between electrode layers 102. Compared to existing EDLCs, the supercapacitor 100 may fully utilize the surface area such that the capacitance thereof and in turn the energy stored therein may be increased by many orders of magnitude.

In above embodiments, the first and the second nano-scale or micro-scale structures 106A and 106B extending into each other without electrical contact therewith by receiving at least some of the second structures 106B into the recesses of corresponding first structures 106A.

Figure 6A:
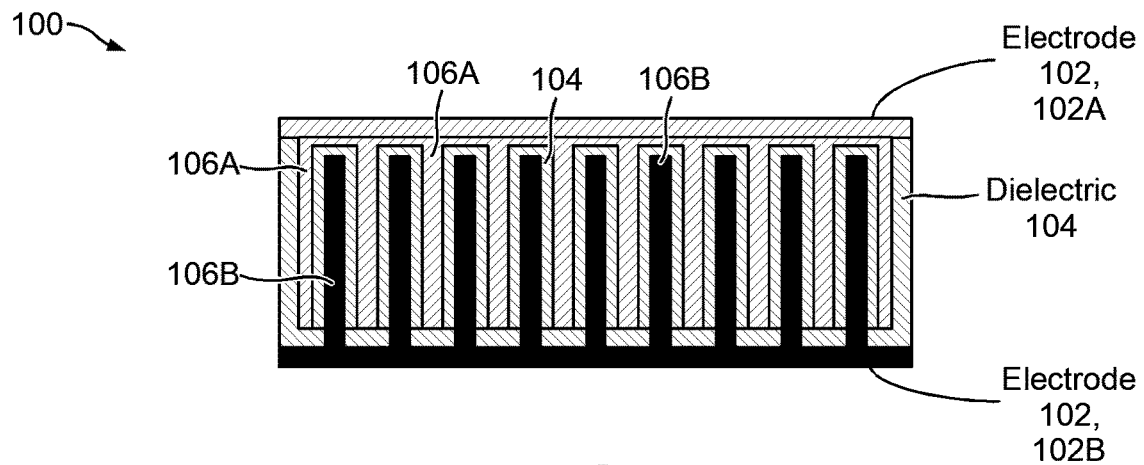
FIG. 6A is a schematic diagram of a supercapacitor, according to still some embodiments of this disclosure.

In some embodiments as shown in FIG. 6A, the first metasurface 106A does not comprise any nano-scale or micro-scale rods. Rather, the first metasurface 106A comprises a plurality of nano-scale or micro-scale recesses for receiving the nano/micro structures 106B therein without electrical contact.

Figure 6B:
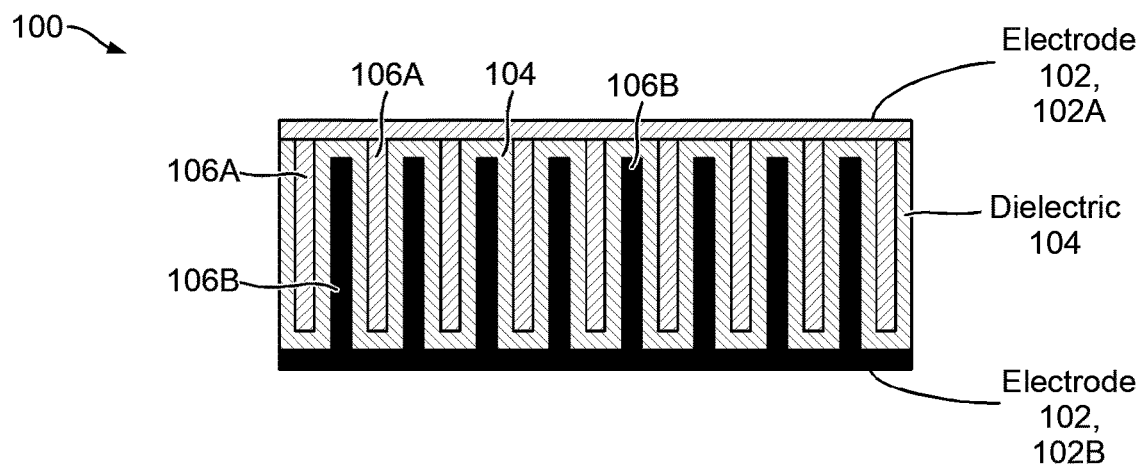
FIG. 6B is a schematic diagram of a supercapacitor, according to some embodiments of this disclosure.

In some embodiments as shown in FIG. 6B, the nano-scale or micro-scale structures of the first and second metasurfaces 106A and 106B are interleaved (i.e., one adjacent another) without electrical contact.

In above embodiments, each metasurface is formed by depositing the nano/micro structures on a conductive base wherein the conductive base also acts as an electrode layer. Therefore, in these embodiments, additional or separate electrode layers may not be required. In yet some embodiments, each metasurface may be coupled to another electrode layer and is electrically conductive therewith.

As described above, the effective surface area of the supercapacitor 100 is greatly increased by incorporating nano-rods or nano-pillars into the design of the electrodes 102. The nano-pillars may have circular, elliptical, square, or any other shapes suitable for fabrication. In order to maintain the small gap between the electrodes 102, the nano-pillars of one electrode may have a complementary shape with respect to those of the other electrode. The dielectric layer comprises a suitable dielectric material such as $SiO_2$, $Al_2O_3$, or other dielectric materials with high breakdown voltages for filling into the gaps between the nano-scale structures of the electrodes 102 and electrically insulating them from each other.

The supercapacitor 100 may tremendously increase the stored energy by substantially increasing the specific surface area and significantly reducing the distance between electrodes. Thus, the impact of the structure of the supercapacitor 100 disclosed herein is three-fold:

Increasing the effective overlapping area;
Decreasing the distance between the electrodes; and
Creating high energy-storage in an ultra-thin small form-factor structure.

As compared to the existing EDLCs, the supercapacitor 100 disclosed herein may fully utilize the surface area to maximize the capacitance and in turn stored energy may be increased by many orders of magnitude.

Being basically a very thin surface, the supercapacitor 100 disclosed herein may be readily integrated with photovoltaic panels. Moreover, the supercapacitor 100 may alternatively be directly fabricated on one side of a silicon-based photovoltaic panel for directly storing charges generated by the panel, thereby eliminating the loss associated with transferring charges from photovoltaic cells into remote storages. As secondary benefits, having both photovoltaic panel and storage device on the two sides of a single silicon substrate may significantly reduce the size of the overall device and may eliminate the electronic circuits otherwise required to connect charge generation and storage sites.

FIG. 7A shows a supercapacitor 100 in some embodiments, FIG. 7B is a perspective cross-sectional view of the supercapacitor 100 shown in FIG. 7A along the cross-sectional plane A-A, and FIG. 7C is an exploded perspective view thereof.

FIGS. 8A to 8K show a process of fabricating the supercapacitor 100 shown in FIG. 7A, according to some embodiments of this disclosure. FIG. 8L shows the legends of FIGS. 8A to 8K.

As shown in FIG. 8A, a base material 202 such as a silicon (Si) substrate is prepared (preparation step). As shown in FIG. 8B, a conductive layer 204 of, e.g., titanium (Ti) and silver (Ag) is deposited onto the silicon substrate using an electron-beam or thermal evaporator (Ag deposition step). In these embodiments, Ti layer is used as an adhesion layer. As shown in FIG. 8C, a photoresist layer 206 such as a layer of SU-8 is spin-coated onto the conductive layer 204 (Spin-coating SU-8 step).

As shown in FIG. 8D, an ultraviolet (UV) light 208 is emitted towards the photoresist layer 206 through a suitable mask layer 210 to define the nano-pillar pattern (UV exposure step). As shown in FIG. 8E, the exposed part of photoresist layer is cross-linked. As shown in FIG. 8F, the un-exposed part of photoresist layer is removed with development (Development step).

Figure 8G:
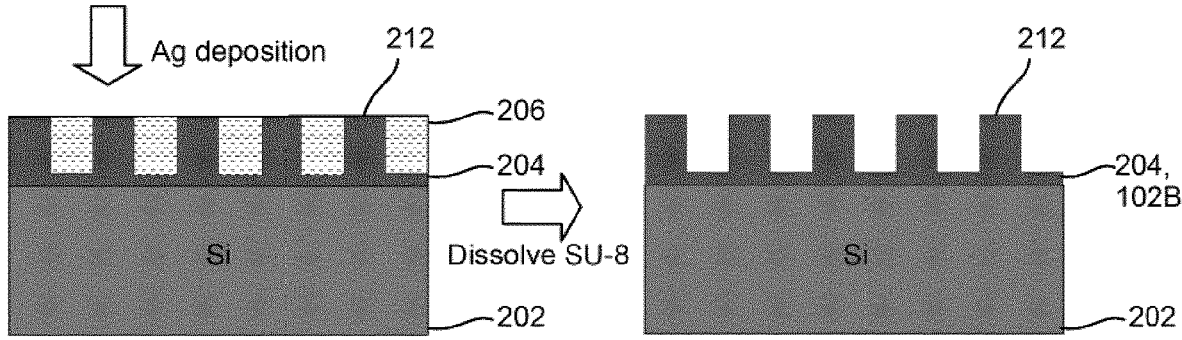
Figure 8H:
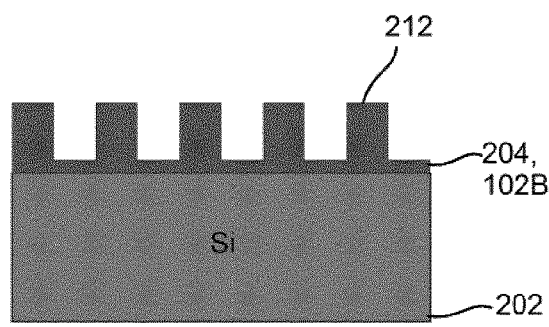

As shown in FIG. 8G, an Ag layer 212 is deposited into the pattern formed by the removed part of photoresist layer. The deposited Ag layer 212 is integrated with the conductive layer 204. As shown in FIG. 8H, the SU-8 is dissolved to generate the Ag nano-pillars (formed by the Ag layer 212). Thus, the integrated Ag layer 212 and the conductive layer 204 form the metasurface of electrode 102B.

Figure 8I:
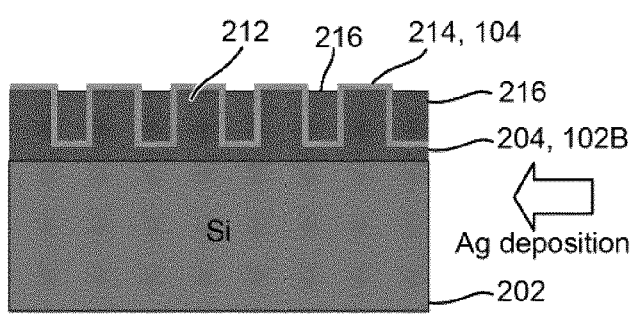

As shown in FIG. 8I, a layer of dielectric material such as fused silica ($SiO_2$) 214 is deposited to the Ag nano-pillars 212 to form a thin dielectric layer 104 covering and insulating the Ag nano-pillars 212.

Figure 8J:
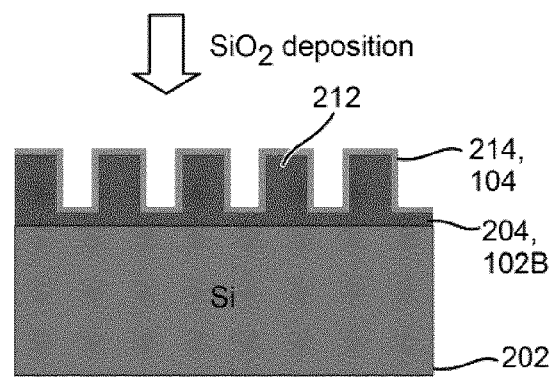
Figure 8K:
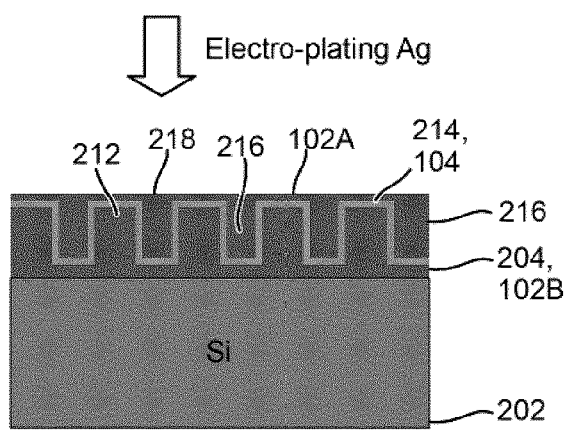
Figure 8L:
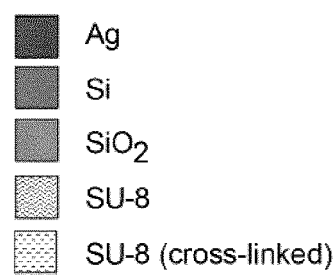
FIG. 8L shows the legend for FIGS. 8A to 8K.

As shown in FIG. 8J, an Ag layer 216 is deposited on the dielectric layer 104 and fills into the gaps between the Ag nano-pillars 212. The dielectric layer 104 electrically insulates the Ag layer 216 from the Ag nano-pillars 212. As shown in FIG. 8K, another Ag layer 218 is applied via an electroplating process to cover the entire area. The Ag nano-pillars 212 are integrated with the Ag layer 218 and form the electrode 102A.

Power-Electronic Conversion Systems and Power-Electronic Converters Using Direct Power Transfer (DPT)

According to one aspect and in some embodiments, there is provided a power-electronic conversion system and power-electronic converter using direct power transfer (DPT). The power-electronic converter disclosed herein may provide highly efficient and reliable solutions for various applications.

According to one aspect and in some embodiments, there is provided an isolated direct-current-to-direct-current (DC/DC) converter circuit topology for offering high performance for a wide range of operating conditions. The main features of the DC/DC converter circuit include its DPT capability, pseudo-continuous conduction mode (pseudo-CCM) of operation, and soft-switching performance for a wide range of operating conditions. With the DPT operation, the amount of power required to be processed by power switches and transformer is reduced. In addition, the pseudo-CCM operation decreases the peak and root-mean-square values of the input current, which results in reduced conduction losses associated with windings and semiconductors.

In the DC/DC converter circuit structure, the power switches benefit from zero-voltage switching characteristics while its output diodes operate under zero-current switching conditions. As a result, reverse-recovery issue of the output diodes is eliminated. All these features result in low conduction and switching losses thereby improving the overall efficiency. Operating principles of the proposed converter and its theoretical analysis are described later in detail. Simulation and experimental results of a 450 Watts (W) (190V/48V) laboratory prototype are provided to verify the feasibility of the proposed DC/DC converter and demonstrate its superior performance.

As those skilled in the art will appreciate, increasing energy demand along with concerns over climate change require a significant paradigm shift towards renewable energy sources. A reliable and efficient architecture is required to harvest energy from renewable sources and supply loads. The micro-grid is a fairly new and attractive concept to efficiently integrate renewable energy sources into the power system.

In particular, DC micro-grids have recently gained a lot of interest due to their efficient operation [1]-[3]. Many renewable energy sources such as solar and wind generate DC power (although wind turbines along with generators produce alternate-current (AC) power, the AC power is of variable frequency and amplitude and is required to be converted to DC). Moreover, many energy storage systems are based on batteries, which are naturally DC. In addition, the landscape of the loads have recently been changing as there are now many DC loads such as electronic devices (smart phones, tablets, and the like) and LED lighting [4]. Thus, DC system seems to be a natural fit for future grid with many DC sources, DC loads, and DC energy storage. DC systems have better efficiency, do not require reactive power, and are not sensitive to harmonics. Thus, they are generally superior compared to their AC counterparts [5]. The introduction of DC powered homes is a testament to the huge potential of DC micro-grids [6], [7].

Figure 9:
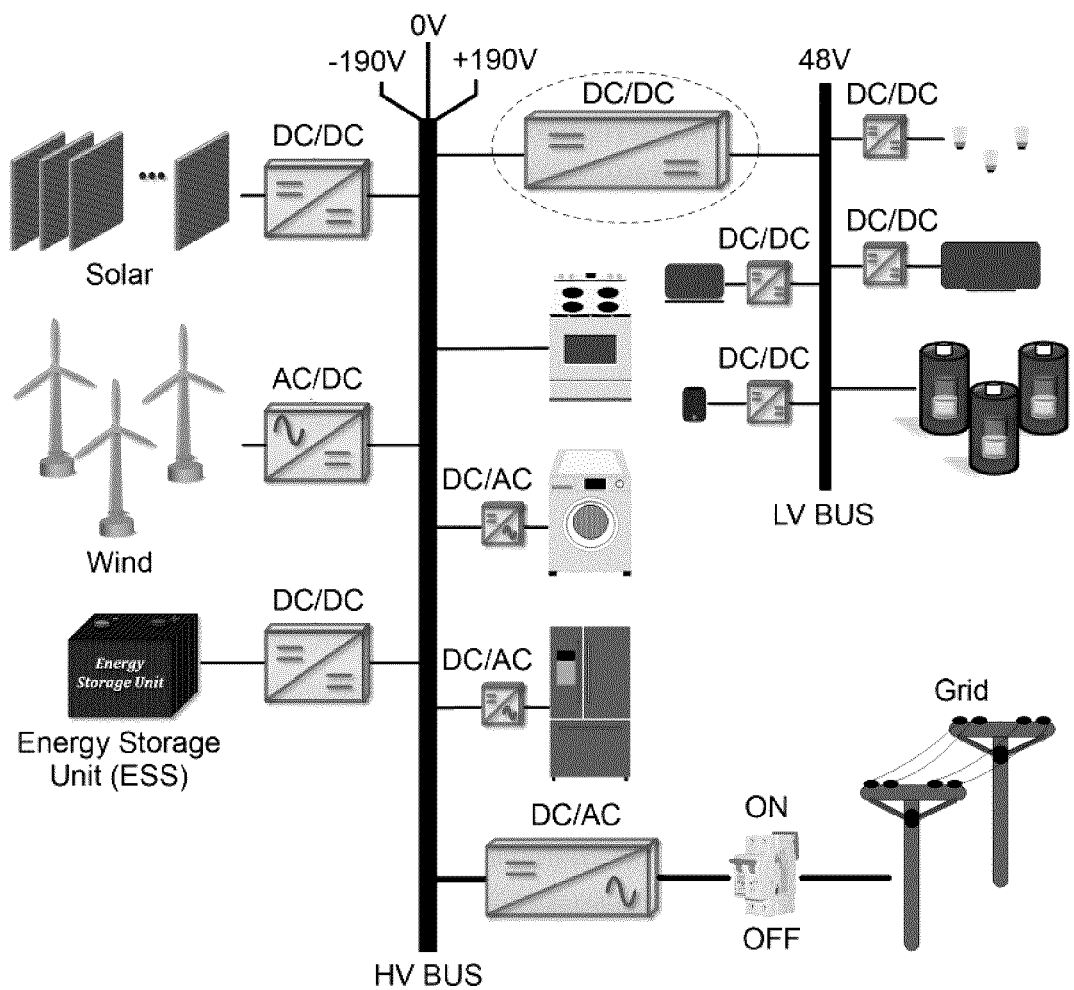
FIG. 9 is a schematic diagram showing an exemplary arrangement of a DC micro-grid.

FIG. 9 shows an exemplary arrangement of a DC micro-grid that can be used for DC powered homes. As shown, the DC micro-grid includes a high voltage bus (HV BUS; e.g., ±190V) and a low voltage bus (LV BUS, e.g., 48V). The higher power components such as main energy storage system, renewable energy sources, and high power loads are connected to the high voltage bus and many low power loads, such as LED lighting, electronics, and the like, are connected to the low voltage bus [8]-[10]. A DC/DC converter is used in between the high voltage bus and the low voltage bus to maintain the low-voltage DC-bus voltage within a desired range. High efficiency, high power density, galvanic isolation, and low output current/voltage ripple are desired attributes for this DC/DC converter. Although this converter requires bi-directional power flow capability for some applications, for this application unidirectional power flow suffices due to the fact that the low voltage bus is merely responsible for feeding the loads (LED lighting, electronics, and the like).

DC/DC converters have been extensively analyzed in the literature [11]-[24]. Conventionally, many products were based on the well-known phase-shift full-bridge power circuit topology. However, this topology has several performance issues, such as voltage spikes across the output diodes, free-wheeling intervals, hard-switching for light loads, etc. Resonant type DC/DC converters have been introduced to mitigate the aforementioned issues [25]-[27]. In particular, the LLC resonant converters have gained a lot of attention due to its attractive features. In fact, many current industrial products are based on this power circuit topology since they have superior performance. Although LLC resonant converters have many attractive features, they suffer from some disadvantages such as performance degradation for wide range of operating conditions, complex magnetic design, complex control and bulky resonant tank [28]-[31].

Higher order resonant converters have also been introduced to further enhance the performance. For instance, CLLC type resonant converters can achieve zero-voltage switching (ZVS) and zero-current switching (ZCS) at their primary and secondary sides over a wide range of operation [27]. In addition, a CLTC type resonant converter is introduced in [32] by combining the LLC, SRC and CLLC types. In this topology, an auxiliary transformer and extra resonant capacitor are used to provide ZVS over a wide range of operation. However, the gain curves of these resonant converters have multiple peaks. Thus, the control and design can get considerably complex.

Figure 13:
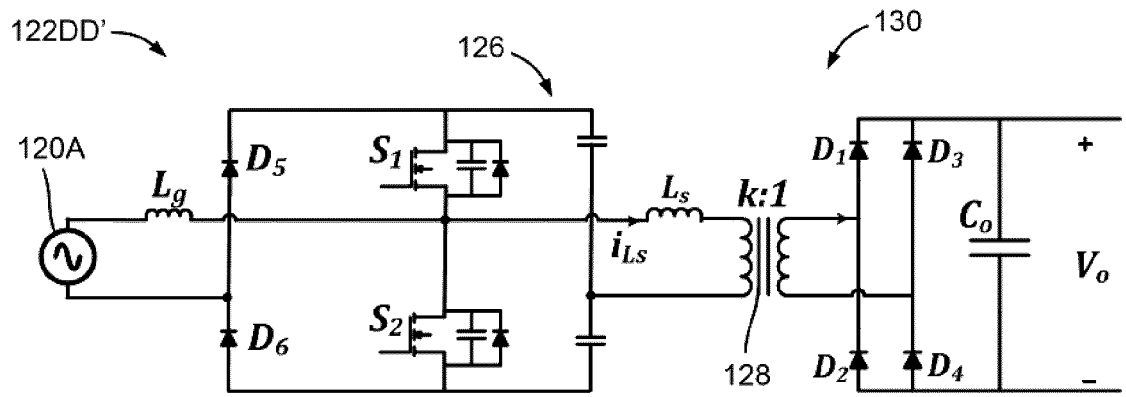
FIG. 13 is a schematic diagram of the circuitry of an AC/DC converter for using in the power-electronic conversion system shown in FIG. 10A.

In [33], a current-driven non-resonant converter is introduced, which is able to provide high performance similar to LLC resonant converters with less complexity. This structure has been further improved in [18] to extend soft-switching range. In order to reduce the effects of parasitic components, a non-resonant hybrid current-driven topology is disclosed in [34]. This topology can reduce the detrimental impact of the transformer winding capacitance and provide the converter with higher voltage gain. However, a passive component is added to the structure of the converter, which increases the reactive current and, in turn, the conduction losses. In [35], the non-resonant current-driven topology has been extended to alternate-current-to-direct-current (AC/DC) converters. The power circuit topology for this converter is shown in FIG. 13 (further described later). This converter offers a simple structure and provides ZVS over a wide range of operation with a simple control system. Although this power circuit topology offers many advantages, it suffers from some drawbacks. Operation of the input inductor in discontinuous conduction mode (DCM) results in high peak current values. Consequently, the root-mean-square (RMS) value of the current is high leading to high conduction losses. The other drawback of this topology is that the entire power needs to be processed by the power semiconductors. This increases the conduction losses and requires more effective thermal management.

Thus, the existing power circuit typologies usually provide soft-switching to attenuate the switching losses. However, they do not improve the conduction losses.

FIGS. 10A to 10D show a power-electronic conversion system 110, according to some embodiments of this disclosure. The power-electronic conversion system 110 may be used for converting electrical power from one form to another and comprises an electrical power source 120 powering a load 124 via a power-electronic converter 122.

Figure 10A:
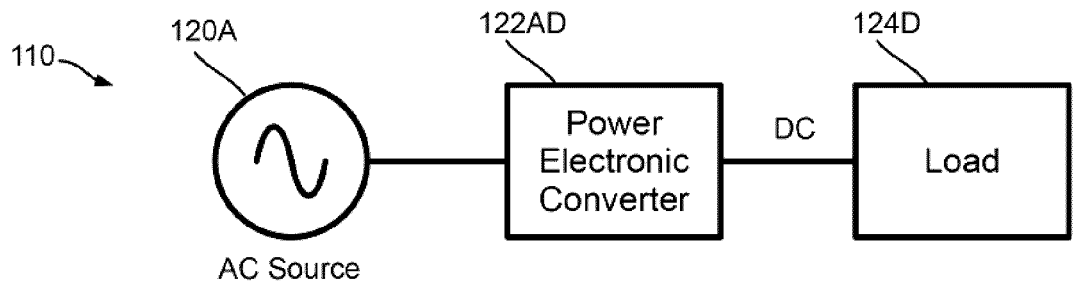
Figure 10B:
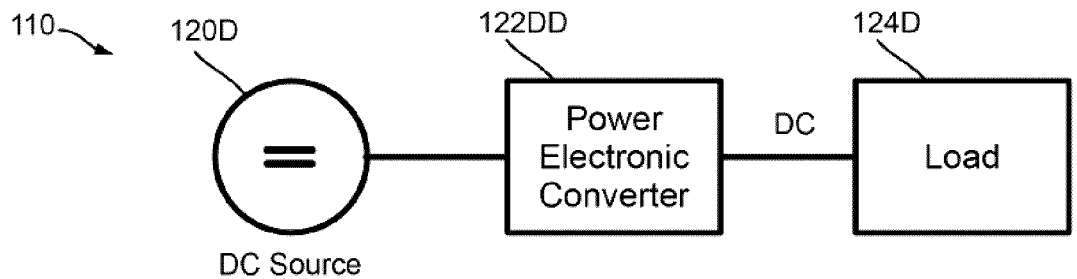
Figure 10C:
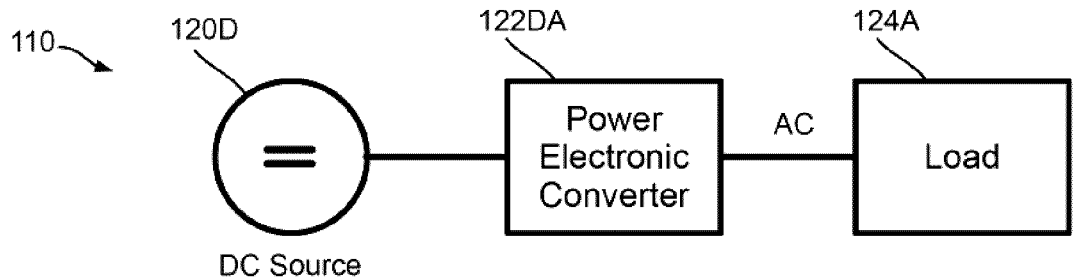
Figure 10D:
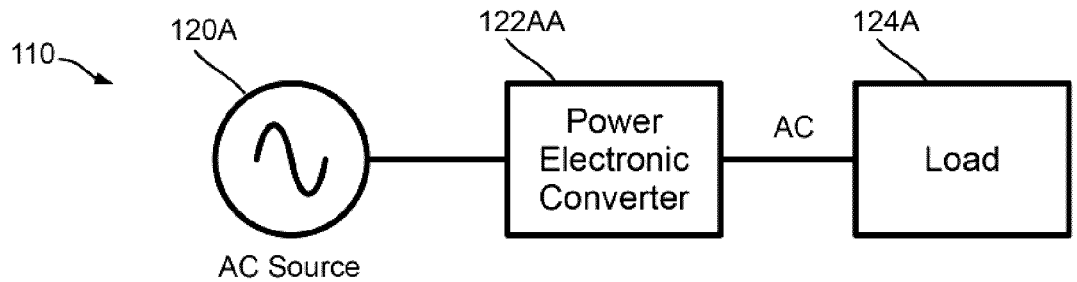

The electrical power source 120 may be an alternate-current (AC) power source 120A (see FIGS. 10A and 10D) or a direct-current (DC) power source 120D (see FIGS. 10B and 10C). The load 124 may be a DC load 124D (see FIGS. 10A and 10B) or an AC load 124A (see FIGS. 10C and 10D). Correspondingly, the power-electronic converter 122 may be an AC/DC converter 122AD (see FIG. 10A), a DC/DC converter 122DD (see FIG. 10B), a DC-to-AC (DC/AC) converter 122DA (see FIG. 10C), or an AC-to-AC (AC/AC) converter 122AA (see FIG. 10D).

In prior-art power-electronic conversion system and in some embodiments of the power-electronic conversion system 110 disclosed herein, the power circuitry of the power-electronic converter 122 may comprise power semiconductors (such as metal-oxide-semiconductor field-effect transistors (MOSFETs), diodes, and/or the like), capacitors, and magnetics (such as inductors, transformers, and/or the like). In these systems, the power semiconductors are used for high-frequency switching (and thus sometimes denoted "switching converters").

Usually, the use of power semiconductors with higher switching frequencies results in the need of smaller passive components (such as capacitors, magnetics, and/or the like) and higher power density. However, increasing the switching frequency of the power semiconductor increases the switching loss thereby reducing the power conversion efficiency, as the switching loss is the result of overlaps between the switching current waveform and the switching voltage waveform during switching transitions. Soft-switching methods have been used for reaching higher switching frequencies while alleviating switching losses.

Another important factor affecting the power conversion efficiency is the conduction loss (also called ohmic loss) which is the loss caused by current flowing through components usually considered ideally conductive (i.e., zero resistance) but practically with none-zero resistance values. For instance, when a MOSFET is on, it is theoretically considered ideally conductive but practically acts as a resistance (denoted as $R_{DS}(ON)$) with a non-zero resistance value (i.e., $R_{DS}(ON)>0$). Therefore, the conduction loss of the ON-state MOSFET is $I^2_{rms} \cdot R_{DS}(ON) > 0$, where $I_{rms}$ is the root mean square (rms) of the current flowing through the MOSFET.

Before describing the power-electronic conversion systems and power-electronic converters using DPT, the following first describes some prior-art power circuitries for reducing the switching and conduction losses of power-electronic converters.

Figure 11:
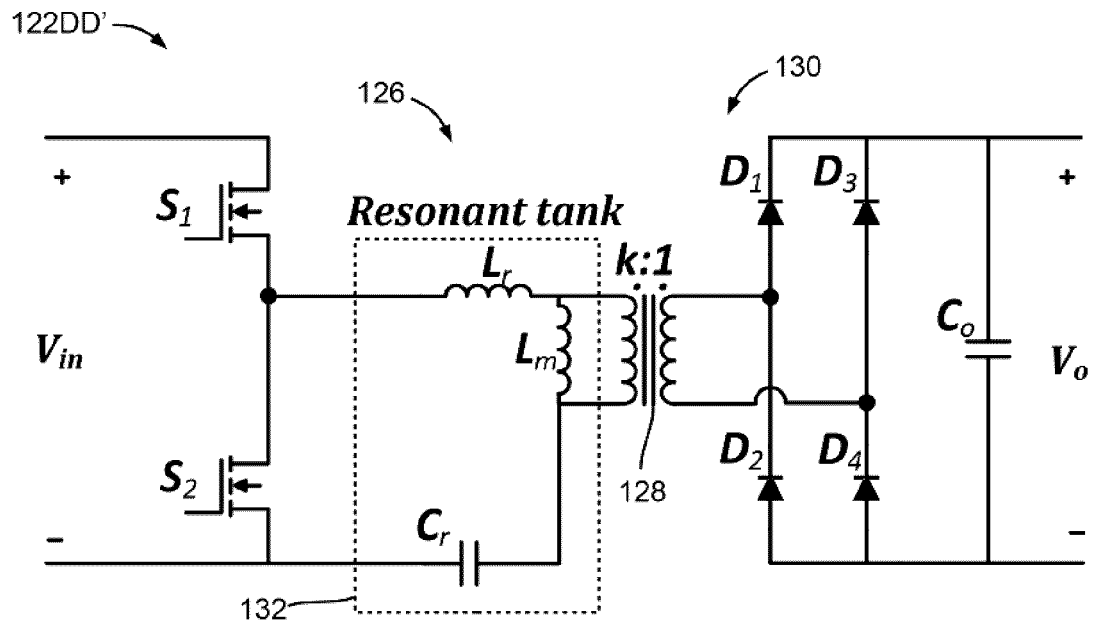
FIG. 11 is a schematic diagram of the circuitry of a prior-art resonant DC/DC converter for using in the power-electronic conversion system shown in FIG. 10B.

One of the widely used power circuitries in prior-art power-electronic converters is the resonant converter. FIG. 11 is a schematic diagram of the circuitry of an exemplary resonant DC/DC converter 122DD'.

As shown, the resonant DC/DC converter 122DD' receives a DC input $V_{in}$ from a DC power source (not shown) and uses a pair of MOSFETs $S_1$ and $S_2$ forming a current-switching structure on the primary side 126 thereof for switching current, a transformer 128 for electrically coupling the primary side 126 to the secondary side 130 thereof, and a set of four diodes $D_1$ to $D_4$ on the secondary side 130 for generating a DC output $V_o$. A capacitor $C_o$ is used on the secondary side for filtering the AC component out of the DC output $V_o$.

In this example, the resonant DC/DC converter 122DD' comprises a high-frequency filter or resonant tank 132 on the primary side 126 between the pair of MOSFETs $S_1$ and $S_2$ and the transformer 128 for providing nearly sinusoidal waveforms and providing soft switching to the transformer 128.

Figure 12:
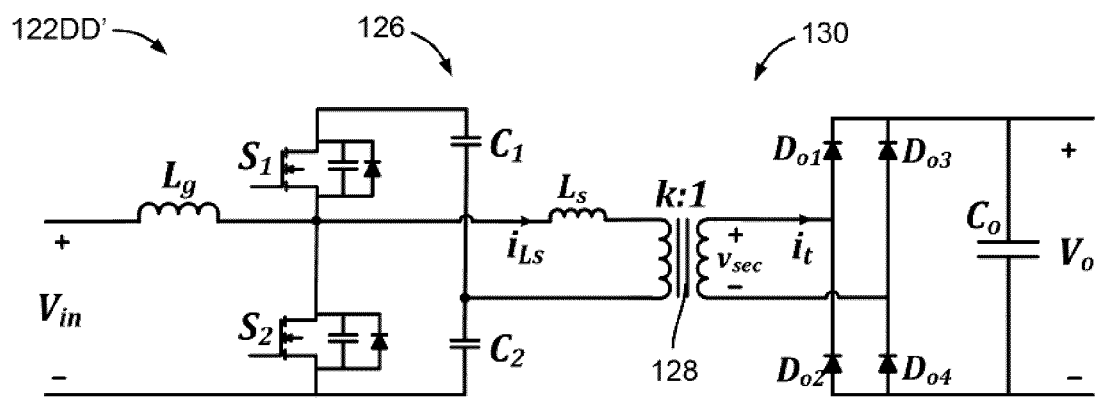
FIG. 12 is a schematic diagram of the circuitry of a prior-art non-resonant DC/DC converter for using in the power-electronic conversion system shown in FIG. 10B.

Non-resonant power circuitries are also known. FIG. 12 is a schematic diagram of the circuitry of an exemplary non-resonant DC/DC converter 122DD". Similar to the resonant DC/DC converter 122DD' shown in FIG. 11, the non-resonant DC/DC converter 122DD" shown in FIG. 12 comprises a pair of MOSFETs $S_1$ and $S_2$ on the primary side, a transformer 128 for electrically coupling the primary side 126 to the secondary side 130 thereof, and a set of four diodes $D_1$ to $D_4$ and a capacitor $C_o$ on the secondary side 130 for generating a DC output $V_o$. The non-resonant DC/DC converter 122DD" also comprises suitable components for providing soft switching.

The power circuitries shown in FIGS. 11 and 12 for resonant and non-resonant DC/DC converters may be modified for use in AC/DC converters. FIG. 13 shows the circuitry of an exemplary non-resonant AC/DC converter 122AD'. The non-resonant AC/DC converter 122AD' comprises a power circuitry similar to that of the non-resonant DC/DC converter 122DD" shown in FIG. 12 and further comprises a pair of diodes $D_5$ and $D_6$ on the primary side 126 coupling to the AC power source 120A for converting the AC power to a DC power for inputting to the power circuitry downstream thereto.

Figure 14:
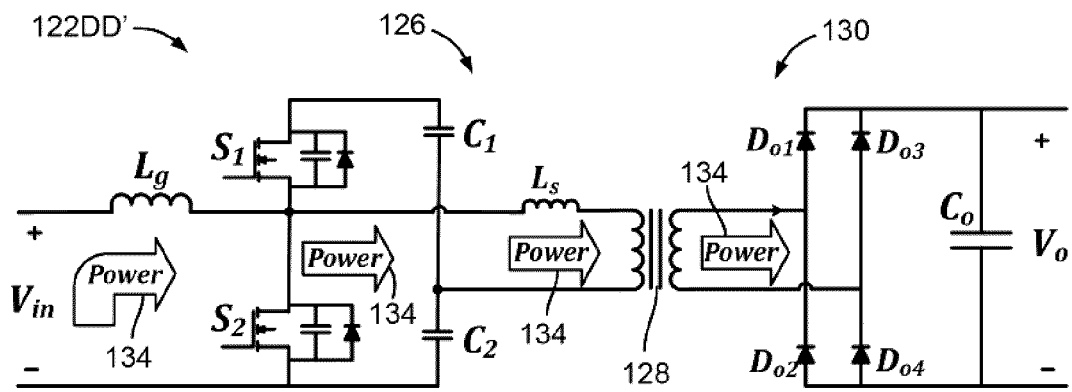
FIG. 14 is a schematic diagram of the circuitry of the prior-art non-resonant DC/DC converter shown in FIG. 12 with block arrows showing the power flow for indicating that the power semiconductors thereof process all input power.

In the prior-art power circuitries, all input power is processed by the power semiconductors and passive components (e.g. transformer). FIG. 14 is a schematic diagram of the circuitry of the non-resonant DC/DC converter 122DD" shown in FIG. 12 with block arrows 134 indicating the power flow. As all input power is processed by the power semiconductors $S_1$ and $S_2$ and the transformer 128, there may exist significant conduction losses caused by the power semiconductors $S_1$ and $S_2$ and the transformer 128. Therefore, the prior-art power converters may not provide sufficiently high power-conversion efficiencies.

The power-electronic conversion systems and power-electronic converters using DPT are now described.

In some embodiments, the power-electronic converter may be a DC/DC converter which may minimize both the conduction losses and the switching losses. The power circuit topology disclosed herein is based on the fundamental structure proposed in [35]. The main feature of the structure is its DPT capability that effectively reduces the power processed by the power semiconductors. Thus, the conduction losses can be reduced. In other words, a portion of the power is directly transferred to the output. Consequently, the power ratings of the components and their costs can be reduced. The other main advantage of the proposed structure is that the input current operates in pseudo-continuous conduction mode (pseudo-CCM). The input current in the proposed converter has much lower peak and RMS values compared to the one in [35]. Thus, the proposed structure can significantly reduce the conduction losses. This converter also provides ZVS conditions for the power semiconductors on the input side and ZCS conditions for the diodes on the output side.

Figure 15:
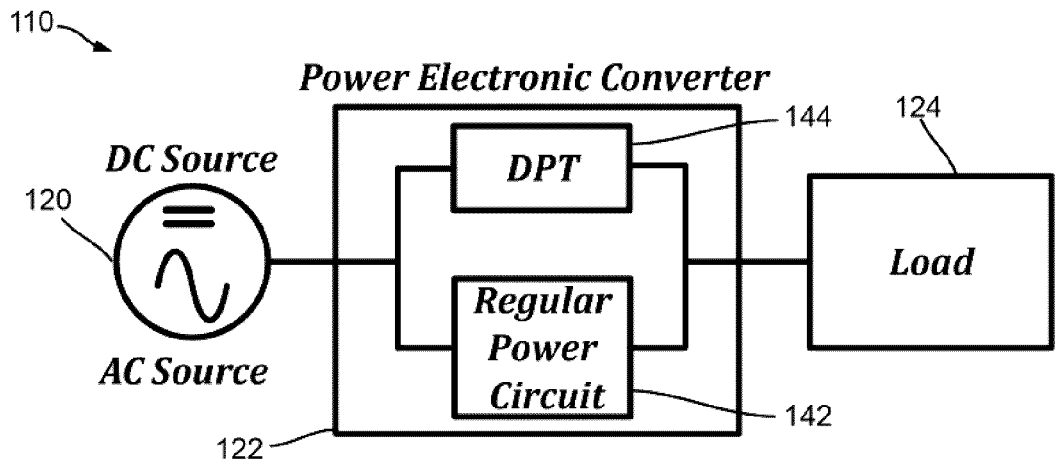
FIG. 15 is a schematic diagram of a power-electronic conversion system using direct power transfer (DPT), according to some embodiments of this disclosure, the power-electronic conversion system comprising a power-electronic converter having a power-conversion circuitry and a DPT channel electrically coupled together in parallel.

FIG. 15 is a schematic diagram of a power-electronic conversion system 110 for converting electrical power from one form to another, according to some embodiments of this disclosure. As shown, the power-electronic conversion system 110 comprises an electrical power source 120 powering a load 124 via a power-electronic converter 122. Similar to the system shown in FIGS. 10A to 10C, the electrical power source 120 in these embodiments may be an AC power source (corresponding to the AC power source 120A shown in FIG. 10A) or a DC power source (corresponding to the DC power source 120D shown in FIGS. 10B and 10C). The load 124 may be a DC load (corresponding to the DC load 124D shown in FIGS. 10A and 10B) or an AC load (corresponding to the AC load 124A shown in FIG. 10C).

Correspondingly, the power-electronic converter 122 may be an AC/DC converter (similar to the AC/DC converter 122AD shown in FIG. 10A), a DC/DC converter (similar to the DC/DC converter 122DD shown in FIG. 10B), or a DC/AC converter (similar to the DC/AC converter 122DA shown in FIG. 10C).

The power-electronic converter 122 in these embodiments comprises a power-conversion circuitry 142 such as a "regular", prior-art power circuitry having power semiconductors and passive components such as transformers (which may be similar to the prior-art power-electronic converters shown in FIGS. 11 to 13). However, the power-electronic converter 122 in these embodiments further comprises a DPT channel 144 electrically coupled to the power-conversion circuitry 142 in parallel for enhancing the performance of power electronic converter 122.

In operation, the power-electronic converter 122 uses the power-conversion circuitry 142 to convert a first portion of the electrical power received from the power source 120 and uses the DPT channel 144 to transfer a second portion of the electrical power received from the power source 120 directly to the output (e.g., the load 124) without being processed by the power semiconductors and passive components in the power-conversion circuitry 142.

Figure 16A:
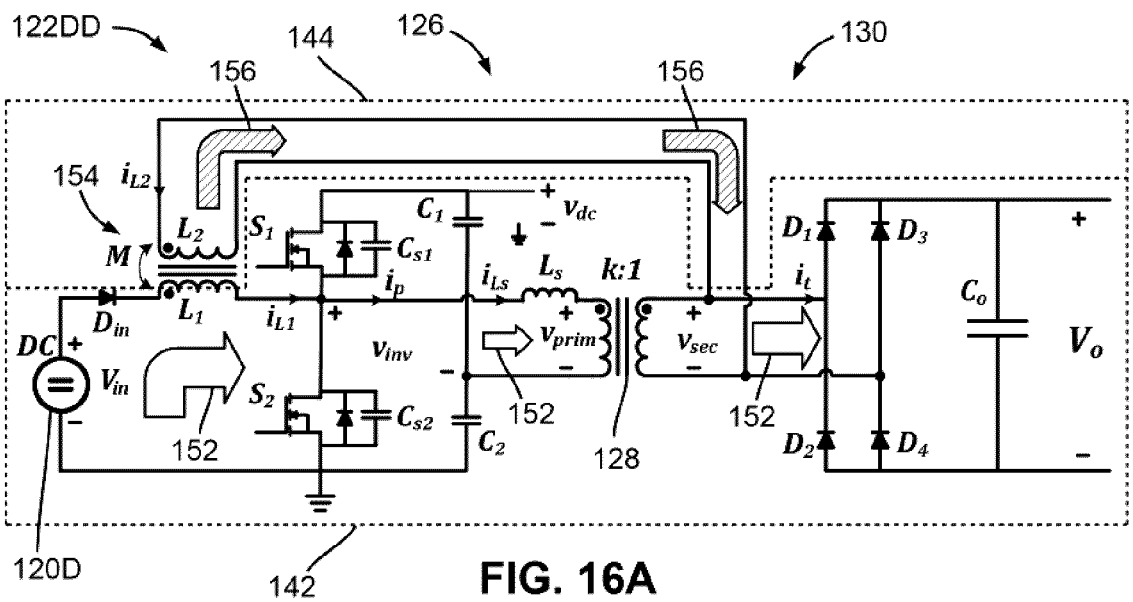
FIG. 16A is a schematic diagram of the circuitry of a DC/DC converter shown in FIG. 15, according to some embodiments of this disclosure.
Figure 16B:
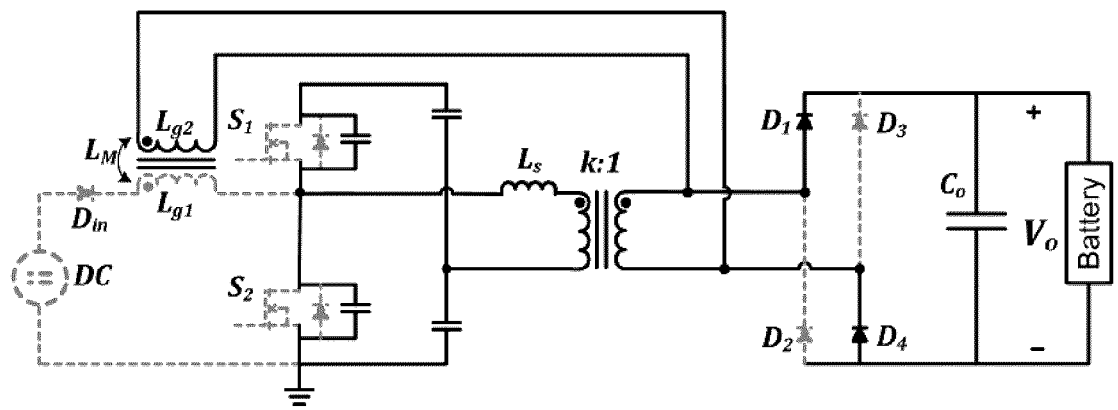
FIGS. 16B to 16H show different operation modes of the DC/DC converter shown in FIG. 16A.
Figure 16C:
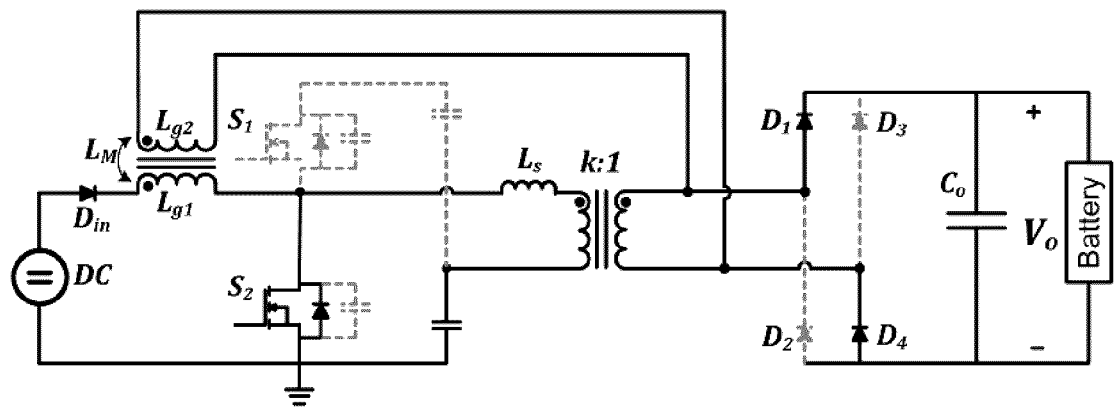
Figure 16D:
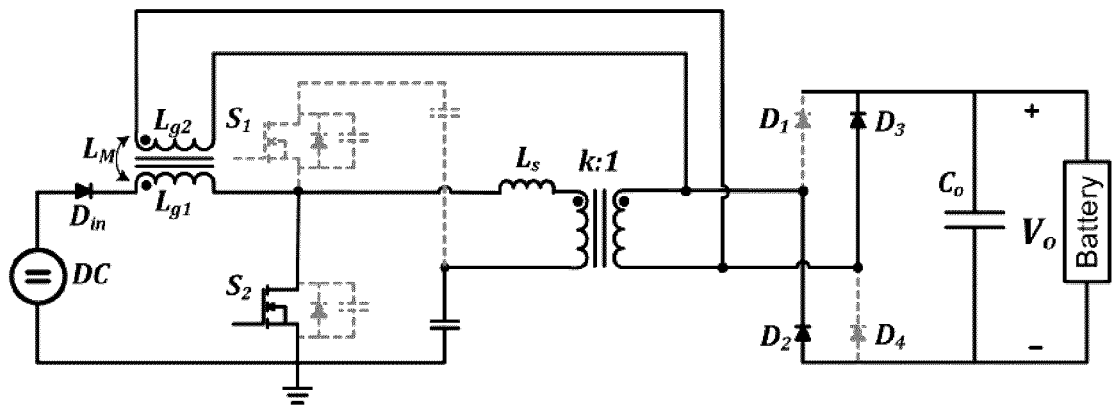
Figure 16E:
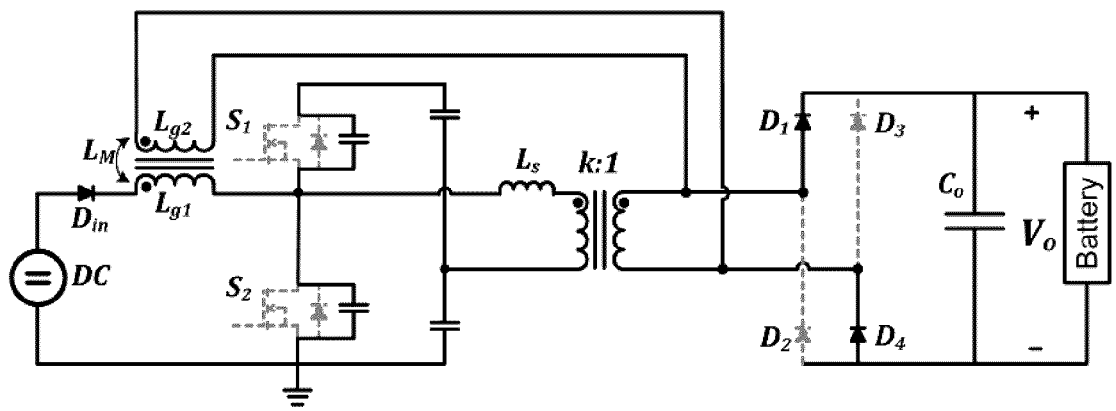
Figure 16F:
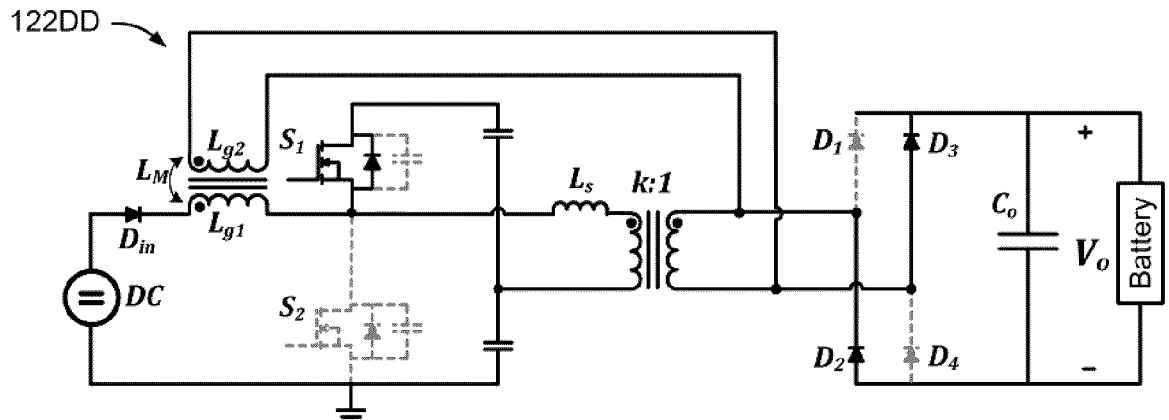
Figure 16G:
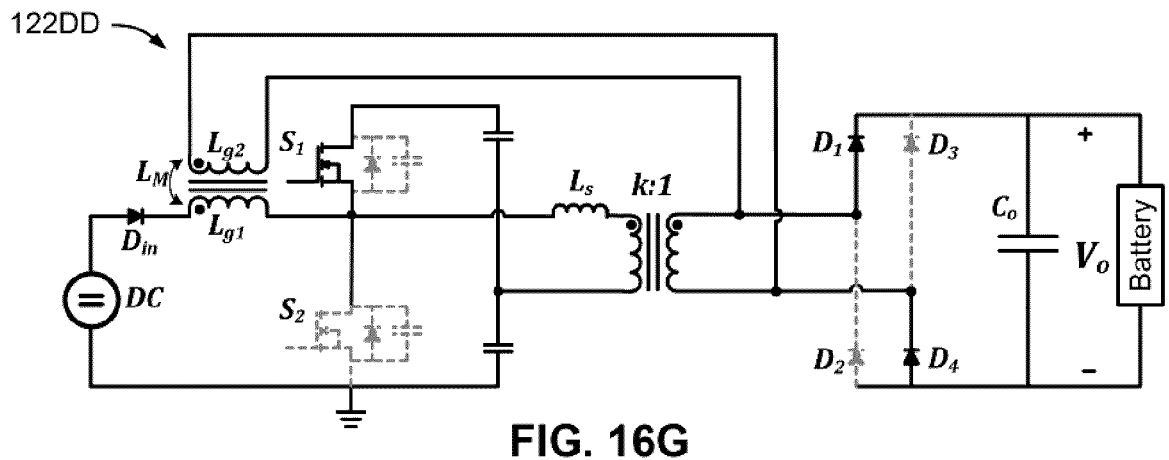
Figure 16H:
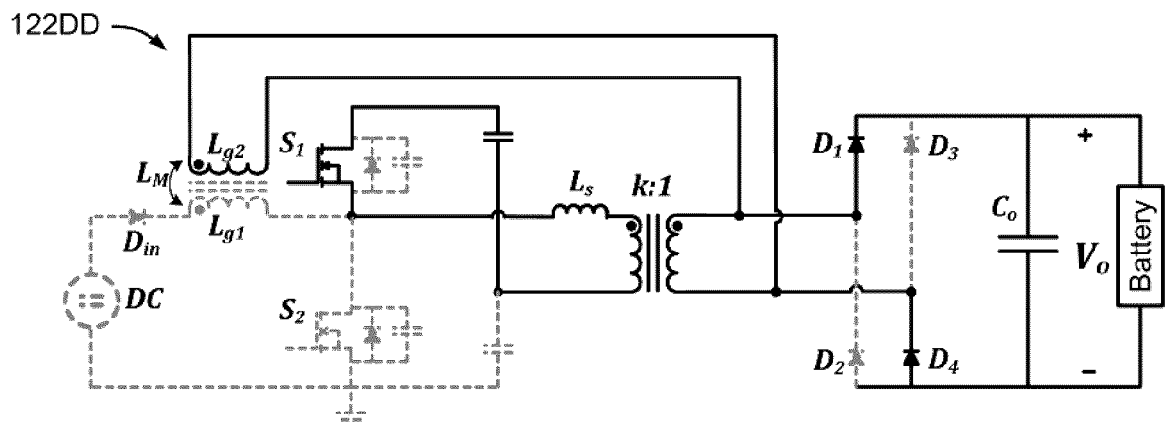

FIG. 16A shows the circuitry of a DC/DC power-electronic converter 122DD in one embodiment. As shown, the power-electronic converter 122DD comprises a regular power-conversion circuitry 142 similar to that shown in FIG. 12 (the inductor $L_g$ in FIG. 12 is denoted $L_1$ in FIG. 16A) which uses a pair of MOSFETs $S_1$ and $S_2$ and a first transformer 128 for converting a first portion of DC power (indicated by arrows 152) received from the DC power source 120D. The power-electronic converter 122 also comprises a DPT channel 144 coupling to the inductor $L_1$ of the regular power-conversion circuitry 142 on the primary side 126 thereof via a coupling inductor $L_2$ thereby forming a second transformer 154 for transferring a second portion of the received DC power (indicated by arrows 156) directly from the primary side 126 to the secondary side 130 thereby bypassing the MOSFETs $S_1$ and $S_2$ and the first transformer 128.

The input power is transferred to the output through two different paths. A portion of the power 152 is processed through the power semiconductors and the other portion 156 is directly transferred to the transformer secondary side through a coupled inductor (i.e. DPT). In this power circuit, the amount of power that needs to be processed through the power semiconductors and the transformer is reduced. Thus, this configuration can offer highly efficient power transfer. The other main feature of the converter 122DD is that the input current operates in pseudo-CCM that effectively reduces the peak and RMS values of the input current, leading to lower conduction losses and higher efficiency. The converter 122DD also provides galvanic isolation between the input and output as well as soft-switching over a wide range of operating conditions.

Figure 17:
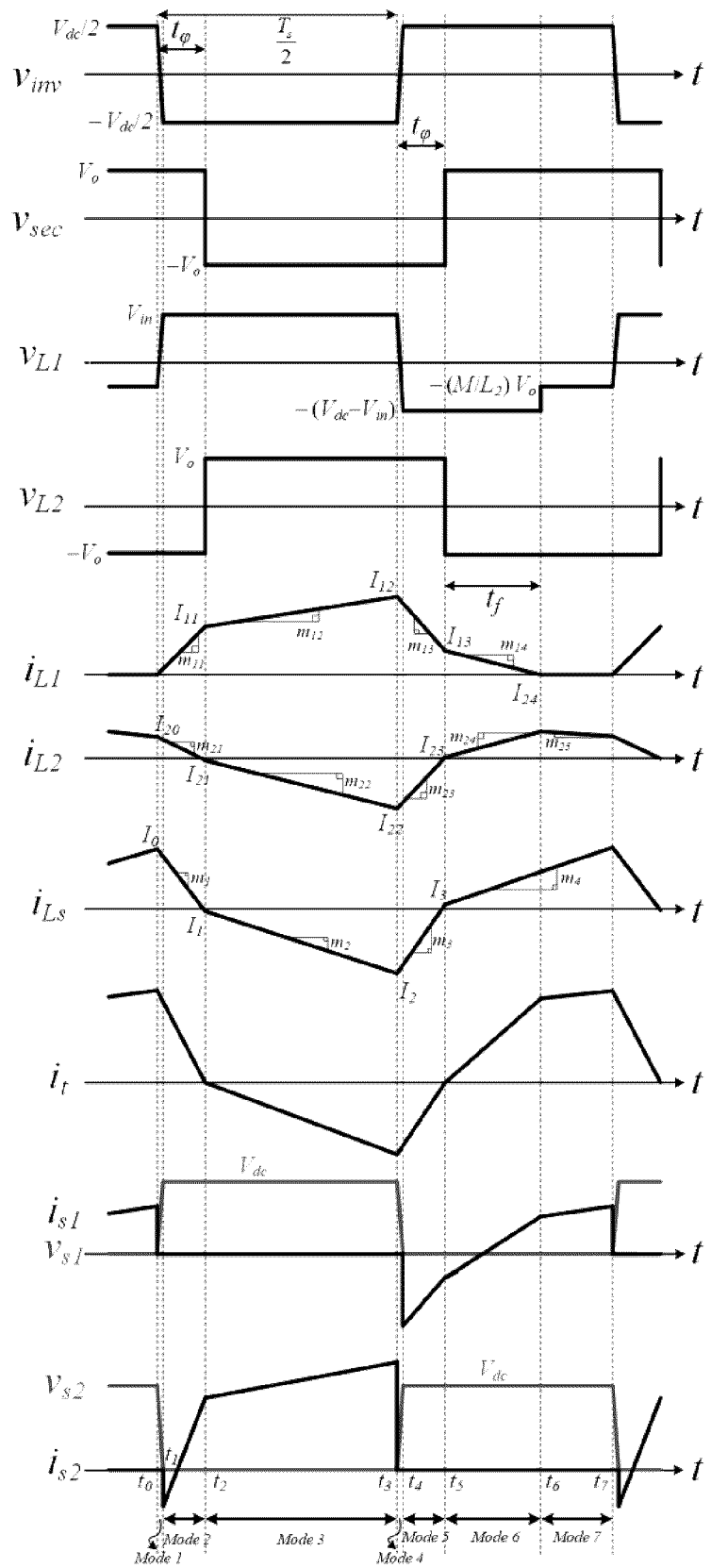
FIG. 17 shows the key waveforms of the DC/DC converter shown in FIG. 16A.

The converter 122DD has seven operating intervals (modes) within one switching cycle. FIGS. 16B to 16H show the equivalent circuits of the circuit topology 122DD in different modes of operation. The key waveforms of the circuit topology 122DD are shown in FIG. 17. In order to obtain the currents flowing through the coupled inductor windings during each mode, the following set of equations describing the relation between the currents and voltages of a coupled inductor is employed:

$$\begin{cases} r_{L1} = L_1 \dfrac{di_{L1}}{dt} - M \dfrac{di_{L2}}{dt} \\ r_{L2} = M \dfrac{di_{L1}}{dt} + L_2 \dfrac{di_{L2}}{dt} \end{cases} \quad (3)$$

From equation (3), the current derivatives can be written in terms of the voltages as $$\begin{cases} \dfrac{di_{L1}}{dt} = \dfrac{L_2}{L_t^2} v_{L1} - \dfrac{M}{L_t^2} v_{L2} \\ \dfrac{di_{L2}}{dt} = \dfrac{L_2}{L_t^2} v_{L1} - \dfrac{L_1}{L_t^2} v_{L2} \end{cases} \quad (4)$$

where $$L_t = \sqrt{L_1 L_2 - M^2}. \quad (5)$$

The operating modes are described as follows. Prior to Mode 1, the input current may be zero, the power switch $S_1$ is ON, and the output diodes $D_1$ and $D_4$ are conducting (i.e., are ON).

Mode 1 [$t_0$; $t_1$]: At $t_0$, the switch $S_1$ is turned OFF under ZVS condition due to existence of the snubber capacitors $C_{s1}$ and $C_{s2}$. The current $i_{Ls}$ charges the capacitor $C_{s1}$ and discharges the capacitor $C_{s2}$. As a result, the voltage across $S_1$ linearly rises, while the voltage across $S_2$ linearly reduces to zero.

Mode 2 [$t_1$, $t_2$]: When the voltage across $S_2$ becomes zero, its body diode starts conducting. Then, $S_2$ turns ON under ZVS condition. Consequently, $v_{inv}=-V_{dc}/2$ and $v_{L1}=V_{in}$. At the output side, since the total current $i_t$ (the sum of $ni_{Ls}$ and $i_{L2}$) flowing through the output bridge diodes is positive, $D_1$ and $D_4$ are still conducting. As a result, $v_{sec}=V_o$ and $v_{L2}=-V_o$. On the other hand, the voltage across the inductance $L_s$ is obtained as $$i_{Ls}=i_{inv}-m'_{sec}. \quad (6)$$

From equation (6), slope of the current $i_{Ls}$ during this mode is equal to $$m_1 = -\frac{V_{dc} + 2nV_o}{2L_s}. \quad (7)$$

According to the voltages applied to $L_1$ and $L_2$, $i_{L1}$ linearly rises from zero, while $i_{L2}$ starts decreasing. Therefore, the input diode $D_{in}$, turns ON under ZCS condition. The slopes of $i_{L1}$ and $i_{L2}$ are obtained using equation (4) as $$m_{11} = \frac{L_2 V_{in} + MV_o}{L_t^2} \quad (8)$$

$$m_{21} = -\frac{MV_{in} + L_1 V_o}{L_t^2}. \quad (9)$$

Since both the currents $i_{Ls}$ and $i_{L2}$ are decreasing, the current $i_t$ decreases as well. When $i_t$ reaches zero, $D_1$ and $D_4$ turn OFF under ZCS condition and this mode ends.

Mode 3 [$t_2$, $t_3$]: As the direction of the current $i_t$ reverses and $i_t$ becomes negative, the output diodes $D_2$ and $D_3$ turn ON under ZCS condition. Thus, the polarity of the voltage across the transformer secondary winding as well as across the coupled inductor secondary winding is reversed, i.e., $v_{sec}=-V_o$ and $v_{L2}=V_o$. As the switch $S_2$ is still ON, the inverter output voltage as well as the voltage across $L_1$ remains the same as the previous mode ($v_{inv}=-V_{dc}/2$ and $v_{L1}=V_{in}$). Using equation (6), the slope of $i_{Ls}$ during this mode is expressed as $$m_2 = -\frac{V_{dc} - 2nV_o}{2L_s}. \quad (10)$$

From equation (4), the slopes of $i_{L1}$ and $i_{L2}$ are also obtained.

$$m_{12} = \frac{L_2 V_{in} - MV_o}{L_t^2} \quad (11)$$

$$m_{22} = \frac{-MV_{in} + L_1 V_o}{L_t^2} \quad (12)$$

Mode 4 [$t_3$; $t_4$]: At $t_3$, the switch $S_2$ is turned OFF under ZVS condition. The sum of magnitudes of the currents $i_{L1}$ and $i_{Ls}$ charges the capacitor $C_{s2}$ and discharges the capacitor $C_{s1}$. As a result, the voltage across $S_2$ linearly rises, while the voltage across $S_1$ linearly reduces to zero.

Mode 5 [$t_4$; $t_5$]: When the voltage across $S_1$ becomes zero, its body diode starts conducting. Then, $S_1$ turns ON under ZVS condition. As a result, $v_{inv}=V_{dc}/2$ and $v_{L1}=V_{in}-V_{dc}$. At the output side, the diodes $D_2$ and $D_3$ are still conducting since the current it is negative. Thus, $v_{sec}$ and $v_{L2}$ are the same as the previous mode. Similarly, slopes of the currents $i_{Ls}$, $i_{L1}$, and $i_{L2}$ during this mode can be obtained as $$m_3 = \frac{V_{dc} + 2nV_o}{2L_s} = -m_1 \quad (13)$$

$$m_{13} = -\frac{L_2(V_{dc} - V_{in}) + MV_o}{L_t^2} \quad (14)$$

$$m_{23} = \frac{M(V_{dc} - V_{in}) + L_1 V_o}{L_t^2}. \quad (15)$$

On the other hand, magnitude of the current $i_t$ linearly reduces to zero. When the current becomes zero, $D_2$ and $D_3$ turn OFF under ZCS condition and this mode ends.

Mode 6 [$t_5$; $t_6$]: As the direction of the current it reverses and it becomes positive, $D_1$ and $D_4$ turn ON under ZCS condition. As a result, $v_{sec}=V_o$ and $V_{L2}=-V_o$. On the other hand, $S_1$ is still ON, hence, $v_{inv}=V_{dc}/2$ and $v_{L1}=V_{in}-V_{dc}$. Slopes of the currents $i_{Ls}$, $i_{L1}$, and $i_{L2}$ during this mode can be obtained as $$m_3 = \frac{V_{dc} + 2nV_o}{2L_s} = -m_2 \quad (16)$$

$$m_{14} = \frac{-L_2(V_{dc} - V_{in}) + MV_o}{L_t^2} \quad (17)$$

$$m_{24} = \frac{M(V_{dc} - V_{in}) - L_1 V_o}{L_t^2}. \quad (18)$$

This mode ends when the current $i_{L1}$ becomes zero and $D_{in}$ turns OFF under ZCS condition.

Mode 7 [$t_6$; $t_7$]: During this mode, the input current $i_{L1}$ is zero. The voltages $v_{inv}$, $v_{sec}$, and $v_{L2}$ are the same as the previous mode. Also, the current $i_{Ls}$ keeps rising with the slope given in equation (16). Since the input current is zero, equation (4) implies that the voltage across $L_1$ is determined by $v_{L2}$, i.e., $v_{L1}=(M/L_2)v_{L2}$. The slope of $i_{L2}$ is obtained as $$m_{25}=-V_o/L_2 \quad (19)$$

This mode continues until the switch $S_1$ is turned OFF again at the beginning of the next cycle.

Figure 18:
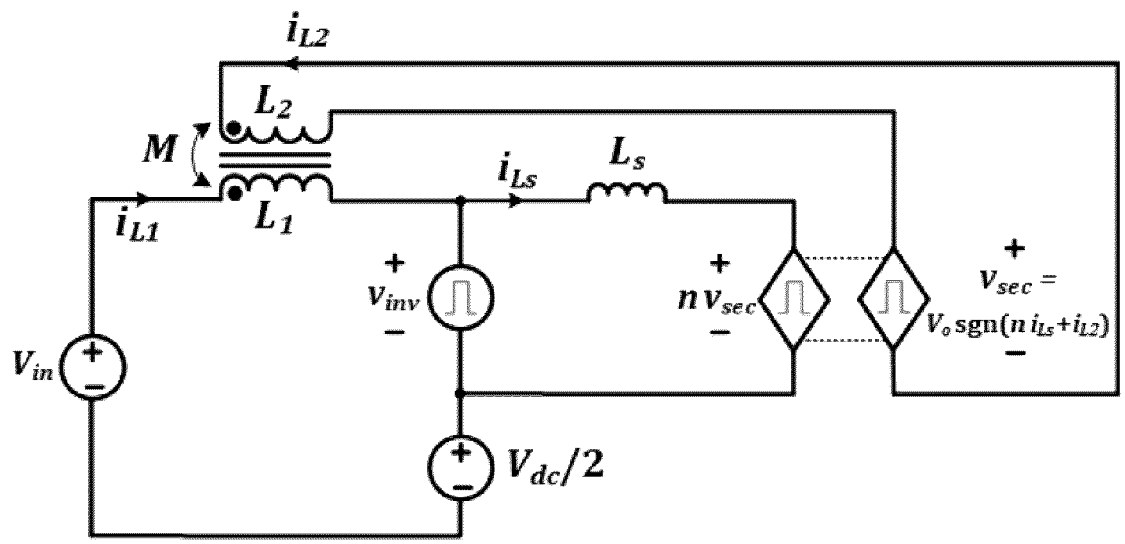
FIG. 18 is a schematic diagram showing a simplified circuit of the DC/DC converter shown in FIG. 16A.

The converter 122DD is mathematically analyzed in detail. The DC/DC conversion stage can be simplified as depicted in FIG. 18. In this figure, the voltage supply $v_{inv}$ represents a square waveform alternating between $V_{dc}/2$ and $-V_{dc}/2$ as switches turn on and off (assuming the duty cycle equal to 50%). The polarity of the voltage applied to the transformer secondary winding depends on the direction of the total high frequency current $i_t$ (the sum of $ni_{Ls}$ and $i_{L2}$) flowing through the output diode rectifier. When $i_t$ is positive, $D_1$ and $D_4$ conduct and $v_{sec}=V_o$. Alternatively, $v_{sec}=-V_o$ when $i_t$ is negative. Thus, the output section is represented by a current-controlled voltage source.

As mentioned earlier, the input power in the proposed power circuit topology is transferred to the output through two paths: 1) through the power switches and the high frequency transformer, and 2) through the coupled inductor (DPT). First, the amount of power transferred through the transformer is obtained. For this purpose, the current $i_{Ls}$ is required to be formulated.

Since time duration of Modes 1 and 4 is sufficiently short compared to the other modes, they are neglected in the analysis. According to FIG. 17 and assuming $t_0=0$, $i_{Ls}$ can be expressed by four linear equations within each switching cycle as $$i_{Ls1}(t) = m_1 t + I_0 \quad t \in [0, t_\phi] \tag{20}$$

$$i_{Ls2}(t) = m_2(t - t_\phi) + I_1 \quad t \in \left[t_\phi, \frac{T_s}{2}\right] \tag{21}$$

$$i_{Ls3}(t) = m_3\left(t - \frac{T_s}{2}\right) + I_2 \quad t \in \left[\frac{T_s}{2}, \frac{T_s}{2} + t_\phi\right] \tag{22}$$

$$i_{Ls4}(t) = m_4\left(t - \frac{T_s}{2} - t_\phi\right) + I_3 \quad t \in \left[\frac{T_s}{2} + t_\phi, T_s\right] \tag{23}$$

where $m_1$ through $m_4$ are given in equations (7), (10), (13), and (16), respectively. The constants $I_0$, $I_1$, and $I_2$ are obtained by evaluating equations (20), (21), and (22), respectively, at $t_\phi$, $T_s/2$, and $T_s/2 + t_\phi$.

$$I_1 = -\frac{V_{dc} + 2nV_o}{2L_s} t_\phi + I_0 \tag{24}$$

$$I_2 = -\frac{V_{dc} - 2nV_o}{2L_s} \frac{T_s}{2} - \frac{2nV_o}{L_s} t_\phi + I_0 \tag{25}$$

$$I_3 = -\frac{V_{dc} - 2nV_o}{2L_s}\left(\frac{T_s}{2} - t_\phi\right) + I_0 \tag{26}$$

Substituting equations (7), (10), (13), (16), and (24)-(26) into (20)-(23), the four linear pieces of $i_{Ls}$ are obtained.

$$i_{Ls1}(t) = -\frac{V_{dc} + 2nV_o}{2L_s} t + I_0 \tag{27}$$

$$i_{Ls2}(t) = -\frac{V_{dc} - 2nV_o}{2L_s} t - \frac{2nV_o}{L_s} t_\phi + I_0 \tag{28}$$

$$i_{Ls3}(t) = \frac{V_{dc} - 2nV_o}{2L_s} t - \frac{V_{dc}}{L_s}\frac{T_s}{2} - \frac{2nV_o}{L_s} t_\phi + I_0 \tag{29}$$

$$i_{Ls4}(t) = -\frac{V_{dc} - 2nV_o}{2L_s} t - \frac{V_{dc} - 2nV_o}{2L_s} T_s + I_0 \tag{30}$$

To calculate the averaged power $P_{tran}$ transferred to the secondary side of the high frequency transformer, the instantaneous power $v_{inv}(t) \cdot i_{Ls}(t)$ is integrated over one switching period.

$$P_{tran} = \frac{1}{T_s}\left[-\frac{V_{dc}}{2}\int_0^{t_\phi} i_{Ls1}(t)dt - \right. \tag{31}$$

$$\left. \frac{V_{dc}}{2}\int_{t_\phi}^{T_s/2} i_{Ls2}(t)dt + \frac{V_{dc}}{2}\int_{T_s/2}^{T_s/2+t_\phi} i_{Ls3}(t)dt + \frac{V_{dc}}{2}\int_{T_s/2+t_\phi}^{T_s} i_{Ls4}(t)dt\right]$$

Substituting equations (27)-(30) into equation (31) and calculating the integrals yield the transferred averaged power as $$P_{tran} = \frac{V_{dc} n V_o}{2L_s} t_\phi(1 - 2t_\phi f_s). \tag{32}$$

Defining a new parameter $n_\phi = t_\phi/T_s$ ($t_\phi$ normalized to the switching period), equation (32) is simplified to $$P_{tran} = \frac{V_{dc} n V_o}{2 L_s f_s} n_\phi(1 - 2n_\phi). \tag{33}$$

Equation (33) signifies that $P_{tran}$ reaches its maximum value at $n_\phi = 0.25$. Moreover, it is inversely proportional to the switching frequency. In other words, the amount of power transferred through the transformer is decreased with the switching frequency.

In addition to the power transferred through the power switches and the transformer, a portion of the power is transferred to the output through the coupled inductor. To calculate this power, it is required to obtain the current $i_{L2}$ flowing through the secondary winding of the coupled inductor.

According to FIG. 17, $i_{L2}$ can be expressed by five linear pieces within one switching cycle.

$$i_{L2,1}(t) = m_{21} t + I_{20} \tag{34}$$

$$t \in [0, t_\phi]$$

$$i_{L2,2}(t) = m_{22}(t - t_\phi) + I_{21} \tag{35}$$

$$t \in \left[t_\phi, \frac{T_s}{2}\right]$$

$$i_{L2,3}(t) = m_{23}\left(t - \frac{T_s}{2}\right) + I_{22} \tag{36}$$

$$t \in \left[\frac{T_s}{2}, \frac{T_s}{2} + t_\phi\right]$$

$$i_{L2,4}(t) = m_{24}\left(t - \frac{T_s}{2} - t_\phi\right) + I_{23} \tag{37}$$

$$t \in \left[\frac{T_s}{2} + t_\phi, \frac{T_s}{2} + t_\phi + t_f\right]$$

$$i_{L2,5}(t) = m_{25}\left(t - \frac{T_s}{2} - t_\phi - t_f\right) + I_{24} \tag{38}$$

$$t \in \left[\frac{T_s}{2} + t_\phi + t_f, T_s\right]$$

where the current slopes $m_{21}$ through $m_{25}$ are given by equations (9), (12), (15), (18), and (19). Also, $t_f$ is the time duration of Mode 6 in which the current $i_{L1}$ reduces to zero as indicated in FIG. 17. Evaluating equations (34)-(37) at $t_\phi$, $T_s/2$, $T_s/2 + t_\phi$, and $T_s/2 + t_\phi + t_f$, respectively, yields the constants $I_{21}$ through $I_{24}$.

$$I_{21} = -\frac{MV_{in} + L_1 V_o}{L_t^2} t_\phi + I_{20} \tag{39}$$

$$I_{22} = \frac{-MV_{in} + L_1 V_o}{L_t^2} \frac{T_s}{2} - \frac{2L_1 V_o}{L_t^2} t_\phi + I_{20} \quad (40)$$

$$I_{23} = \frac{M(V_{dc} - V_{in}) - L_1 V_o}{L_t^2} t_\phi + \frac{-MV_{in} + L_1 V_o}{L_t^2} \frac{T_s}{2} + I_{20} \quad (41)$$

$$I_{24} = \frac{M(V_{dc} - V_{in}) - L_1 V_o}{L_t^2}(t_\phi + t_f) + \frac{-MV_{in} + L_1 V_o}{L_t^2} \frac{T_s}{2} + I_{20} \quad (42)$$

Substituting equations (9), (12), (15), (18), (19), and (39)-(42) into equations (34)-(38), the linear pieces of $i_{L2}$ are obtained.

$$i_{L2,1}(t) = -\frac{MV_{in} + L_1 V_o}{L_t^2} t + I_{20} \quad (43)$$

$$i_{L2,2}(t) = \frac{-MV_{in} + L_1 V_o}{L_t^2} t - \frac{2L_1 V_o}{L_t^2} t_\phi + I_{20} \quad (44)$$

$$i_{L2,3}(t) = \frac{M(V_{dc} - V_{in}) + L_1 V_o}{L_t^2} t - \frac{MV_{dc}}{L_t^2} \frac{T_s}{2} - \frac{2L_1 V_o}{L_t^2} t_\phi + I_{20} \quad (45)$$

$$i_{L2,4}(t) = \frac{M(V_{dc} - V_{in}) - L_1 V_o}{L_t^2} t + \frac{-MV_{dc} + 2L_1 V_o}{L_t^2} \frac{T_s}{2} + I_{20} \quad (46)$$

$$i_{L2,5}(t) = -\frac{V_o}{L_2} t + \frac{V_o}{L_2} T_s + I_{20} \quad (47)$$

The averaged power directly transferred to the output through the coupled inductor $P_{DPT}$ is derived by integrating the instantaneous power $-v_{L2} \cdot i_{L2}$ over one switching cycle.

$$P_{DPT} = \frac{1}{T_s}\left[V_o \int_0^{t_\phi} i_{L2,1}(t)dt - V_o \int_{t_\phi}^{T_s/2} i_{L2,2}(t)dt - \right.$$

$$\left. V_o \int_{T_s/2}^{T_s/2+t_\phi} i_{L2,3}(t)dt + V_o \int_{T_s/2+t_\phi}^{T_s/2+t_\phi+t_f} i_{L2,4}(t)dt + V_o \int_{T_s/2+t_\phi+t_f}^{T_s} i_{L2,5}(t)dt \right] \quad (48)$$

Substituting equations (43)-(47) into (48) and calculating the integral yield the direct averaged power as $$P_{DPT} = \frac{V_o f_s}{2L_t^2}\left\{MV_{in}\left[\frac{T_s^2}{4} - (t_\phi + t_f)^2 + T_2(t_\phi - t_f)\right] + \right.$$

$$\left. MV_{dc}(t_f^2 - t_\phi^2 + 2t_\phi t_f) - \frac{M^2 V_o}{L_2}\left(\frac{T_s}{2} - t_\phi - t_f\right)^2 \right\}. \quad (49)$$

Defining a new parameter $n_f = t_f/T_s$ ($t_f$ normalized to the switching period), equation (49) is simplified to $$P_{DPT} = \frac{V_o}{2L_t^2 f_s}\left\{MV_{in}\left[0.25 - (n_\phi + n_f)^2 + n_\phi - n_f\right] + \right.$$

$$\left. MV_{dc}(n_f^2 - n_\phi^2 + 2n_\phi n_f) - \frac{M^2 V_o}{L_2}(0.5 - n_\phi - n_f)^2\right\}. \quad (50)$$

Equation (50) signifies that $P_{DPT}$, similar to $P_{tran}$, is inversely proportional to the switching frequency. As a result, as the switching frequency rises, the amount of power transferred to the output through both paths (through the transformer as well as through the coupled inductor) is decreased. Having both $P_{tran}$ and $P_{DPT}$ determined, the total output power can be expressed as $$P_o = P_{tran} + P_{DPT} \quad (51)$$

where $P_{tran}$ and $P_{DPT}$ are given in equations (33) and (50), respectively.

Another important parameter required to be calculated is the averaged input current $I_{in}$. For this purpose, $i_{L1}$ is first formulated. According to FIG. 17, $i_{L1}$ can be expressed by five linear pieces within each switching cycle.

$$i_{L1,1}(t) = m_{11} t \quad t \in [0 \cdot t_\phi] \quad (52)$$

$$i_{L1,2}(t) = m_{12}(t - t_\phi) + I_{11} \quad t \in \left[t_\phi \cdot \frac{T_s}{2}\right] \quad (53)$$

$$i_{L1,3}(t) = m_{13}\left(t - \frac{T_s}{2}\right) + I_{12} \quad t \in \left[\frac{T_s}{2} \cdot \frac{T_s}{2} + t_\phi\right] \quad (54)$$

$$i_{L1,4}(t) = m_{14}\left(t - \frac{T_s}{2} - t_\phi\right) + I_{13} \quad t \in \left[\frac{T_s}{2} + t_\phi \cdot \frac{T_s}{2} + t_\phi + t_f\right] \quad (55)$$

$$i_{L1,5}(t) = 0 \quad t \in \left[\frac{T_s}{2} + t_\phi + t_f \cdot T_s\right] \quad (56)$$

where $m_{11}$ through $m_{14}$ are given in equations (8), (11), (14), and (17). The constants $I_{11}$, $I_{12}$, and $I_{13}$ can be calculated by evaluating equations (52), (53), and (54) at $t_\phi$, $T_s/2$, and $T_s/2 + t_\phi$, respectively.

$$I_{11} = \frac{L_2 V_{in} + MV_o}{L_t^2} t_\phi \quad (57)$$

$$I_{12} = \frac{L_2 V_{in} + MV_o}{L_t^2} \frac{T_s}{2} + \frac{2MV_o}{L_t^2} t_\phi \quad (58)$$

$$I_{13} = \frac{-L_2(V_{dc} - V_{in}) + MV_o}{L_t^2} t_\phi + \frac{L_2 V_{in} - MV_o}{L_t^2} \frac{T_s}{2} \quad (59)$$

Substituting equations (8), (11), (14), (17), and (57)-(59) into equations (52)-(55), the four linear pieces of $i_{L1}$ are derived.

$$i_{L1,1}(t) = \frac{L_2 V_{in} + MV_o}{L_t^2} t \quad (60)$$

$$I_{L1,2} = \frac{L_2 V_{in} + MV_o}{L_t^2} \frac{T_s}{2} + \frac{2MV_o}{L_t^2} t_\phi \quad (61)$$

$$I_{L1,3} = \frac{-L_2(V_{dc} - V_{in}) + MV_o}{L_t^2} t_\phi + \frac{L_2 V_{in} - MV_o}{L_t^2} \frac{T_s}{2} \quad (62)$$

$$I_{L1,4} = \frac{-L_2(V_{dc} - V_{in}) + MV_o}{L_t^2} t + \frac{L_2 V_{dc} - 2MV_o}{L_t^2} \frac{T_s}{2} \quad (63)$$

According to its definition, the averaged input current $I_{in}$ is obtained as $$I_{in} = \frac{1}{T_s}\left[\int_0^{t_\phi} j_{L1,1}(t)dt + \right.$$

$$\left. \int_{t_\phi}^{T_s/2} i_{L1,2}(t)dt + \int_{T_s/2}^{T_s/2+t_\phi} i_{L1,3}(t)dt + \int_{T_s/2+t_\phi}^{T_s/2+t_\phi+t_f} i_{L1,4}(t)dt \right]. \quad (64)$$

Substituting equations (60)-(63) into equation (64) and calculating the integrals yield the averaged input current as $$I_{in} = \frac{f_s}{2L_t^2}\left\{L_2 V_{in}\left(\frac{T_s}{2} + t_\phi + t_f\right)^2 - \right. \tag{65}$$

$$\left. L_2 V_{dc}(t_\phi + t_f)^2 + M V_o\left[(t_\phi + t_f)^2 + T_s(t_\phi - t_f) - \frac{T_s^2}{4}\right]\right\}.$$

Rewriting equation (65) in terms of $n_\phi$ and $n_f$ results in the following simplified equation:

$$I_{in} = \frac{1}{2L_t^2 f_s}\{L_2 V_{in}(0.5 + n_\phi + n_f)^2 - \tag{66}$$

$$L_2 V_{dc}(n_\phi + n_f)^2 + M V_o[(n_\phi + n_f)^2 + n_\phi - n_f - 0.25]\}$$

Equation (66) implies that the averaged input current (or equivalently, the input power) is inversely proportional to the switching frequency. This is in accordance with the fact that the output power linearly decreases with the switching frequency as given in equations (33) and (50).

In the converter 122DD, the voltage level $V_{dc}$ is determined such that the averaged input power $P_{in}$ is equal to the output power $P_o$ (neglecting the converter losses). In other words, the following equation must be satisfied:

$$V_{in}I_{in} = P_{tran} + P_{DPT} \tag{67}$$

Substituting equations (33), (50), and (66) into equation (67) yields the voltage $V_{dc}$ as $$V_{dc} = \frac{L_s}{L_2}\frac{\begin{pmatrix}L_2^2 V_{in}^2(0.5+n_\phi+n_f)^2 + \\ 2ML_2 V_o V_{in}\left[(n_\phi+n_f)^2 - 0.25\right] + M^2 V_o^2(0.5-n_\phi-n_f)^2\end{pmatrix}}{\begin{pmatrix}(nV_o L_t^2 n_\phi(1-2n_\phi) + \\ L_2 L_s V_{in}(n_\phi+n_f)^2 + ML_s V_o(n_f^2 - n_\phi^2 + 2n_\phi n_f)\end{pmatrix}} \tag{68}$$

According to FIG. 17, $t_\phi$ represents the phase difference between the square voltages $v_{inv}$ and $v_{sec}$. The voltage $v_{inv}$ is dependent on the switching state. However, the voltage $v_{sec}$ is equal to $V_o \, \mathrm{sgn}(ni_{Ls}+i_{L2})$ as shown in FIG. 18. According to FIG. 17, $i_r=0$ at $t=t_2$ and $t=t_5$. Hence, the following equations are valid:

$$\begin{cases} nI_1 + I_{21} = 0 \\ nI_3 + I_{23} = 0 \end{cases} \tag{69}$$

Substituting equations (24), (26), (39), and (41) into equation (69) yields $$\begin{cases} nI_0 + I_{20} = n\dfrac{V_{dc} + 2nV_o}{2L_s}t_\phi + \dfrac{MV_{in} + L_1 V_o}{L_t^2}t_\phi \\ nI_0 + I_{20} = n\dfrac{V_{dc} - 2nV_o}{2L_s}\left(\dfrac{T_s}{2} - t_\phi\right) - \dfrac{M(V_{dc} - V_{in}) - L_1 V_o}{L_t^2}t_\phi - \\ \dfrac{-MV_{in} + L_1 V_o}{L_t^2}\dfrac{T_s}{2} \end{cases} \tag{70}$$

Since the left-hand side terms of the equations given in (70) are the same, the right-hand side terms must be equal. After some mathematical manipulation, $n_\phi$ is derived as $$n_\phi = \frac{nL_t^2(V_{dc} - 2nV_o) - 2L_s(L_1 V_o - MV_{in})}{4V_{dc}(ML_s + nL_t^2)}. \tag{71}$$

According to FIG. 17, $t_f$ is the time duration of Mode 6 in which $i_{L1}$ linearly reaches zero. It can be calculated by evaluating equation (63) at $t=T_s/2+t_\phi+t_f$. In other words, $t_f$ is obtained from the following equation:

$$i_{L1,4}\left(\frac{T_s}{2} + t_\phi + t_f\right) = 0 \tag{72}$$

From equation (72), $n_f$ is achieved as $$n_f = \frac{1}{2}\frac{L_2 V_{in} - MV_o}{L_2(V_{dc} - V_{in}) - MV_o} - n_\phi \tag{73}$$

where $n_\phi$ is given in equation (71).

The design procedure of the converter 122DD is now described in detail. The procedure is based on the theoretical analysis described above. According to the waveform of $i_{L1}$ shown in FIG. 17, as the time duration of Mode 7 (in which $i_{L1}=0$) approaches zero, or equivalently, $n_\phi+n_f$ approaches 0.5, peak value of the input current for a given averaged current is further reduced which results in lower RMS value. Additionally, transferring the maximum possible power directly through the coupled inductor minimizes the amount of power processed by the power switches. Thus, it is desirable to design the proposed converter such that it achieves the maximum possible direct power transfer with $n_\phi+n_f$ close to 0.5.

To simplify the analysis, a new parameter is defined as $$x = M/L_2 \tag{74}$$

Using this definition, equations (50), (73), and (66) can be rewritten as $$P_{DPT} = \frac{V_o L_2}{2f_s L_t^2}\{xV_{in}[0.25 + n_\phi - n_f - (n_\phi + n_f)^2] + \tag{75}$$

$$xV_{dc}(n_f^2 - n_\phi^2 + 2n_\phi n_f) - x^2 V_o(0.5 - n_\phi - n_f)^2\}$$

$$n_\phi + n_f = \frac{1}{2}\frac{V_{in} - xV_o}{V_{dc} - V_{in} - xV_o} \tag{76}$$

$$I_{in} = \frac{L_2}{2f_s L_t^2}\{V_{in}(0.5 + n_\phi + n_f)^2 - \tag{77}$$

$$V_{dc}(n_\phi + n_f)^2 + xV_o[(n_\phi + n_f)^2 + n_\phi - n_f - 0.25]\}.$$

From equation (76), the parameter x is derived as $$x = \frac{0.5 V_{in} - (n_\phi + n_f)(V_{dc} - V_{in})}{(0.5 - n_\phi - n_f)V_o}. \tag{78}$$

Since x is the ratio of two inductances ($M/L_2$), it must be positive. According to (78), it is observed that the denominator is positive. Thus, its numerator must be positive as well. This results in the following equation:

$$V_{dc} < \frac{0.5 + n_\phi + n_f}{n_\phi + n_f} V_{in} \tag{79}$$

This equation imposes a maximum limit on choosing the DC bus voltage. On the other hand, according to equations (75) and (77), the normalized direct power transferred through the coupled inductor $P_{DPT,n}$ is derived as $$P_{DPT,n} = \frac{P_{DPT}}{P_o} = \frac{V_o}{V_{in}} \frac{xV_{in}[0.25 + n_\phi - n_f - (n_\phi + n_f)^2] + xV_{dc}(n_f^2 - n_\phi^2 + 2n_\phi n_f) - x^2 V_o(0.5 - n_\phi - n_f)^2}{V_{in}(0.5 + n_\phi + n_f)^2 + xV_o[(n_\phi + n_f)^2 + n_\phi - n_f - 0.25] - V_{dc}(n_\phi + n_f)^2} \quad (80)$$

As the variation intervals of the parameters $n_\phi$ and $n_f$ are limited to $0<n_\phi$, $n_f<0.5$ under the condition $n_\phi+n_f<0.5$, one may obtain the normalized direct power transferred in terms of different values of $n_\phi$ and $n_f$ using equations (78) and (80). Among all different combinations of $n_\phi$, $n_f$, and $P_{DPT,n}$, the one that achieves the maximum direct power transfer, while $n_\phi+n_f$ close to 0.5, can be selected as the desired operating point.

The ratio of $L_2/L_t^2$ can be calculated using equation (77) as $$\frac{L_2}{L_t^2} = (2f_s I_{in})/\{V_{in}(0.5 + n_\phi + n_f)^2 + xV_o[(n_\phi + n_f)^2 + n_\phi - n_f - 0.25] - V_{dc}(n_\phi + n_f)^2\}. \quad (81)$$

For a coupled inductor, the mutual inductance is defined as $$M = k\sqrt{L_1 L_2}. \quad (82)$$

The ratio of L1=L2 is obtained using (74) and (82) as $$L_1/L_2 = (x/k)^2. \quad (83)$$

Using (5) and (74), $L_2$ can be derived as $$L_2 = \frac{L_t^2/L_2}{(L_1/L_2) - x^2}. \quad (84)$$

Substituting equations (81) and (83) into equation (84), the following equation is obtained:

$$L_2 = \frac{k^2}{2f_s I_{in} x^2 (1 - k^2)} \quad (85)$$
$$\{V_{in}(0.5 + n_\phi + n_f)^2 + xV_o[(n_\phi + n_f)^2 + n_\phi - n_f - 0.25] - V_{dc}(n_\phi + n_f)^2\}$$

Having the parameters $n_\phi$, $n_f$, and x determined, the inductance $L_2$ is designed using equation (85). Then, the inductances M and $L_1$ are determined according to the values of $M/L_2$ and $L_1/L_2$, respectively.

From equation (33), the ratio of $L_s/n$ can be written as $$\frac{L_s}{n} = \frac{V_{dc} V_o}{2P_{tran} f_s} n_\phi (1 - 2n_\phi). \quad (86)$$

where $P_{tran}=P_o-P_{DPT}$ and $P_{DPT}$ is given by equation (80). After some mathematical manipulation, equation (71) is rewritten as $$n = \frac{L_t^2 V_{dc} - 2\left(\frac{L_s}{n}\right)(L_1 V_o - MV_{in}) - 4n_\phi V_{dc}\left(M\frac{L_s}{n} + L_t^2\right)}{2V_o L_t^2} \quad (87)$$

By substituting $L_s/n$ given in equations (86) into equation (87), the desired turns ratio of the transformer is designed. The inductance $L_s$ is then obtained based on the values of $L_s/n$ and n.

In this section, the converter 122DD is first designed using the above-described guidelines for a specific application, charging a 48 V battery from a 190 V DC grid with the nominal power of 450 W. Then, it is simulated in OrCAD PSPICE environment offered by Cadence Design Systems of San Jose, California, USA, to verify the theoretical analysis. As mentioned above, output power of the converter 122DD is inversely proportional to the switching frequency. Hence, it is designed such that the minimum frequency (at the nominal power) is 140 kHz.

The first step in the design of this converter is to choose a proper DC bus voltage using equation (79). As mentioned earlier, it is desired to achieve $n_\phi+n_f$ close to 0.5. On the other hand, to ensure DCM operation of the proposed converter, $n_\phi+n_f$ should be sufficiently less than 0.5. Considering $n_\phi+n_f$ equal to 0.4, equation (79) implies that $V_{dc}$ should be less than 427.5V. Therefore, $V_{dc}$ is selected to be 400V.

Figure 19:
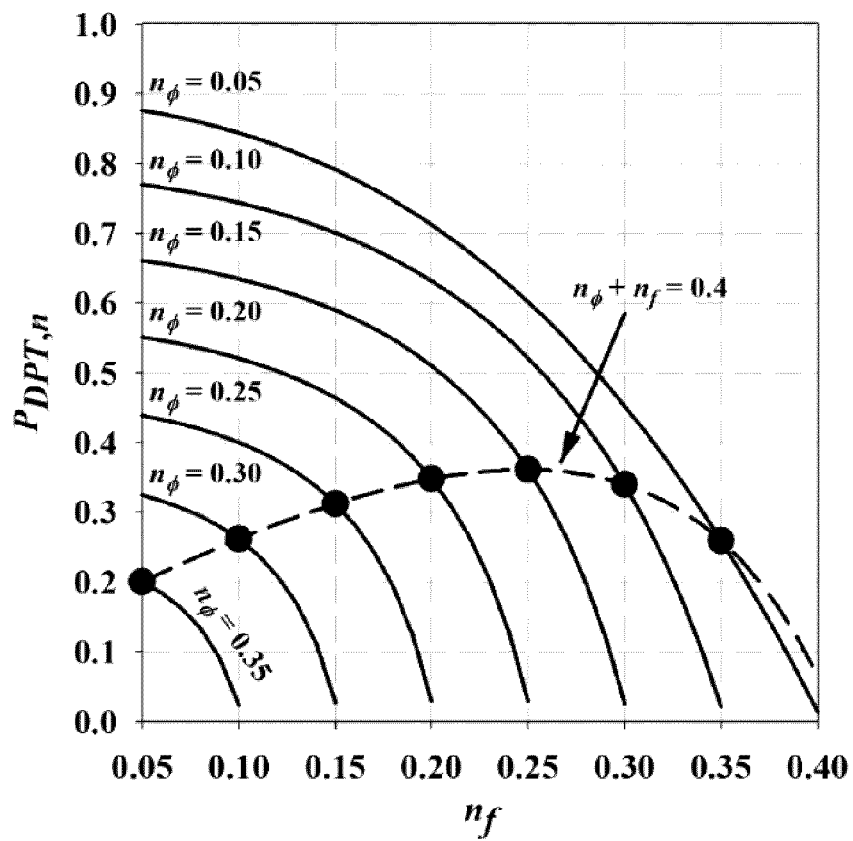
FIG. 19 shows the plot of a parameter $P_{DPT,n}$ of the DC/DC converter shown in FIG. 16A in terms of different values of $n_\phi$ and $n_f$ of the DC/DC converter shown in FIG. 16A.

The next step is to calculate the normalized direct power transferred $P_{DPT,n}$ in terms of different values of $n_\phi$ and $n_f$ using equations (78) and (80) as plotted in FIG. 19 which shows the plot of $P_{DPT,n}$ in terms of different $n_f$ in the range of $0<n_f<0.5-n_\phi$ for several values of $n_\phi$ equal to 0.05, 0.10, 0.15, 0.20, 0.25, 0.30, and 0.35. Also, the dashed line illustrates the curve of $P_{DPT,n}$ in terms of different $n_\phi$ and $n_f$ that satisfy $n_\phi+n_f=0.4$. According to FIG. 19, $P_{DPT,n}$ reaches its maximum value of 36% at $n_\phi=0.15$ and $n_f=0.25$. However, with $n_\phi=0.1$ and $n_f=0.3$, $P_{DPT,n}$ is 34% which is near the maximum value. This results in $P_{DPT}=153$ W and $P_{tran}=297$ W. In other words, around 150 W is transferred to the output directly through the coupled inductor and around 300 W through the transformer. Having $n_\phi$ and $n_f$ determined, x is obtained equal to 2.29 using equation (78).

Figure 20:
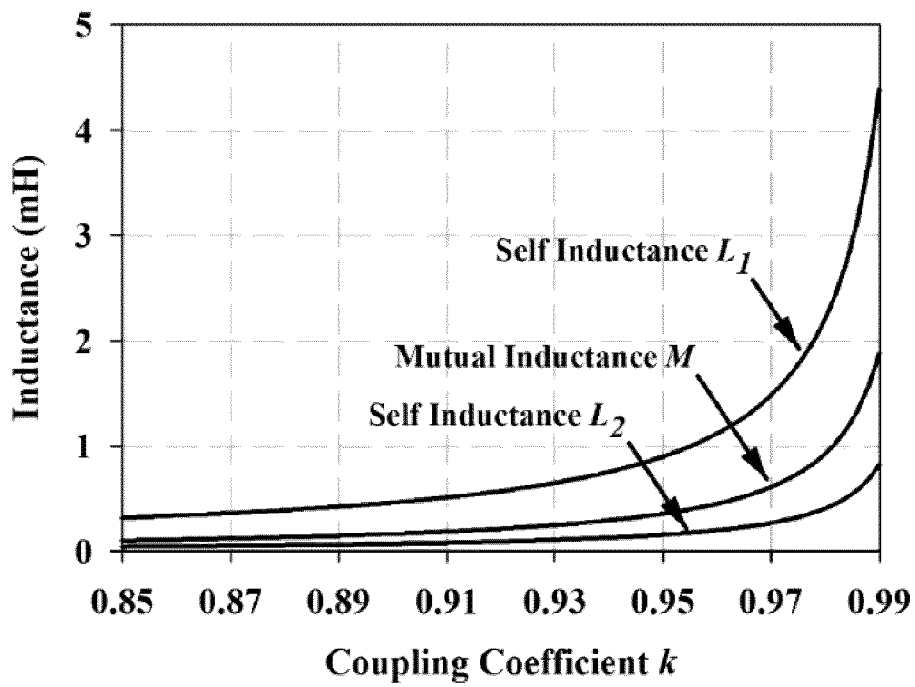
FIG. 20 shows the plot of the inductances $L_1$, $L_2$, and M of the DC/DC converter shown in FIG. 16A in terms of the coupling coefficient k.

According to equations (82)-(85), designing the inductances $L_1$, $L_2$, and M is dependent on the value of the coupling coefficient k. FIG. 20 demonstrates how this parameter affects the design of these inductances. As observed, all the inductances $L_1$, $L_2$, and M tend towards large values as k approaches unity. Therefore, with a sufficiently small coupling coefficient, it is possible to use small inductances. According to FIG. 20, having a coupling coefficient in the range of 0.9<k<0.95 results in reasonable values for the inductances. Moreover, achieving this range for the coupling coefficient does not complicate implementing the coupled inductor. Considering k=0.93, equation (85) results in $L_2=107$ µH. Consequently, M and $L_1$ are determined as 244 µH and 647 µH, respectively, based on the values of $M/L_2$ and $L_1/L_2$ given in equations (74) and (83). Using (86) and (87), the series inductance and the transformer turns ratio are obtained as $L_s=43$ µH and n=2.4.

The converter 122DD is simulated with the parameters listed in Table I below:

TABLE I

LIST OF THE PARAMETERS USED IN SIMULATION

| Parameter | Value |
|---|---|
| Input voltage $V_{in}$ | 190 V |
| Output volage $V_o$ | 48 V |
| Output power $P_o$ | 450 W |
| Switching frequency $f_s$ | 140 kHz |
| Coupled inductor $L_1$, $L_2$, M | 650 µH. |
| | 110 µH. |
| | 250 µH |
| Transformer turns ratio n | 2.8 |
| Series inductor $L_s$ | 45 µH |
| DC bus capacitors $C_1$, $C_2$ | 10 µF |
| Snubber capacitors $C_{s1}$, $C_{s2}$ | 680 pF |
| Output capacitor $C_o$ | 22 µF |

Figure 21A:
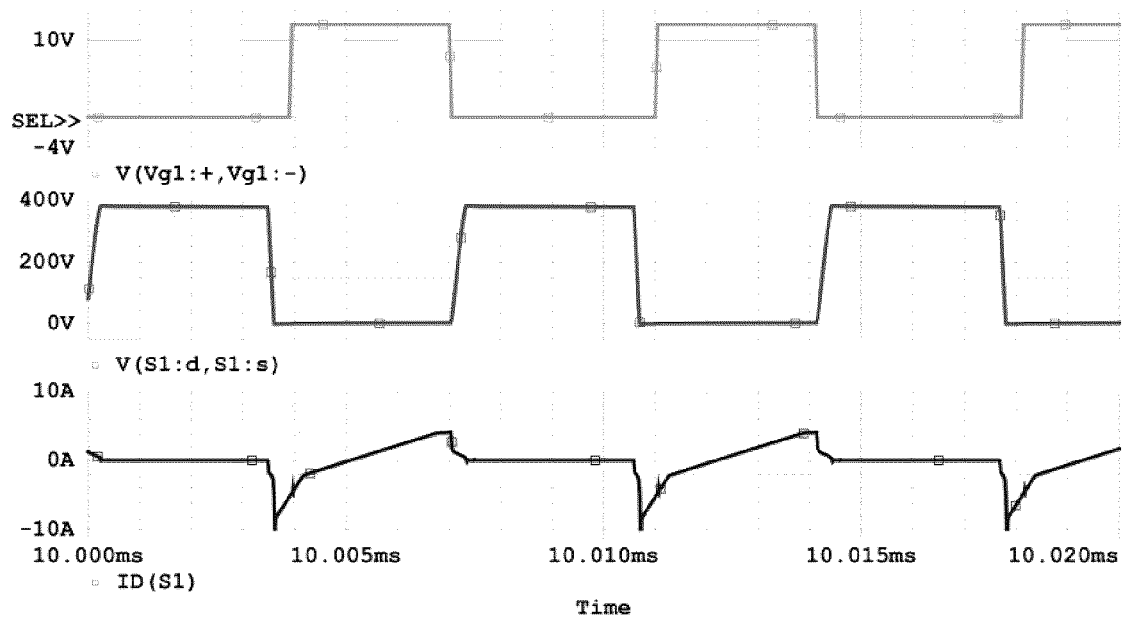
FIGS. 21A to 21F show the simulation results of the DC/DC converter shown in FIG. 16A at the nominal load, wherein FIG. 21A show the waveforms of the switch $S_1$.
Figure 21B:
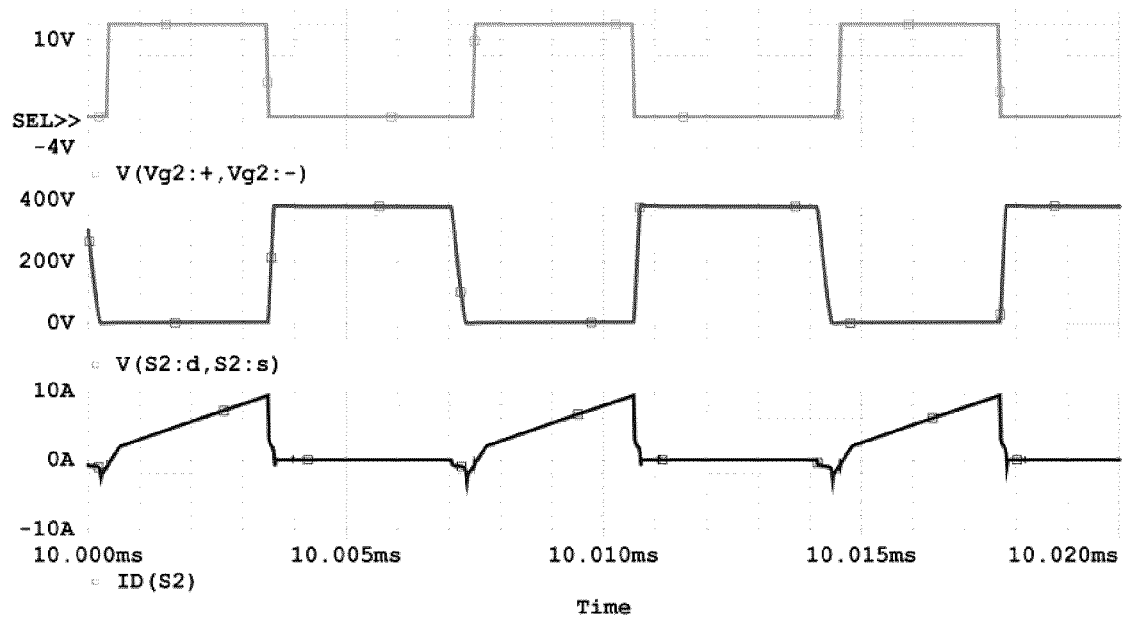
Figure 21C:
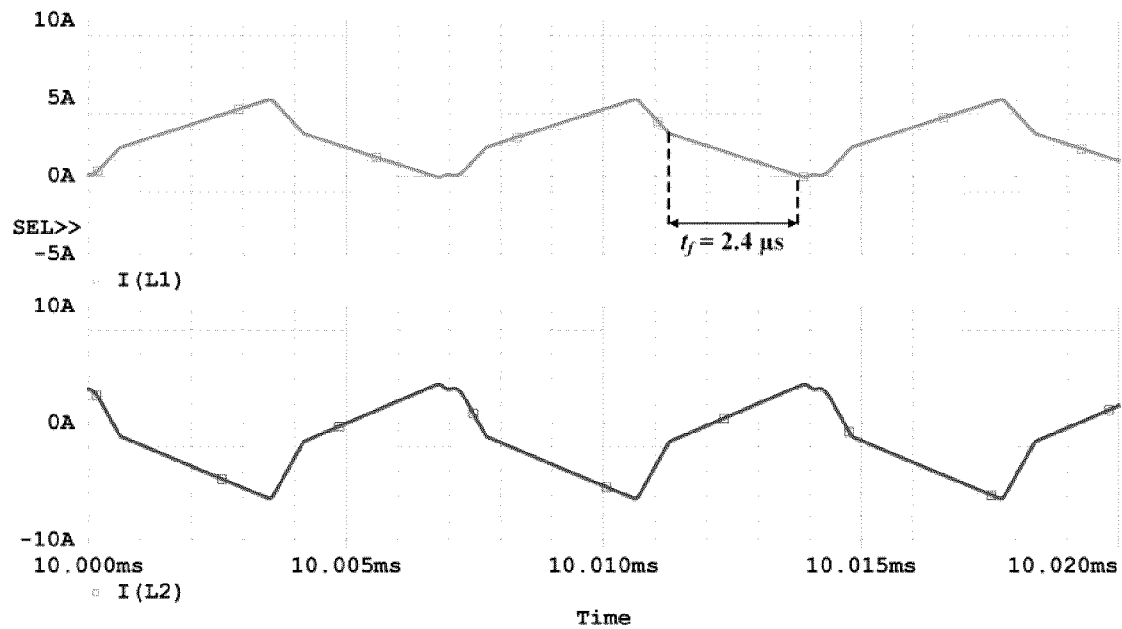
Figure 21D:
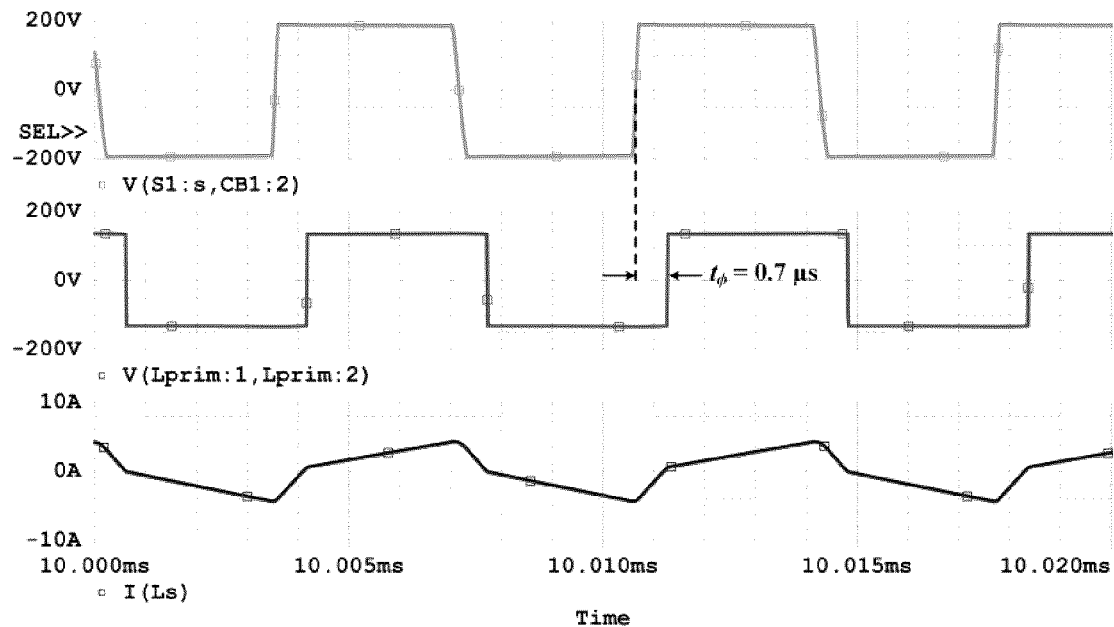
Figure 21E:
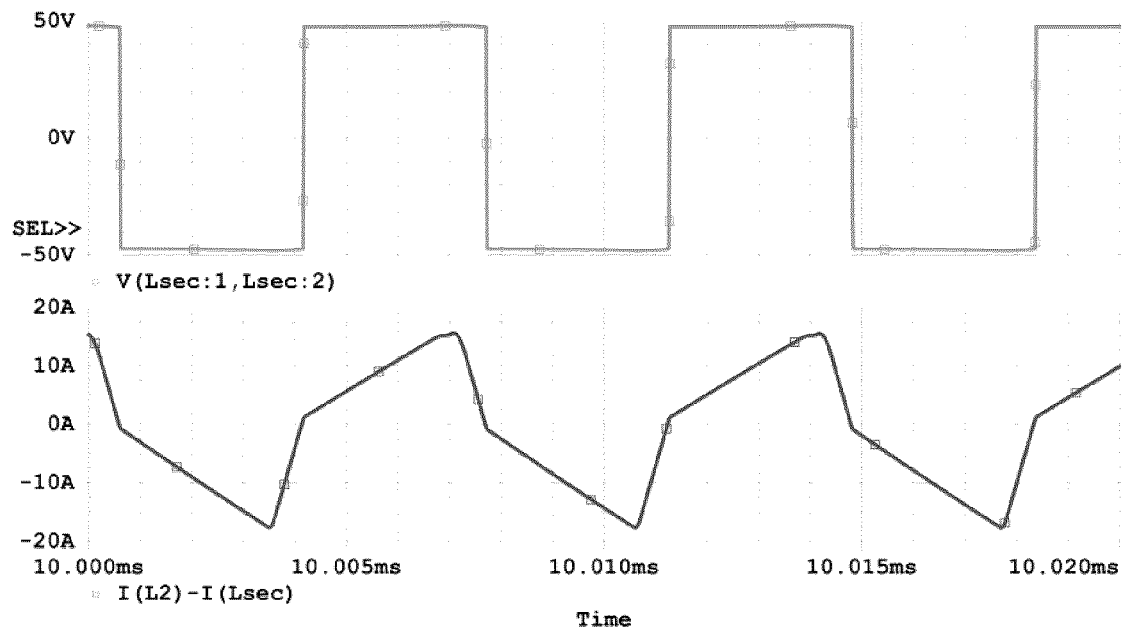
Figure 21F:
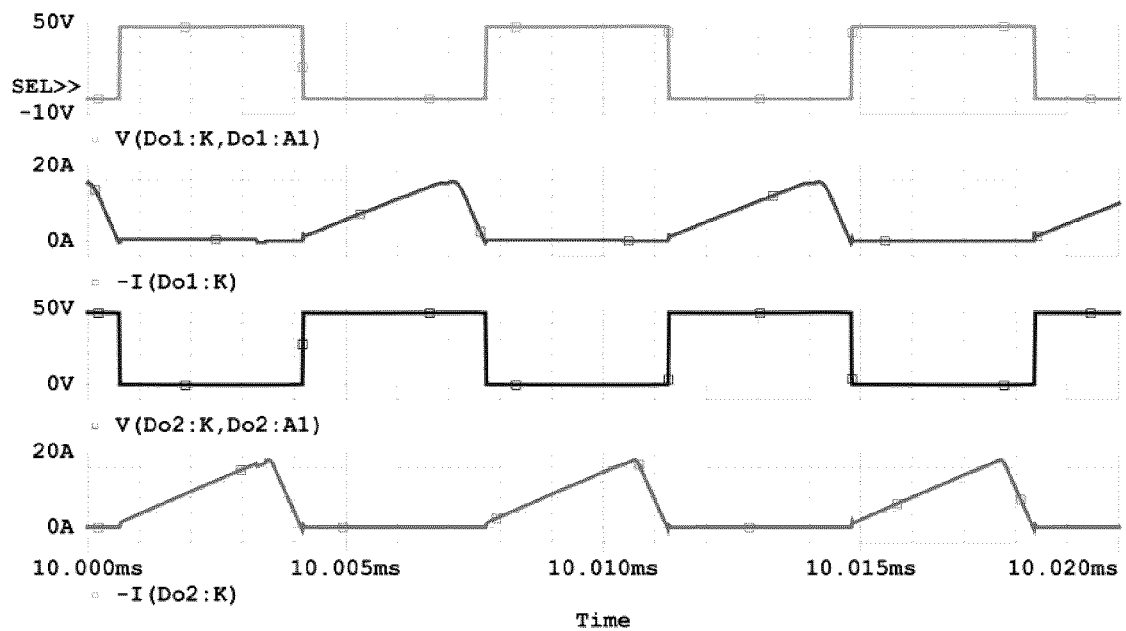

The waveforms of the converter 122DD are illustrated in FIGS. 21A to 21F. FIGS. 21A and 21B show the waveforms of the power switches $S_1$ and $S_2$, respectively. As observed, when one of the switches is turned OFF, the body diode of the other switch turns ON, thereby providing ZVS turn-on conditions. In addition, current-voltage overlap at turn-off instants is sufficiently small for both the switches. It is also observed that the DC bus voltage is near 400V. FIG. 21C illustrates the currents $i_{L1}$ and $i_{L2}$ flowing through the primary and secondary windings of the coupled inductor. Pseudo-CCM operation of the input current can be observed. Moreover, $t_f$ is equal to 2.4 µs which is 34% of the switching cycle. In other words, the parameter $n_f$ is slightly greater than the desired value of 0.3. Voltage waveforms of the inverter output and the transformer primary winding as well as current waveform of the series inductor are illustrated in FIG. 21D. As observed, the square voltages have a 0.7 µs delay, almost 10% of the switching cycle. In other words, the parameter n is approximately equal to the designed value (0.1). FIG. 21E shows the voltage waveform of the transformer secondary winding $v_{sec}$ and the current waveform flowing through the output bridge diodes $i_r$. As explained earlier, direction of this current determines the polarity of the voltage applied to the transformer secondary winding. According to FIG. 21F showing the current and voltage waveforms of D1 and D2, the output diodes turn ON and OFF under ZCS conditions.

Figure 22:
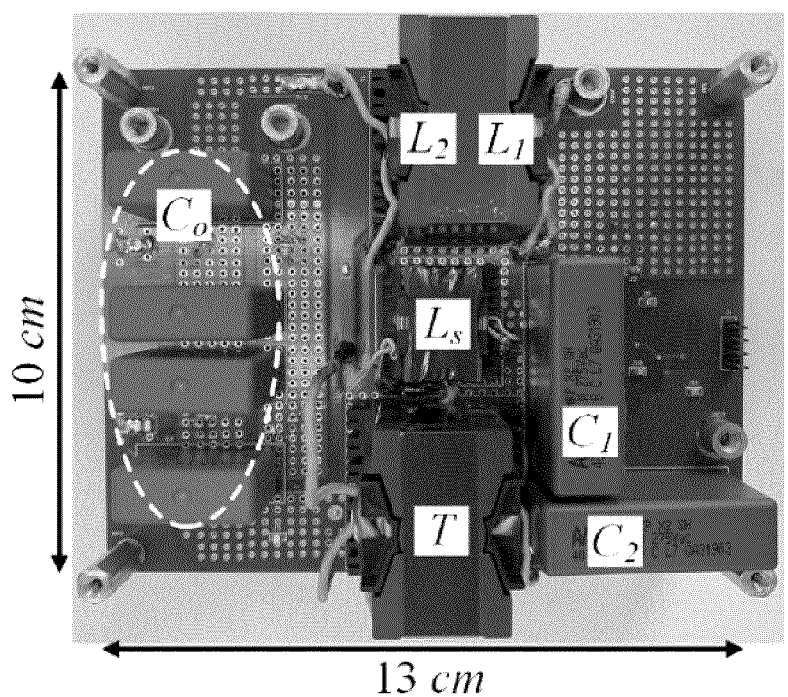
FIG. 22 is a photograph of the prototype of the DC/DC converter shown in FIG. 16A.
Figure 23A:
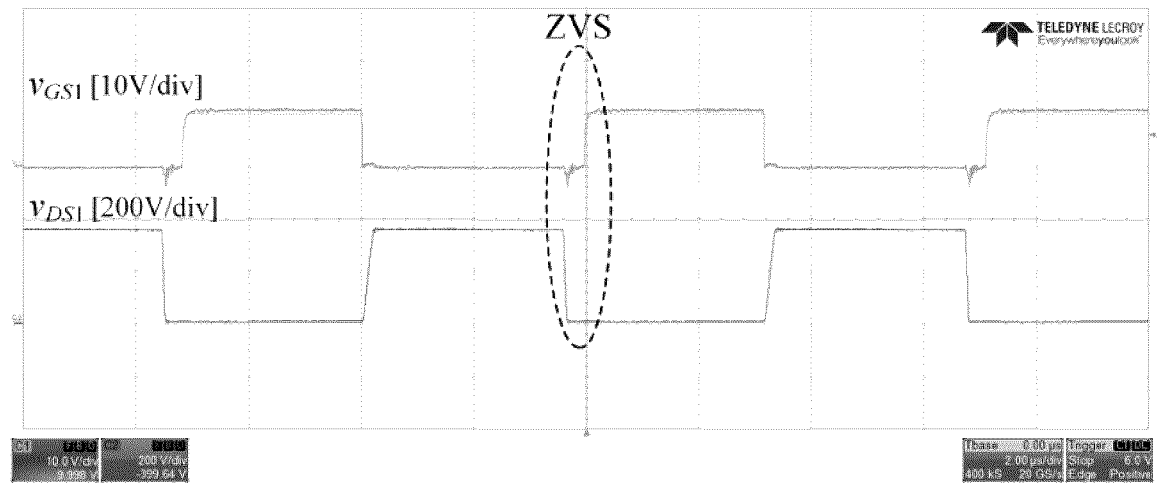
FIGS. 23A to 23F show the experimental waveforms obtained from the prototype shown in FIG. 22 under the full-load condition.
Figure 23B:
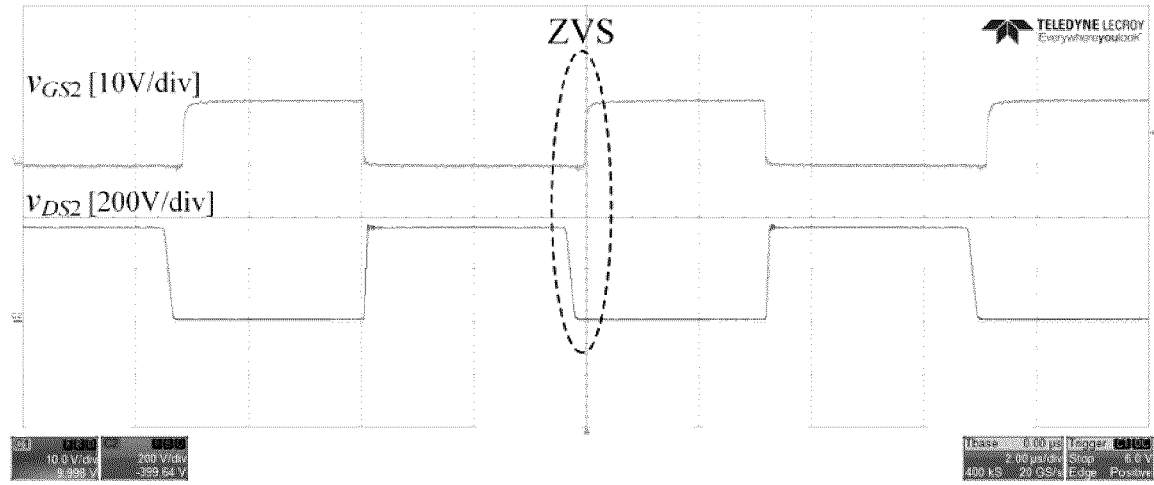
Figure 23C:
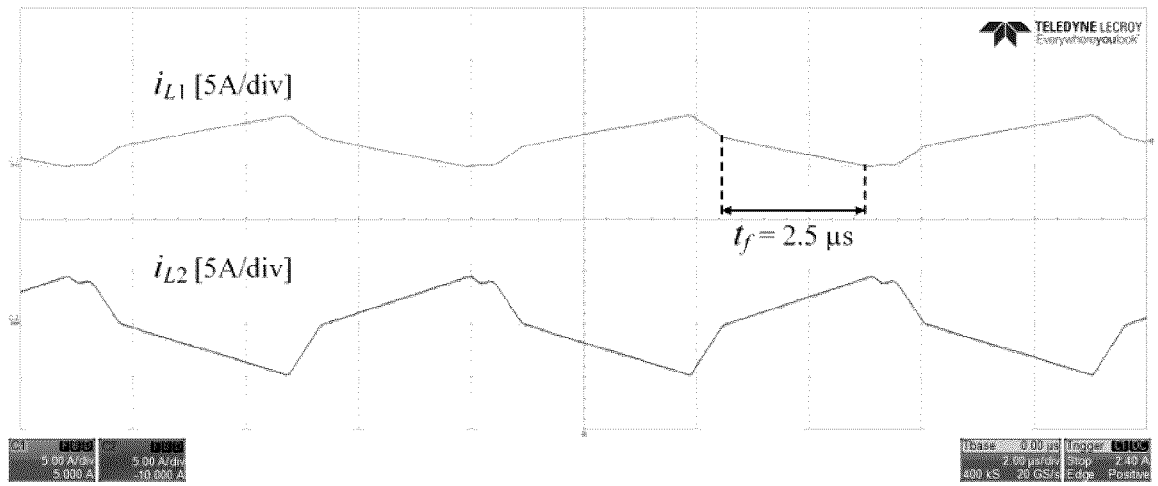
Figure 23D:
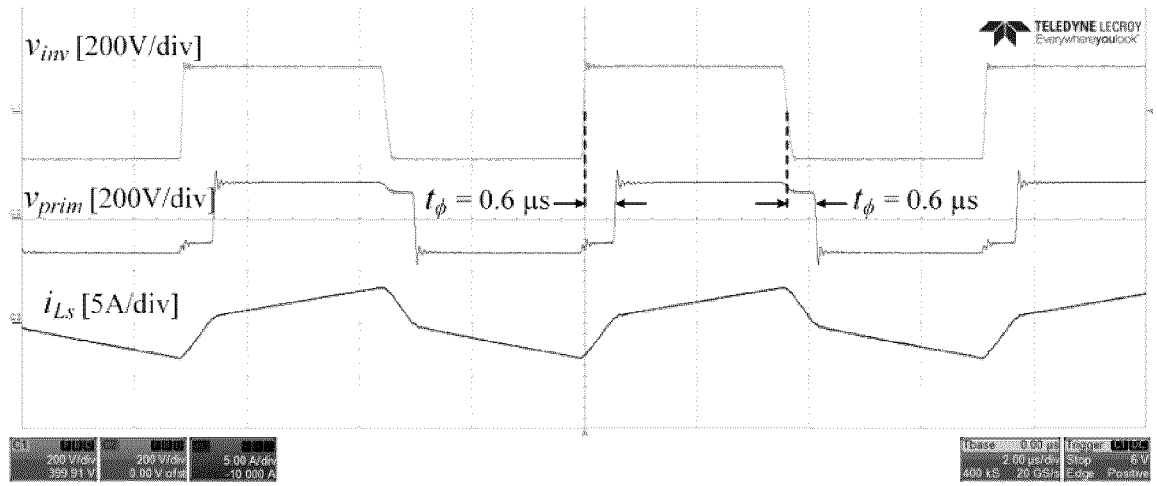
Figure 23E:
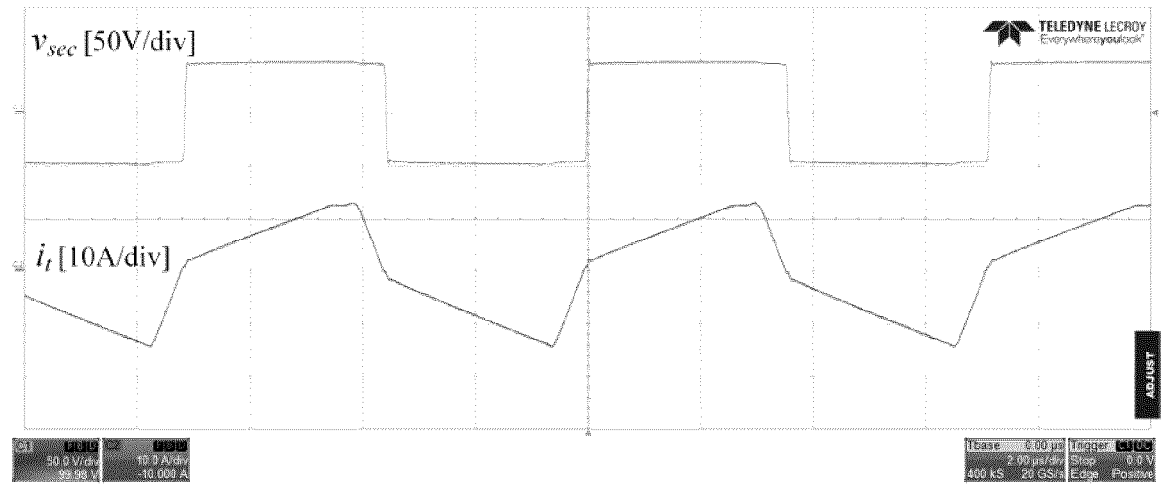
Figure 23F:
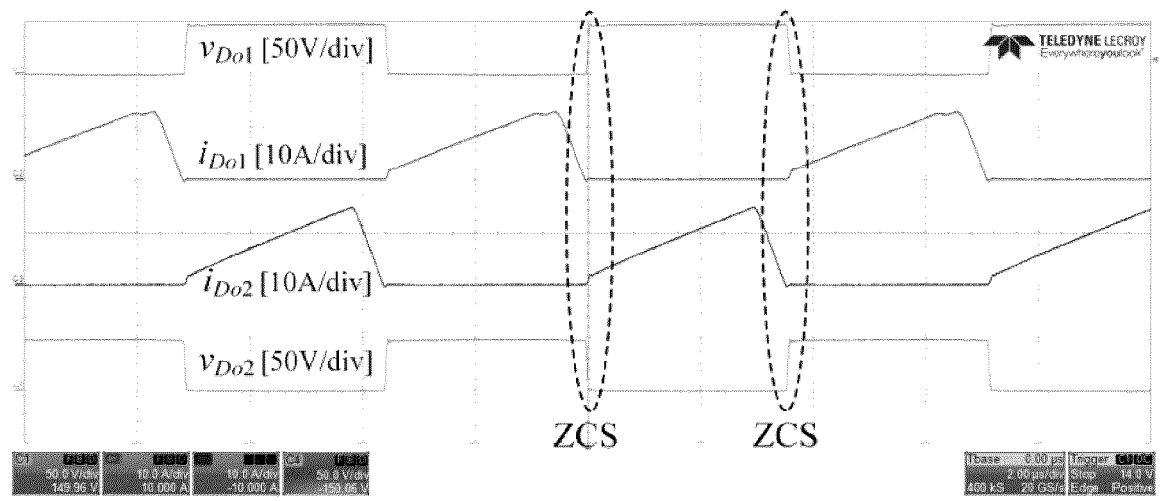

To examine the performance of the converter 122DD in practice, a 450 W laboratory prototype is implemented for the given application and its experimental results are presented. The components used in the prototype are listed in Table II below and its photograph is depicted in FIG. 22.

TABLE II

LIST OF THE COMPONENTS USED IN THE IMPLEMENTED PROTOTYPE

| Component | Value or Part Number |
|---|---|
| Power switches $S_1$ and $S_2$ | IPB60R280P7 |
| Input diode $D_{in}$ | TPMR10G |
| Output diodes $D_1$ – $D_4$ | VB30100S-E3 |
| Coupled inductor $L_1$, $L_2$, M | 620 µH. |
| | 120 µH. |
| | 254 µH |
| Transformer turns ratio n | 2.8 |
| Series inductor Ls | 40 µH |
| DC bus capacitors $C_1$, $C_2$ | 10 µF |

TABLE II-continued

LIST OF THE COMPONENTS USED IN THE IMPLEMENTED PROTOTYPE

| Component | Value or Part Number |
|---|---|
| Snubber capacitors $C_{s1}$, $C_{s2}$ | 680 pF |
| Output capacitor $C_o$ | 4 × 4.7 µF |

FIGS. 23A to 23F show the experimental waveforms obtained from the implemented prototype under the full-load condition. These experimental waveforms are in good accordance with the theoretical and simulation waveforms illustrated in FIG. 17 and FIGS. 21A to 21F, respectively. To examine the performance of the converter 122DD under different load conditions, the waveforms obtained from the implemented prototype at 50% of the nominal power are also illustrated in FIGS. 24A to 24F. In order to reduce the power delivered to the output to half the rated power, the switching frequency is increased to 280 kHz.

Figure 24A:
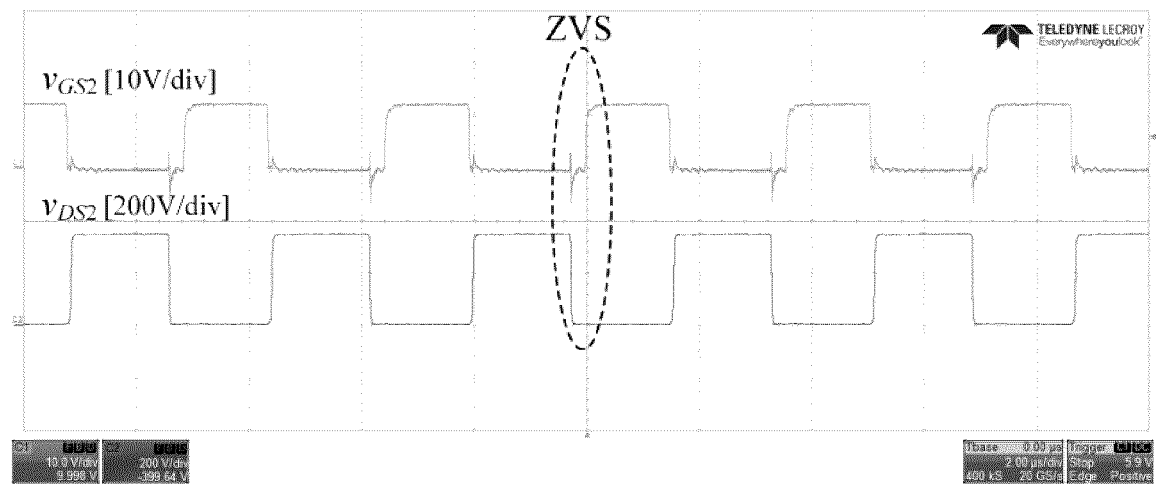
FIGS. 24A to 24F show the experimental waveforms obtained from the prototype shown in FIG. 22 at 50% of the nominal power.
Figure 24B:
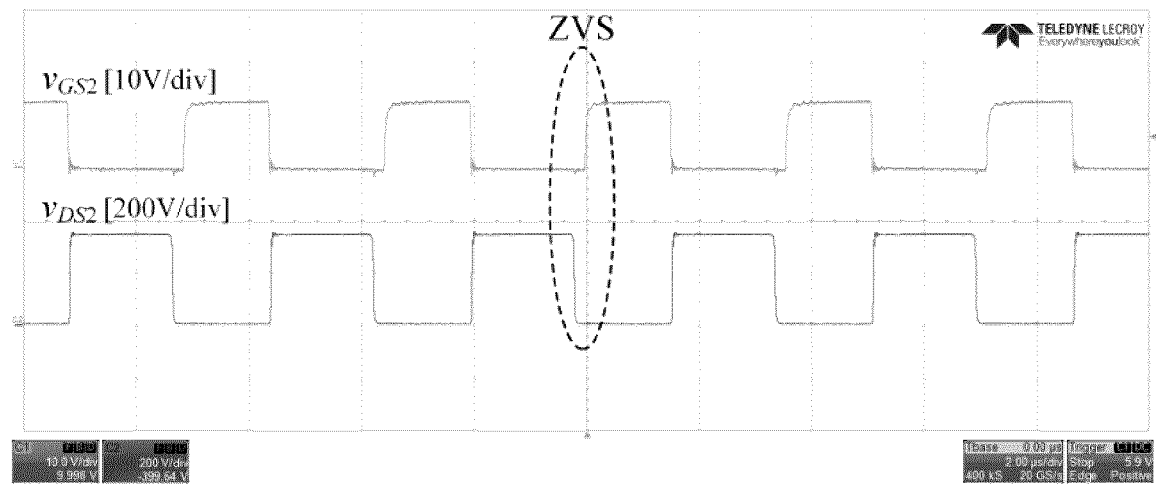
Figure 24C:
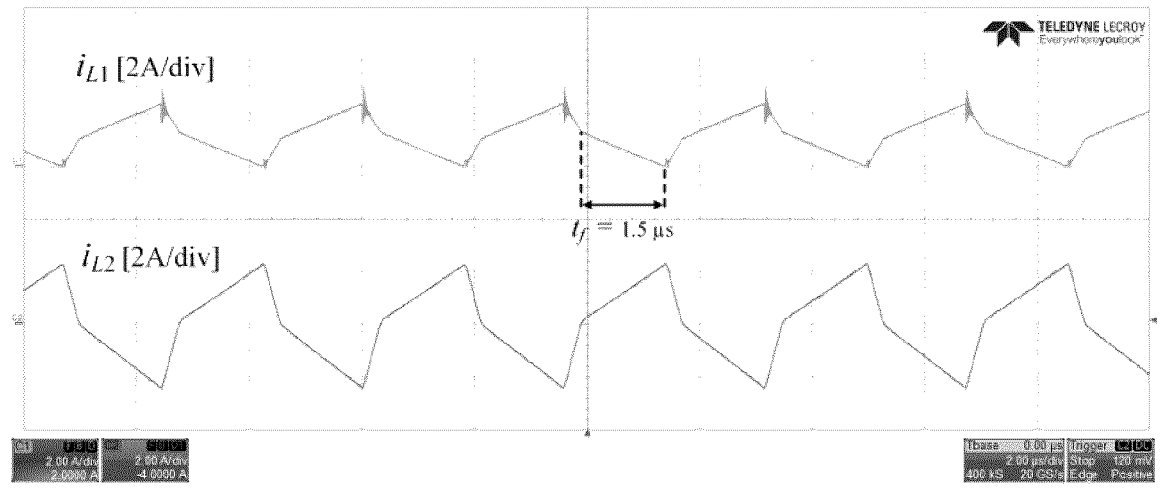
Figure 24D:
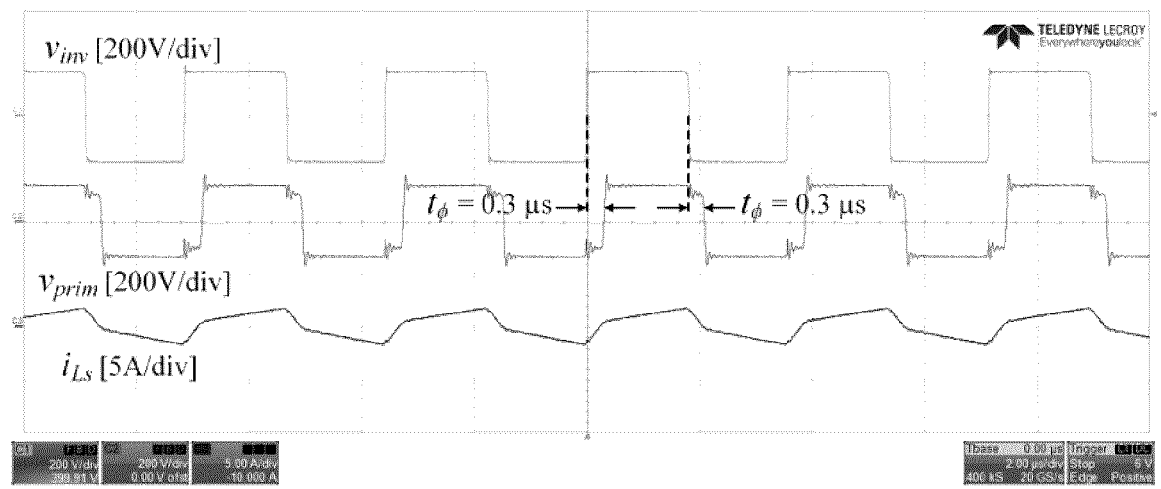
Figure 24E:
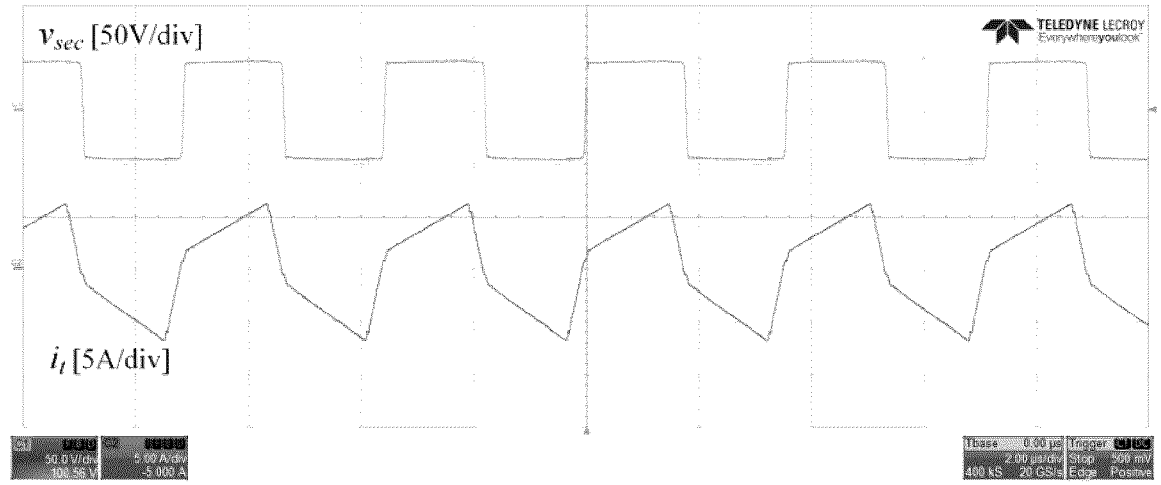
Figure 24F:
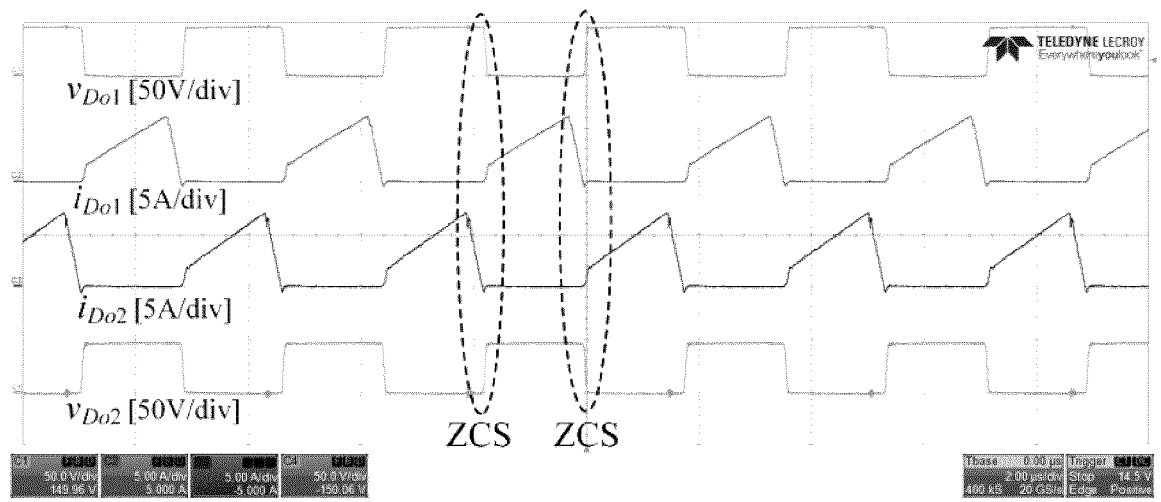

According to FIGS. 24A and 24B showing the voltage waveforms of $S_1$ and $S_2$, the power switches operate with ZVS characteristics. In addition, it is observed that the DC bus voltage is still the same as the rated power. In other words, the proposed converter benefits from a nearly constant DC bus voltage under different load conditions due to the pseudo-CCM operation. From FIGS. 24C and 24D, it is observed that $t_f$ is 1.5 µs ($n_f$=0.4), slightly greater than its value at full-load, while $t_\phi$ is 0.3 µs ($n_\phi$=0.1), equal to the desired value. In this case, $n_\phi + n_f$ is near 0.5 or, equivalently, time duration of Mode 7 is sufficiently short. This results in low peak and RMS values for the input current. In other words, the proposed converter keeps the pseudo-CCM input current waveform under different load conditions.

Figure 25:
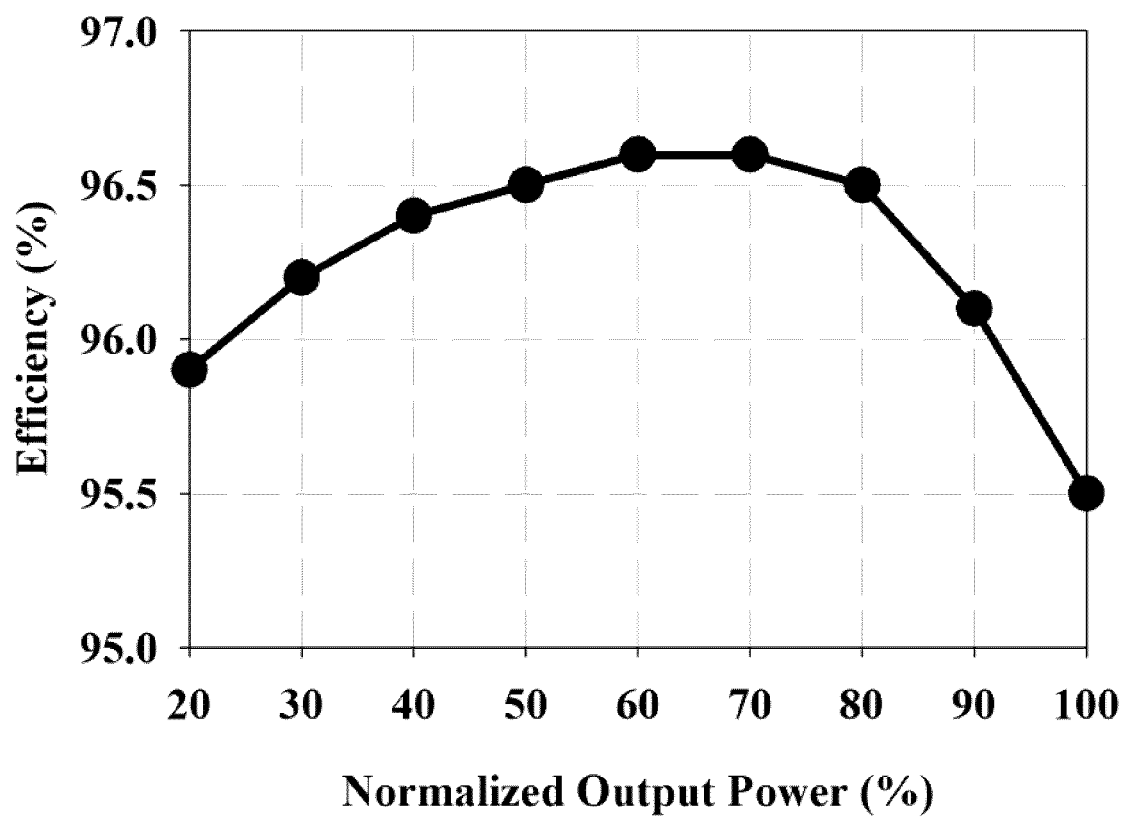
FIG. 25 shows the efficiency measured from the prototype shown in FIG. 22 from 20% to 100% of the rated power.

FIG. 25 shows the efficiency measured from the implemented prototype from 20% to 100% of the rated power. As observed, with reducing power from full-load to light-load, efficiency first rises from 95.4% (at the nominal power) to a peak value of 96.7% (at 70% of the nominal power) and, then, it starts decreasing. As mentioned earlier, the output power reduces with the switching frequency in the proposed converter. Consequently, decreasing the output power results in lower conduction losses, however, higher switching losses. It is worth mentioning that switching losses are negligible compared to conduction losses in low frequencies due to the ZVS performance of the proposed converter. However, as the output power decreases below 70% of the rated power, switching losses become considerable and, consequently, efficiency starts degrading.

The isolated DC/DC circuit topology 122DD disclosed herein may demonstrate high performance for a wide range of operating conditions. This isolated DC/DC converter 122DD is well suited for DC micro-grid applications where the converter 122DD may maintain the DC voltage level of a low-voltage bus within a desired range. The converter 122DD may minimize both the conduction and switching losses. The power semiconductors on the primary side of the converter 122DD operate with ZVS characteristics while the output diodes operate with ZCS characteristics. One of the main features of the converter 122DD is the DPT which reduces the power processed by the power semiconductors and minimizes the conduction losses. A portion of the power may be transferred directly to the output thereby reducing the power ratings of the components and the costs. Another advantage of this structure is the pseudo-CCM operation for the input current. This feature reduces the peak and RMS values of the input current. Consequently, the conduction losses in this structure may be reduced significantly. Simulation and experimental results of a 450 W prototype confirm the superior performance of the proposed structure.

Figure 26:
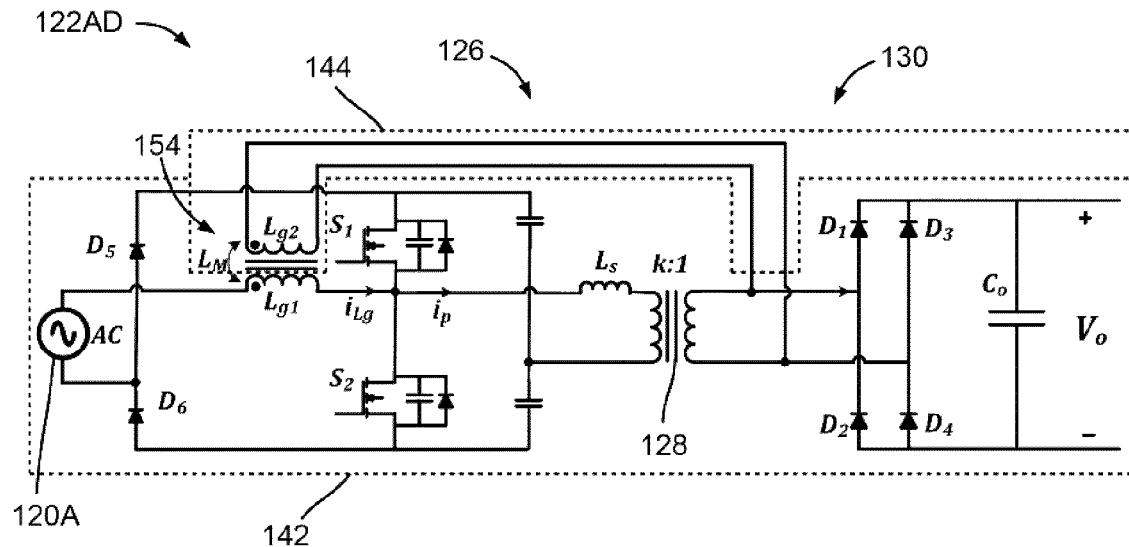
FIG. 26 is a schematic diagram of the circuitry of an AC/DC power-electronic converter shown in FIG. 15, according to some embodiments of this disclosure.

FIG. 26 shows the circuitry of an AC/DC power-electronic converter 122AD in some other embodiments. As shown, the power-electronic converter 122AD comprises a regular power-conversion circuitry 142 similar to that shown in FIG. 13 (the inductor $L_g$ in FIG. 13 is denoted $L_1$ in FIG. 26) which comprises a pair of MOSFETs $S_1$ and $S_2$ and a first transformer 128 for converting a first portion of DC power received from the AC power source 120A. The power-electronic converter 122AD also comprises a DPT channel 144 coupling to the inductor $L_1$ of the regular power-conversion circuitry 142 on the primary side 126 thereof via a coupling inductor $L_2$ thereby forming a second transformer 154 for transferring a second portion of DC power directly from the primary side 126 to the secondary side 130 thereby bypassing the MOSFETs $S_1$ and $S_2$ and the first transformer 128.

Figure 27:
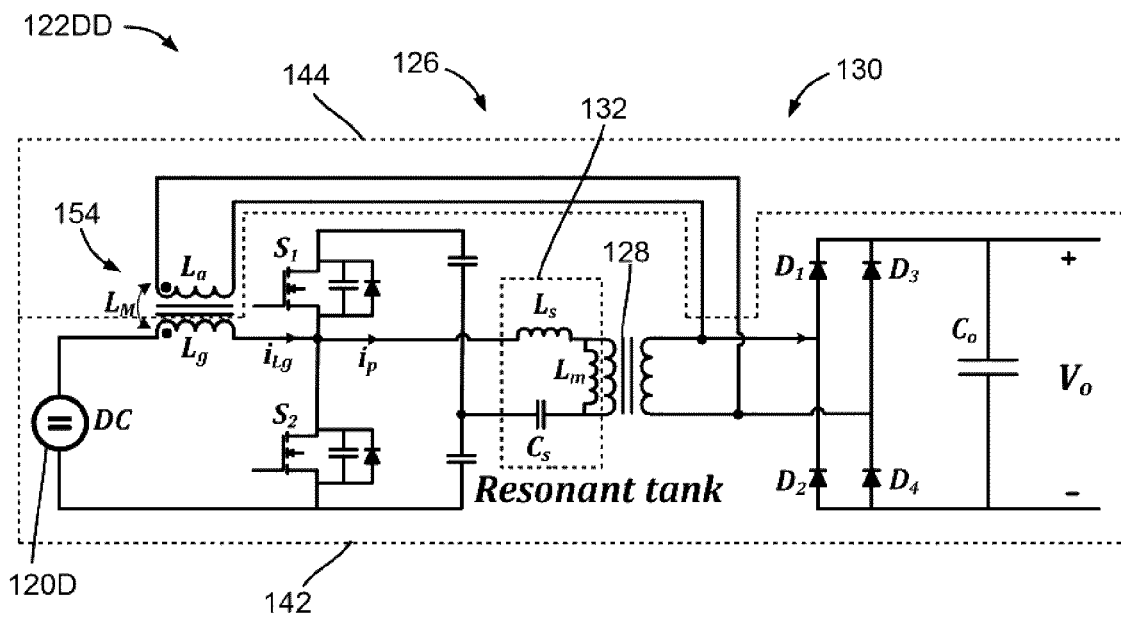
FIG. 27 is a schematic diagram of the circuitry of a DC/DC power-electronic converter shown in FIG. 15, according to some embodiments of this disclosure, the power-conversion circuitry thereof comprising a resonant tank.

FIG. 27 shows the circuitry of a DC/DC power-electronic converter 122DD in yet some other embodiments. As shown, the power-electronic converter 122DD comprises a regular power-conversion circuitry 142 which comprises a pair of MOSFETs $S_1$ and $S_2$ and a first transformer 128 for converting a first portion of DC power received from the DC power source 120D and a resonant tank 132 similar to that shown in FIG. 11 on the primary side thereof between the pair of MOSFETs $S_1$ and $S_2$ and the transformer 128 for providing nearly sinusoidal waveforms and providing soft switching to the transformer 128. The power-electronic converter 122DD also comprises a DPT channel 144 coupling to the inductor $L_g$ of the regular power-conversion circuitry 142 on the primary side 126 thereof via a coupling inductor $L_a$ thereby forming a second transformer 154 for transferring a second portion of DC power directly from the primary side 126 to the secondary side 130 thereby bypassing the MOSFETs $S_1$ and $S_2$ and the first transformer 128.

Figure 28:
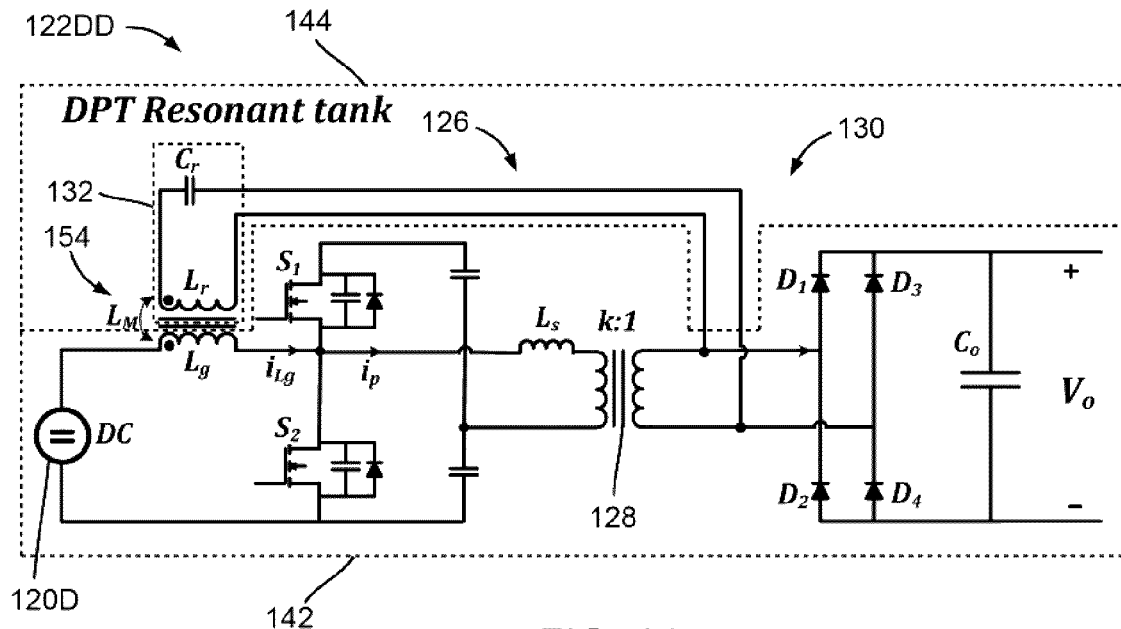
FIG. 28 is a schematic diagram of the circuitry of a DC/DC power-electronic converter shown in FIG. 15, according to some embodiments of this disclosure, the DPT channel thereof comprising a resonant tank.

FIG. 28 shows the circuitry of a DC/DC power-electronic converter 122DD in still another embodiment. The DC/DC power-electronic converter 122DD in this embodiment is similar to that shown in FIG. 27 except that in this embodiment, the DPT channel 144 comprises a resonant tank 132 while the regular power-conversion circuitry 142 does not comprise any resonant tank.

Figure 29:
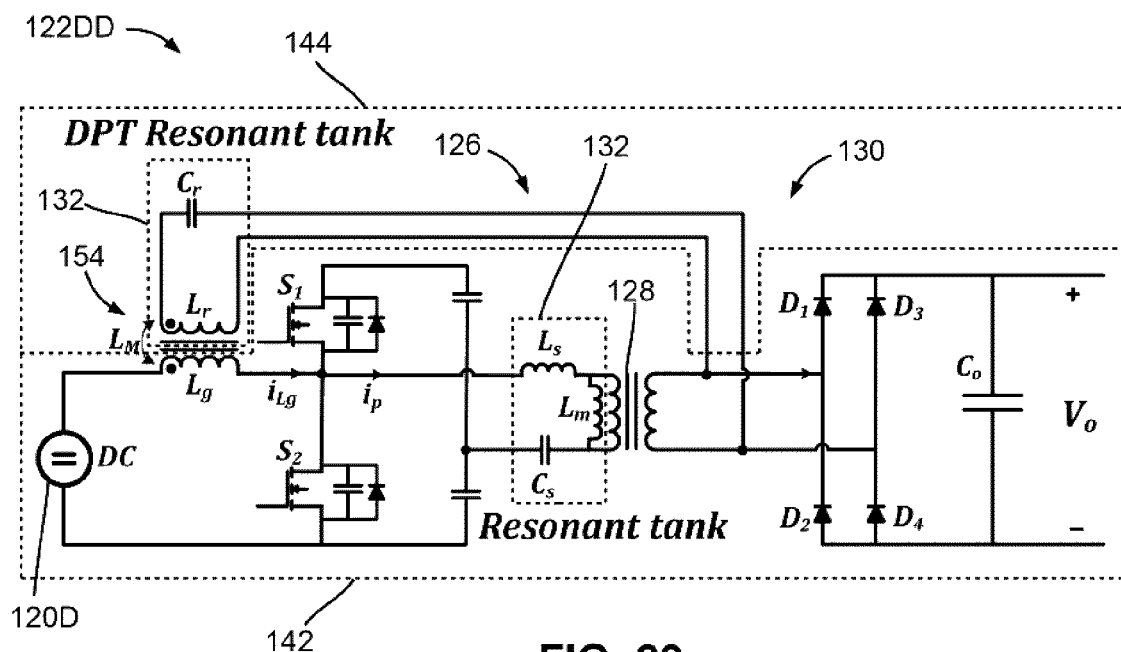
FIG. 29 is a schematic diagram of the circuitry of a DC/DC power-electronic converter shown in FIG. 15, according to some embodiments of this disclosure, each of the power-conversion circuitry and the DPT channel thereof comprising a resonant tank.

FIG. 29 shows the circuitry of a DC/DC power-electronic converter 122DD in another example. The DC/DC power-electronic converter 122DD in this embodiment is similar to that shown in FIG. 27 except that in this embodiment, each of the DPT channel 144 and the regular power-conversion circuitry 142 comprises a resonant tank 132.

The resonant tank 132 may also be used in other types of converters with DPT in a similar manner.

Figure 30:
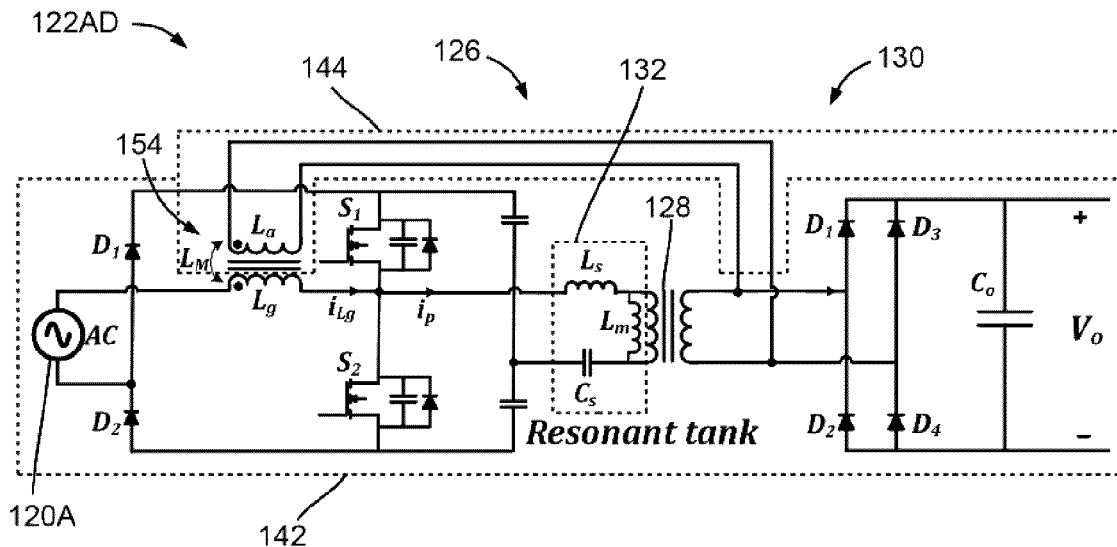
FIG. 30 is a schematic diagram of the circuitry of an AC/DC power-electronic converter shown in FIG. 15, according to some embodiments of this disclosure, the power-conversion circuitry thereof comprising a resonant tank.

For example, FIG. 30 shows the circuitry of an AC/DC power-electronic converter 122AD in one embodiment. The AC/DC power-electronic converter 122AD is similar to that shown in FIG. 26 except that in this embodiment, the regular power-conversion circuitry 142 comprises a resonant tank 132 while the DPT channel 144 does not comprise any resonant tank.

Figure 31:
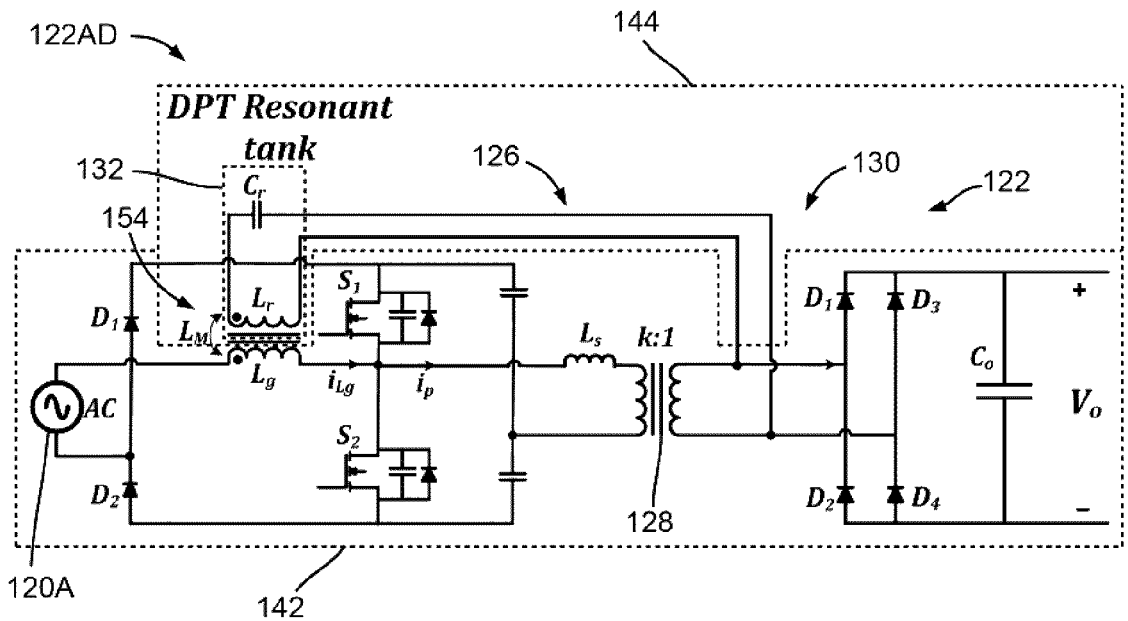
FIG. 31 is a schematic diagram of the circuitry of an AC/DC power-electronic converter shown in FIG. 15, according to some embodiments of this disclosure, the DPT channel thereof comprising a resonant tank.

FIG. 31 shows the circuitry of an AC/DC power-electronic converter 122AD in another embodiment. The AC/DC power-electronic converter 122AD is similar to that shown in FIG. 26 except that in this embodiment, the DPT channel 144 comprises a resonant tank 132 while the regular power-conversion circuitry 142 does not comprise any resonant tank.

Figure 32:
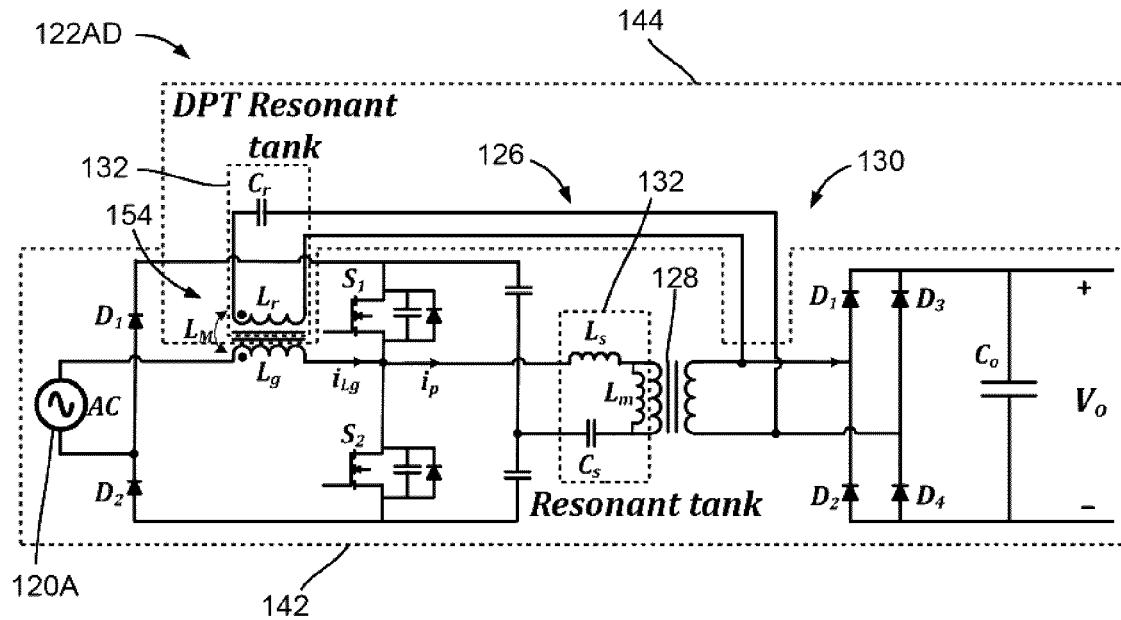
FIG. 32 is a schematic diagram of the circuitry of an AC/DC power-electronic converter shown in FIG. 15, according to some embodiments of this disclosure, each of the power-conversion circuitry and the DPT channel thereof comprising a resonant tank.

FIG. 32 shows the circuitry of an AC/DC power-electronic converter 122AD in yet another embodiment. The AC/DC power-electronic converter 122AD is similar to that shown in FIG. 26 except that in this embodiment, each of the regular power-conversion circuitry 142 and the DPT channel 144 comprises a resonant tank 132.

Figure 33:
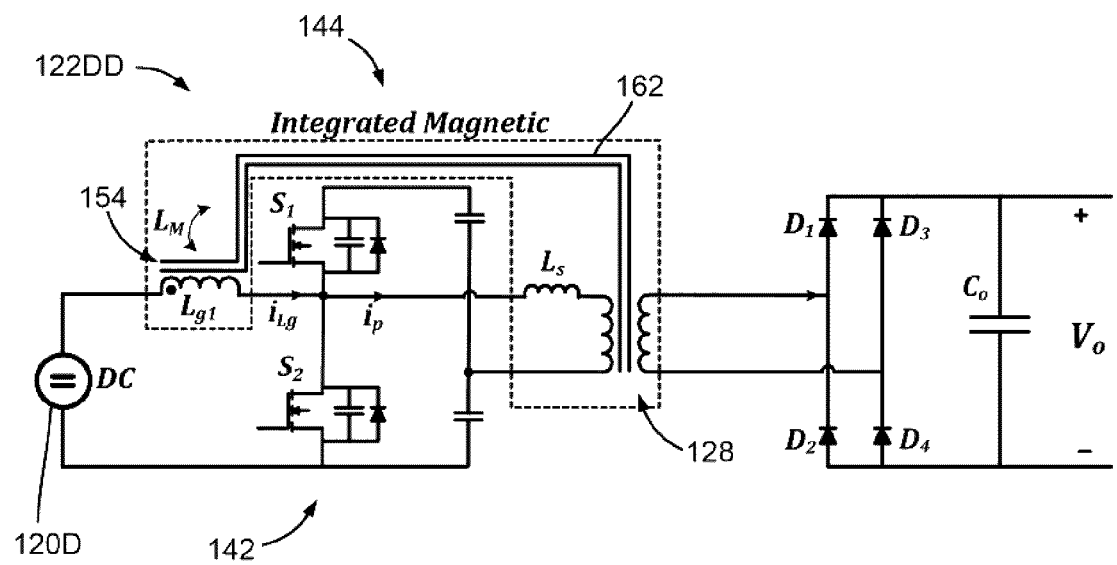
FIG. 33 is a schematic diagram of the circuitry of a DC/DC power-electronic converter shown in FIG. 15, according to some embodiments of this disclosure, the power-conversion circuitry and the DPT channel thereof comprising transformers sharing a common magnetics structure with coils separately wound on a common core.

The DPT channel may be implemented in any suitable manner. For example, FIG. 33 shows a DC/DC power-electronic converter 122DD having a DPT channel 144, according to some embodiments of this disclosure. In these embodiments, the transformer 128 of the regular power-conversion circuitry 142 and the transformer 154 of the DPT channel 144 share a common and/or integrated magnetics structure 162. In particular, the coils of the transformers 128 and 154 are separately wound on a common magnetic or ferromagnetic core thereby giving rise to a high power-density.

Figure 34:
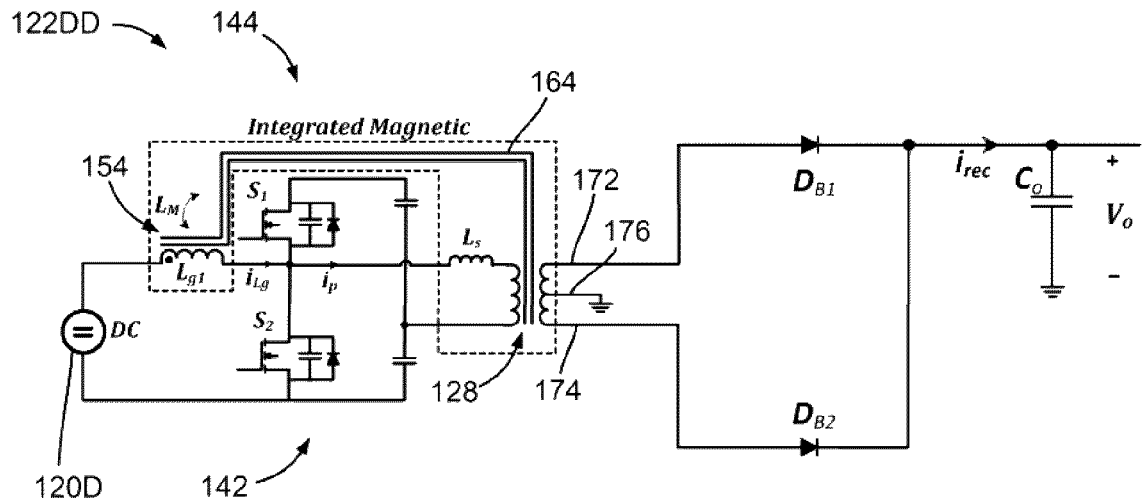
FIG. 34 is a schematic diagram of the circuitry of a DC/DC power-electronic converter shown in FIG. 15, according to some embodiments of this disclosure, the power-conversion circuitry and the DPT channel thereof comprising transformers sharing a common magnetics structure implemented as a center-tap transformer.

FIG. 34 shows a DC/DC power-electronic converter 122DD having a DPT channel 144, according to some embodiments of this disclosure. In these embodiments, the transformer 128 of the regular power-conversion circuitry 142 and the transformer 154 of the DPT channel 144 share a common and/or integrated magnetics structure 164. In particular, the DC/DC power-electronic converter 122DD uses a center-tap transformer 164 for implementing the transformers 128 and 154 such that the transformers 128 and 154 share the same coils wound on a magnetic or ferromagnetic core wherein the coils comprise three contact points, including two end contact-points at the two ends thereof and an intermediate contact point at a suitable location of the coils intermediate the two ends thereof. In the example shown in FIG. 34, the end contact-points 172 and 174 are used for power output and the intermediate contact point 176 is connected to the ground.

Figure 35:
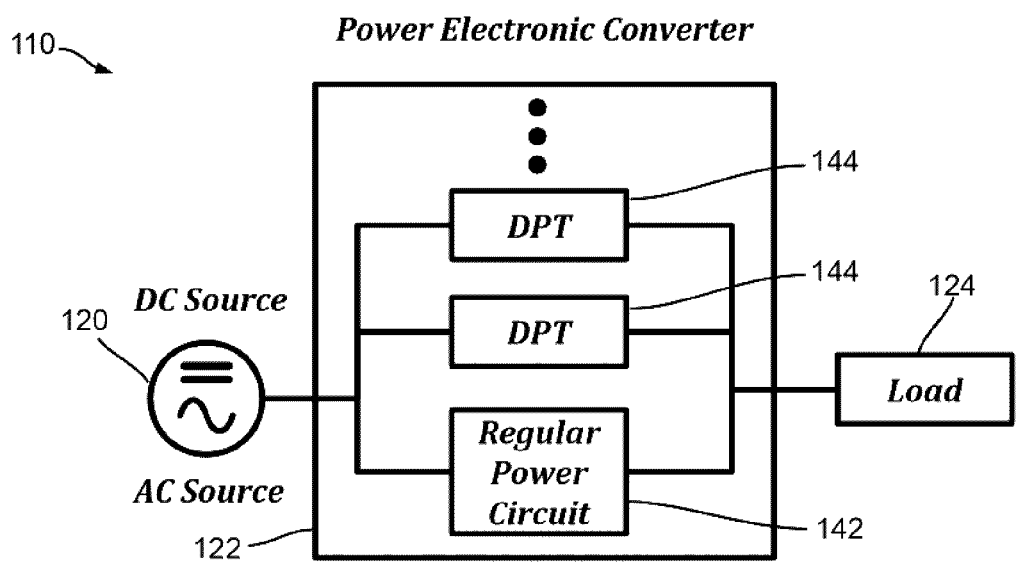
FIG. 35 is a schematic diagram of a power-electronic conversion system using DPT, according to some embodiments of this disclosure, the power-electronic conversion system comprising a power-electronic converter having a power-conversion circuitry and a plurality of DPT channels electrically coupled together in parallel.

In above embodiments, the power-electronic converter 122 comprises one DPT channel 144 electrically coupled to the regular power-conversion circuitry 142 in parallel. In some alternative embodiments as shown in FIG. 35, the power-electronic converter 122 may comprise a plurality of DPT channels 144 electrically coupled to the regular power-conversion circuitry 142 in parallel. In some embodiments, the plurality of DPT channels 144 may have the same structure, topology, components, and/or parameters. In some other embodiments, the plurality of DPT channels 144 may have different structures, topologies, components, and/or parameters.

Figure 36:
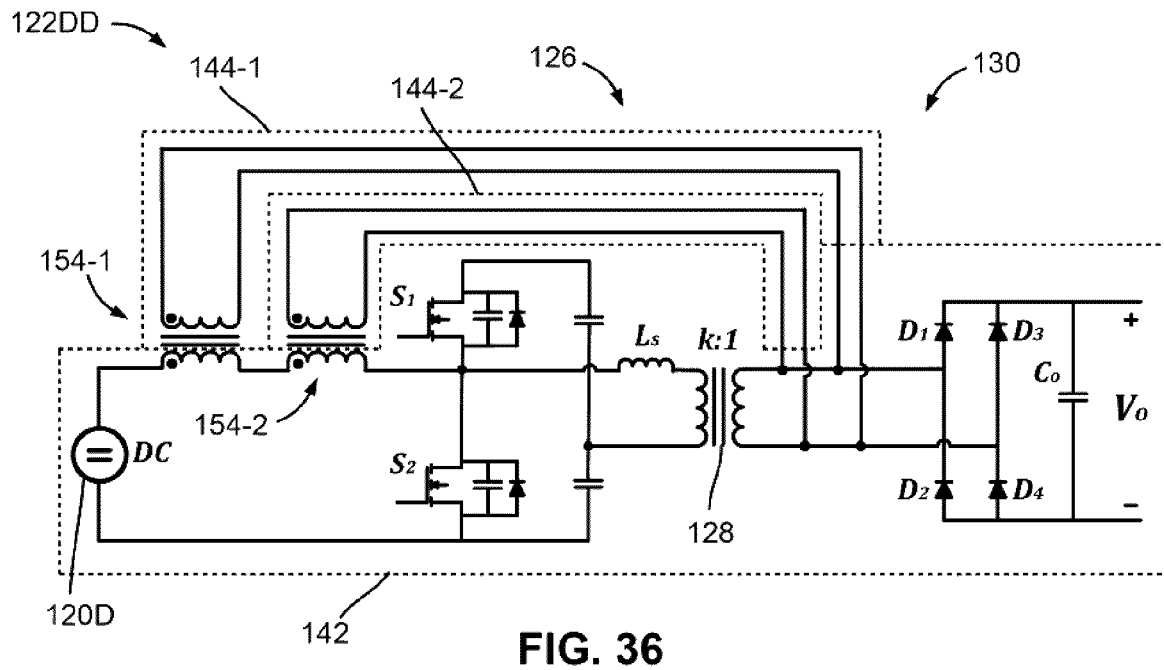
FIG. 36 is a schematic diagram of the circuitry of an exemplary DC/DC converter shown in FIG. 35, according to some embodiments of this disclosure, the power-electronic conversion system comprising a power-electronic converter having a power-conversion circuitry and two DPT channels electrically coupled together in parallel.

For example, FIG. 36 shows the circuitry of a DC/DC power-electronic converter 122DD in one embodiment. As shown, the power-electronic converter 122DD comprises a regular power-conversion circuitry 142 similar to that shown in FIG. 12 which uses a pair of MOSFETs $S_1$ and $S_2$ and a first transformer 128 for converting a first portion of DC power received from the DC power source 120D. The DC/DC power-electronic converter 122DD also comprises two DPT channels 144-1 and 144-2 coupling to the regular power-conversion circuitry 142 on the primary side 126 thereof via respective second transformers 154-1 and 154-2 for transferring a second and a third portion, respectively, of the received DC power directly from the primary side 126 to the secondary side 130 thereby bypassing the MOSFETs $S_1$ and $S_2$ and the first transformer 128.

In some embodiments, the first transformer 128 of the regular power-conversion circuitry 142 and the one or more second transformers 154 of the DPT channels 144 (e.g., the second transformers 154-1, 154-2 shown in FIG. 36) may share a common and/or integrated magnetics structure such as share a common core wherein each second transformer 154 comprises a separate set of coils wound thereon (e.g., a separate wire wound on the common core forming the set of coils).

In some embodiments, the first transformer 128 of the regular power-conversion circuitry 142 and the one or more second transformers 154 of the DPT channels 144 (e.g., the second transformers 154-1, 154-2 shown in FIG. 36) may be implemented using a center-tap transformer having a single set of coils (e.g., a wire wound on the core forming the single set of coils) wherein each second transformer 154 comprises a set of coils corresponding to a respective portion of the single set of coils (e.g., a respective portion of the wire wound on the core).

Figure 37:
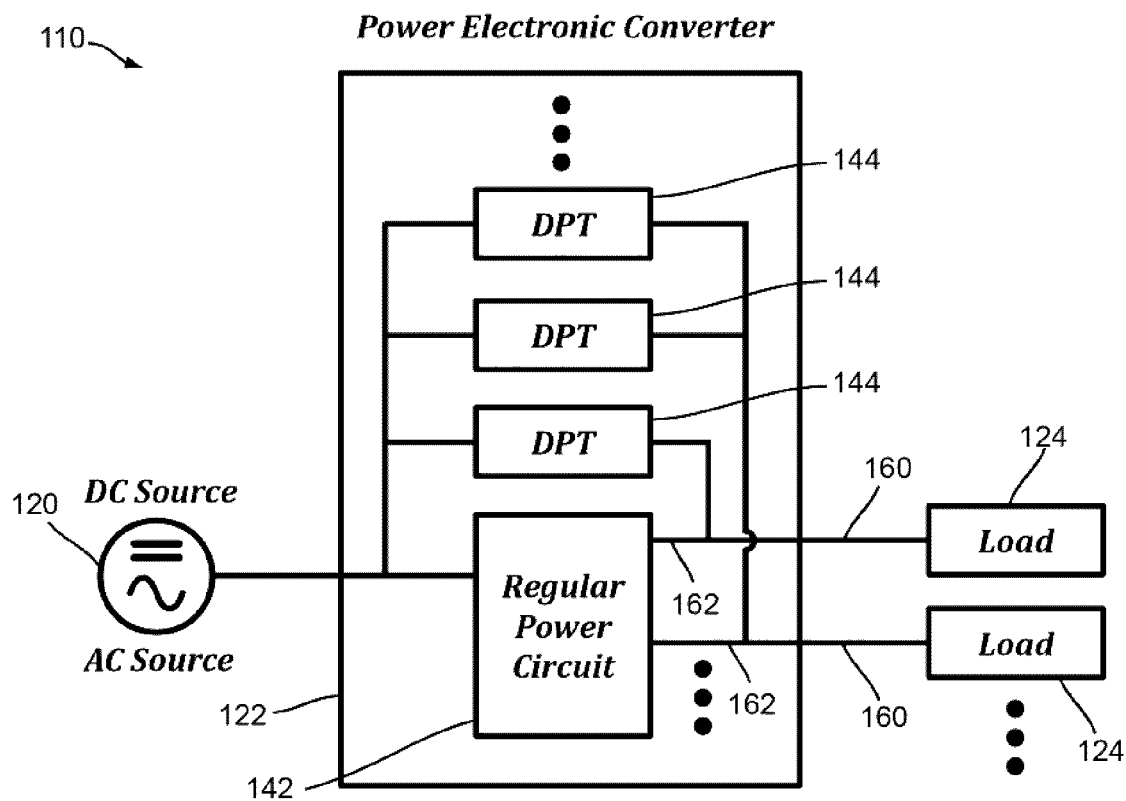
FIG. 37 is a schematic diagram of a power-electronic conversion system using DPT, according to some embodiments of this disclosure, the power-electronic conversion system comprising a multiple-output power-electronic converter having a power-conversion circuitry and a plurality of DPT channels electrically coupled together in parallel.

In above embodiments, the power-electronic converter 122 only has one output. In some alternative embodiments as shown in FIG. 37, the power-electronic converter 122 may be a multiple-output power-electronic converter comprising a plurality of outputs 160 for powering a plurality of loads 124.

The multiple-output power-electronic converter 122 may comprise a regular power circuitry 142 having a plurality of outputs 162 and a plurality of DPT channels 144 electrically coupled to the regular power-conversion circuitry 142 in parallel. In particular, at least one or more of the outputs 162 of the regular power circuitry 142 are each electrically coupled to one or more of the plurality of DPT channels 144 thereby forming a respective output of the multiple-output power-electronic converter 122 for powering a respective load 124.

In some embodiments, at least one output 162 of the regular power circuitry 142 is not electrically coupled to any DPT channel 144 and directly forms an output 160 of the multiple-output power-electronic converter 122.

In some embodiments, all outputs 162 of the regular power circuitry 142 are electrically coupled to the DPT channels 144 for forming the outputs 160 of the multiple-output power-electronic converter 122.

In some embodiments, the plurality of DPT channels 144 may have the same structure, topology, components, and/or parameters. In some other embodiments, the plurality of DPT channels 144 may have different structures, topologies, components, and/or parameters.

Figure 38:
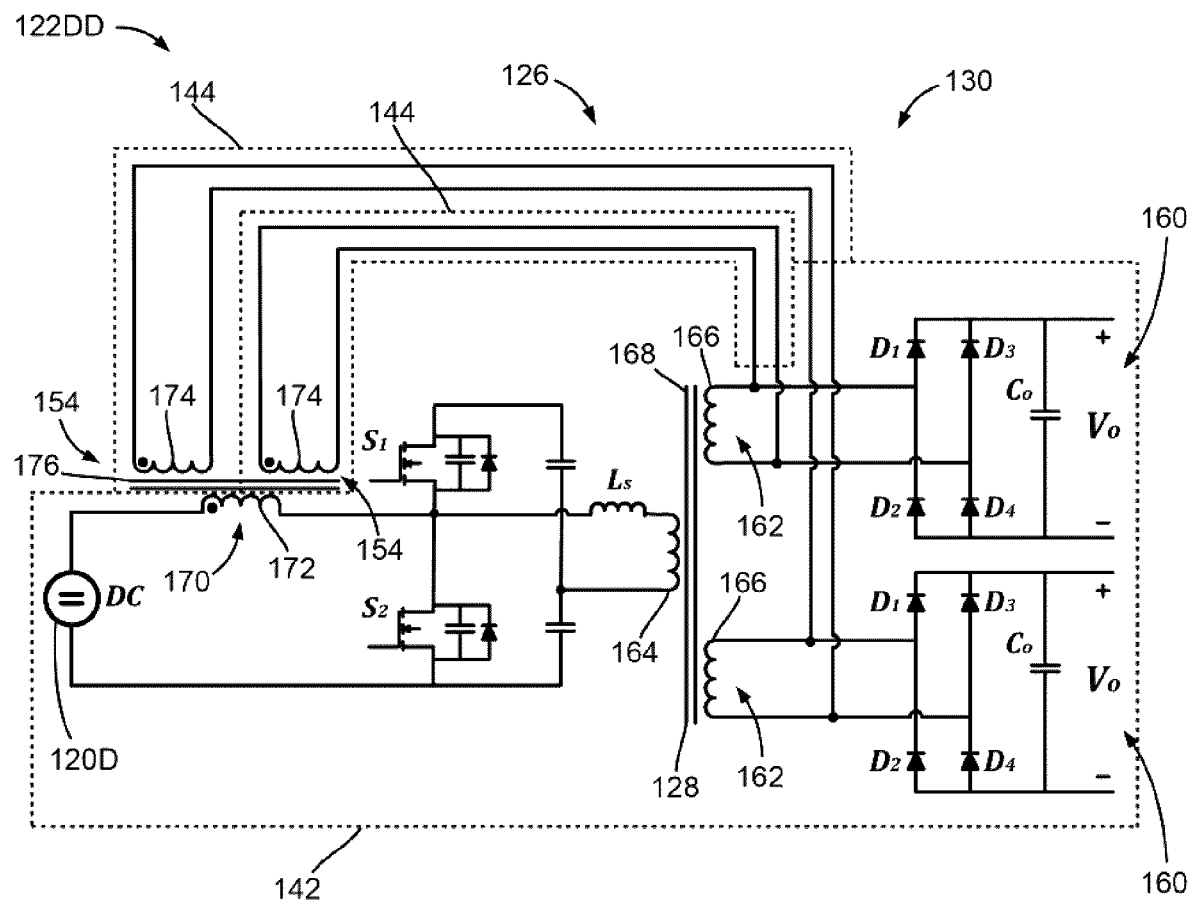
FIG. 38 is a schematic diagram of the circuitry of an exemplary multiple-output DC/DC converter shown in FIG. 37, according to some embodiments of this disclosure, the power-electronic conversion system comprising a power-electronic converter having a power-conversion circuitry and two DPT channels electrically coupled together in parallel.

For example, FIG. 38 shows the circuitry of a multiple-output DC/DC power-electronic converter 122DD in one embodiment. As shown, the power-electronic converter 122DD comprises a regular power-conversion circuitry 142 using a pair of MOSFETs $S_1$ and $S_2$ and a first transformer 128 for converting a first portion of DC power received from the DC power source 120D. The first transformer 128 comprises an input coil set 164 and two output coil sets 166 wound on a common core 168. Each of the output coil sets 166 forms an output 162 of the regular power circuitry 142.

The multiple-output DC/DC power-electronic converter 122DD also comprises two DPT channels 144 coupling to the regular power-conversion circuitry 142 on the primary side 126 thereof via two second transformers 154 for transferring a second and a third portion, respectively, of the received DC power directly from the primary side 126 to the secondary side 130 thereby bypassing the MOSFETs $S_1$ and $S_2$ and the first transformer 128.

In particular, the multiple-output DC/DC power-electronic converter 122DD comprises a coupling transformer 170 having an input coil set 172 electrically connect to the primary side 126 of the regular power circuitry 142 and two output coil sets 174 all wound on a common core 176. Each output coil set 174 is electrically coupled to a DPT channel 144. Therefore, each output coil set 174, the common core 176, and the input coil set 172 form a respective second transformer 154.

On the secondary side, each DPT channel 144 is electrically coupled to an output 162 of the regular power circuitry 142 in parallel for forming a respective output 160 of the multiple-output DC/DC power-electronic converter 122DD.

In some embodiments, any one or both of the coupling transformer 170 and the first transformer 128 may be a center-tap transformer.

Although embodiments have been described above with reference to the accompanying drawings, those of skill in the art will appreciate that variations and modifications may be made without departing from the scope thereof as defined by the appended claims.

REFERENCES

[1] V. Nasirian, S. Moayedi, A. Davoudi, and F. L. Lewis, "Distributed cooperative control of DC microgrids," IEEE Trans. Power Electron., vol. 30, pp. 2288-2303, April 2015.

[2] T. Dragicevic, X. Lu, J. C. Vasquez, and J. M. Guerrero, "DC microgrids—Part II: A review of power architectures, applications, and standardization issues," IEEE Trans. Power Electron., vol. 31, pp. 3528-3549, May 2016.

[3] H. Lotfi and A. Khodaei, "AC versus DC microgrid planning," IEEE Trans. Smart Grid, vol. 8, pp. 296-304, January 2017.

[4] C. Marnay, S. Lanzisera, M. Stadler, and J. Lai, "Building scale DC microgrids," in 2012 IEEE Energytech, pp. 1-5, May 2012.

[5] M. Zareie, S. Eren, and P. Jain, "A digital sensorless controller for a voltage balancer used in hybrid microgrids," in 2018 IEEE International Telecommunications Energy Conference (INTELEC), pp. 1-5, October 2018.

[6] B. R. Lin, "Modular soft-switching converter in DC micro-grid system applications," Electronics Letters, vol. 54, no. 10, pp. 649-651, 2018.

[7] P. Kolahian, H. Tarzamni, A. Nikafrooz, and M. Hamzeh, "Multi-port DC-DC converter for bipolar medium voltage DC micro-grid applications," IET Power Electron., vol. 12, no. 7, pp. 1841-1849, 2019.

[8] A. Chub, D. Vinnikov, E. Liivik, and T. Jalakas, "Multiphase quasi-Z-source DC-DC converters for residential distributed generation systems," IEEE Trans. Ind. Electron., vol. 65, pp. 8361-8371, October 2018.

[9] A. Brissette, J. Carr, T. Cui, J. Xu, and L. Qi, "Analysis of emerging technology for DC-enabled smart homes," in 2015 IEEE First International Conference on DC Microgrids (ICDCM), pp. 171-174, June 2015.

[10] H. Kakigano, Y. Miura, and T. Ise, "Low-voltage bipolar-type DC microgrid for super high quality distribution," IEEE Trans. Power Electron., vol. 25, pp. 3066-3075, December 2010.

[11] S. A. Gorji, H. G. Sahebi, M. Ektesabi, and A. B. Rad, "Topologies and control schemes of bidirectional DC-DC power converters: An overview," IEEE Access, vol. 7, pp. 117997-118019, 2019.

[12] M. Forouzesh, Y. Shen, K. Yari, Y. P. Siwakoti, and F. Blaabjerg, "High-efficiency high step-up DC-DC converter with dual coupled inductors for grid-connected photovoltaic systems," IEEE Trans. Power Electron., vol. 33, pp. 5967-5982, July 2018.

[13] L. Schmitz, D. C. Martins, and R. F. Coelho, "Generalized high step-up DC-DC boost-based converter with

[14] T. Cheng, D. D. Lu, and L. Qin, "Non-isolated single-inductor DC/DC converter with fully reconfigurable structure for renewable energy applications," IEEE Trans. Circuits Syst., II, Exp. Briefs, vol. 65, pp. 351-355, March 2018.

[15] Y. Wang, H. Song, and D. Xu, "Soft-switching bidirectional DC/DC converter with an LCLC resonant circuit," IEEE Trans. Emerg. Sel. Topics Power Electron., vol. 7, pp. 851-864, June 2019.

[16] O. Garcia, P. Zumel, A. de Castro, and A. Cobos, "Automotive DC-DC bidirectional converter made with many interleaved buck stages," IEEE Trans. Power Electron., vol. 21, pp. 578-586, May 2006.

[17] L. Ni, D. J. Patterson, and J. L. Hudgins, "High power current sensorless bidirectional 16-phase interleaved DC-DC converter for hybrid vehicle application," IEEE Trans. Power Electron., vol. 27, pp. 1141-1151, March 2012.

[18] M. Pahlevani, S. Eren, A. Bakhshai, and P. Jain, "A series-parallel current-driven full-bridge DC/DC converter," IEEE Trans. Power Electron., vol. 31, pp. 1275-1293, February 2016.

[19] T. Wu, J. Yang, C. Kuo, and Y. Wu, "Soft-switching bidirectional isolated full-bridge converter with active and passive snubbers," IEEE Trans. Ind. Electron., vol. 61, pp. 1368-1376, March 2014.

[20] J. A. Sabate, V. Vlatkovic, R. B. Ridley, and F. C. Lee, "High-voltage, high-power, ZVS, full-bridge PWM converter employing an active snubber," in 1991 IEEE Sixth Annual Applied Power Electronics Conference and Exhibition (APEC), pp. 158-163, March 1991.

[21] T. Wu, Y. Chen, J. Yang, and C. Kuo, "Isolated bidirectional full-bridge DC-DC converter with a flyback snubber," IEEE Trans. Power Electron., vol. 25, pp. 1915-1922, July 2010.

[22] M. Pahlevaninezhad, J. Drobnik, P. K. Jain, and A. Bakhshai, "A load adaptive control approach for a zero-voltage-switching DC/DC converter used for electric vehicles," IEEE Trans. Ind. Electron., vol. 59, pp. 920-933, February 2012.

[23] P. K. Jain, Wen Kang, H. Soin, and Youhao Xi, "Analysis and design considerations of a load and line independent zero-voltage-switching full bridge DC/DC converter topology," IEEE Trans. Power Electron., vol. 17, pp. 649-657, September 2002.

[24] G. Catona, E. Bianconi, R. Maceratini, G. Coppola, L. Fumagalli, G. Petrone, and G. Spagnuolo, "An isolated semiresonant DC/DC converter for high power applications," IEEE Trans. Ind. Appl., vol. 53, pp. 2200-2209, May 2017.

[25] L. Costa, G. Buticchi, and M. Liserre, "A fault-tolerant series-resonant DC-DC converter," IEEE Trans. Power Electron., vol. 32, pp. 900-905, February 2017.

[26] A. Chub, D. Vinnikov, F. Blaabjerg, and F. Z. Peng, "A review of galvanically isolated impedance-source DC-DC converters," IEEE Trans. Power Electron., vol. 31, pp. 2808-2828, April 2016.

[27] R. Li and F. Shi, "Control and optimization of residential photovoltaic power generation system with high efficiency isolated bidirectional DC-DC converter," IEEE Access, vol. 7, pp. 116107-116122, 2019.

[28] S. M. S. I. Shakib and S. Mekhilef, "A frequency adaptive phase shift modulation control based LLC series resonant converter for wide input voltage applications," IEEE Trans. Power Electron., vol. 32, pp. 8360-8370, November 2017.

[29] Z. Li and H. Wang, "Comparative analysis of high step-down ratio isolated DC/DC topologies in PEV applications," in 2016 IEEE Applied Power Electronics Conference and Exposition (APEC), pp. 1329-1335, March 2016.

[30] J. Walter and R. W. De Doncker, "High-power galvanically isolated DC/DC converter topology for future automobiles," in IEEE 34th Annual Conference on Power Electronics Specialist (PESC), vol. 1, pp. 27-32 vol. 1, June 2003.

[31] B. Liu, M. Qiu, L. Jing, X. Wang, and M. Chen, "Design of high-performance bidirectional DC/DC converter applied for more electric aircraft," The Journal of Engineering, vol. 2018, no. 13, pp. 520-523, 2018.

[32] C. Wang, S. Zhang, Y. Wang, B. Chen, and J. Liu, "A 5-kw isolated high voltage conversion ratio bidirectional CLTC resonant DC-DC converter with wide gain range and high efficiency," IEEE Trans. Power Electron., vol. 34, pp. 340-355, January 2019.

[33] M. Pahlevaninezhad, P. Das, J. Drobnik, P. K. Jain, and A. Bakhshai, "A novel ZVZCS full-bridge DC/DC converter used for electric vehicles," IEEE Trans. Power Electron., vol. 27, pp. 2752-2769, June 2012.

[34] S. Bagawade, M. Pahlevani, R. Fernandes, and P. Jain, "Novel high-gain hybrid current-driven DC-DC converter topology," in 2018 IEEE Applied Power Electronics Conference and Exposition (APEC), pp. 2302-2309, March 2018.

[35] I. Askarian, N. Dohmeier, C. Botting, M. Pahlevani, and A. Knight, "A novel single-stage AC/DC converter used in battery charger applications," in 2018 IEEE Energy Conversion Congress and Exposition (ECCE), pp. 2510-2515, September 2018.

What is claimed is:

1. An electrical power conversion apparatus comprising:

a first power conversion circuitry for receiving an input current from an electrical power source, converting a first portion of electrical power of the input current, and outputting the converted electrical power via at least one output, the first power conversion circuitry comprising a first transformer having a primary side for coupling to the electrical power source and a secondary side for coupling to the at least one output;

at least one direct power transfer (DPT) channel electrically coupling to the first power conversion circuitry in parallel for bypassing the first power conversion circuitry and directly transferring a second portion of the electrical power received from the electrical power source to the secondary side of the first transformer for power-outputting via the at least one output;

a plurality of output diodes adapted for operation under a zero-current switching (ZCS) condition; and an input switch for coupling the electrical power source to the first power conversion circuitry and the at least one DPT channel;

wherein the first power conversion circuitry comprises at least a pair of power semiconductors $S_1$ and $S_2$ adapted for operation under a ZVS condition;

wherein the plurality of output diodes comprises four diodes $D_1$, $D_2$, $D_3$, and $D_4$;

wherein a first end of $D_1$ is coupled to a first end of $D_2$ forming a first input end, and a first end of $D_3$ is coupled to a first end of $D_4$ forming a second input end, the first and second input ends are coupled to the secondary side of the first transformer and an output side of the at least one DPT channel;

wherein a second end of $D_1$ is coupled to a second end of $D_3$ forming a first output end, and a second of $D_2$ is coupled to a second end of $D_4$ forming a second output end, the first and second output ends are coupled to the at least one output; and wherein the apparatus is adapted for operation in a plurality of modes comprising:
- (i) a first mode in which $D_1$ and $D_4$ are ON, and $S_1$ is switched from ON to OFF under the ZVS condition,
- (ii) a second mode in which $D_1$ and $D_4$ are ON, and $S_2$ is switched ON under the ZVS condition,
- (iii) a third mode in which $D_1$ and $D_4$ turn OFF, $D_2$ and $D_3$ turn ON under the ZCS condition, and $S_2$ is ON,
- (iv) a fourth mode in which $S_2$ is switched OFF under ZVS condition,
- (v) a fifth mode in which $S_1$ is switched ON under ZVS condition, and $D_2$ and $D_3$ are ON,
- (vi) a sixth mode in which $D_2$ and $D_3$ turn OFF under ZCS condition, $D_1$ and $D_4$ turn ON under ZCS condition, and
- (vii) a seventh mode in which the input switch turns off for turning the input current to zero.

2. The apparatus of claim 1, wherein the first power conversion circuitry comprises:
a current-switching structure coupling to the primary side of the first transformer for switching current.

3. The apparatus of claim 1, wherein the at least one DPT channel is coupled to the primary side of the first transformer via a second transformer.

4. The apparatus of claim 3, wherein the first and second transformers share a common core.

5. The apparatus of claim 1, wherein the first power conversion circuitry comprise at least a pair of power semiconductors $S_1$ and $S_2$ adapted for operation under a zero-voltage switching (ZVS) condition.

6. The apparatus of claim 1, wherein the apparatus is adapted for operating the input current in a pseudo-continuous conduction mode (pseudo-CCM) for reducing the peak and/or root-mean-square (RMS) values thereof.

7. The apparatus of claim 1, wherein the first power conversion circuitry comprises a first resonant tank.

8. The apparatus of claim 1, wherein the at least one DPT channel comprises at least one second resonant tank.

9. The apparatus of claim 1, wherein the at least one output comprises a plurality of outputs;
wherein the at least one DPT channel comprises a plurality of DPT channels; and
wherein at least two of the plurality of DPT channels are coupled to different ones of the plurality of outputs.

* * * * *